(12) United States Patent
Wu et al.

(10) Patent No.: US 12,041,793 B2
(45) Date of Patent: Jul. 16, 2024

(54) HYBRID MEMORY DEVICE AND METHOD OF FORMING THE SAME

(71) Applicant: Taiwan Semiconductor Manufacturing Co., Ltd., Hsinchu (TW)

(72) Inventors: Chao-I Wu, Zhubei (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 417 days.

(21) Appl. No.: 17/531,986

(22) Filed: Nov. 22, 2021

(65) Prior Publication Data

US 2022/0231026 A1 Jul. 21, 2022

Related U.S. Application Data

(60) Provisional application No. 63/139,946, filed on Jan. 21, 2021.

(51) Int. Cl.
*H10B 99/00* (2023.01)
*H10B 41/20* (2023.01)
*H10B 43/20* (2023.01)
*H10B 51/20* (2023.01)
*H10B 63/00* (2023.01)
*H10N 79/00* (2023.01)

(52) U.S. Cl.
CPC ............. *H10B 99/00* (2023.02); *H10B 41/20* (2023.02); *H10B 43/20* (2023.02); *H10B 51/20* (2023.02); *H10B 63/00* (2023.02); *H10B 63/845* (2023.02); *H10N 79/00* (2023.02)

(58) Field of Classification Search
CPC ........ H10B 63/00; H10B 99/00; H10B 20/40; H10B 51/20; H10B 41/20; H10B 43/20; H10B 63/845; H10N 70/20; H10N 70/231; G11C 13/0004; H01L 27/11551; H01L 27/11578; H01L 27/11514; H01L 27/2481; H01L 27/249
See application file for complete search history.

(56) References Cited

U.S. PATENT DOCUMENTS

| 10,121,540 | B1 | 11/2018 | Jo |
| 2010/0295009 | A1 | 11/2010 | Lung et al. |
| 2012/0182801 | A1 | 7/2012 | Lue |

(Continued)

FOREIGN PATENT DOCUMENTS

| CN | 113380816 A | * | 9/2021 | ......... G11C 11/5657 |
| CN | 113380822 A | * | 9/2021 | ........... G11C 11/223 |

(Continued)

*Primary Examiner* — Britt D Hanley
*Assistant Examiner* — Casey Paul Boatman
(74) *Attorney, Agent, or Firm* — Slater Matsil, LLP

(57) ABSTRACT

A memory array includes hybrid memory cells, wherein each hybrid memory cell includes a transistor-type memory including a memory film extending on a gate electrode; a channel layer extending on the memory film; a first source/drain electrode extending on the channel layer; and a second source/drain electrode extending along the channel layer; and a resistive-type memory including a resistive memory layer, wherein the resistive memory layer extends between the second source/drain electrode and the channel layer.

20 Claims, 70 Drawing Sheets

(56) References Cited

U.S. PATENT DOCUMENTS

| | | | |
|---|---|---|---|
| 2020/0026990 A1* | 1/2020 | Lue | H01L 27/0207 |
| 2020/0127052 A1 | 4/2020 | Walker et al. | |
| 2020/0403035 A1 | 12/2020 | Ogiwara et al. | |
| 2022/0068384 A1* | 3/2022 | Han | G11C 13/0097 |

FOREIGN PATENT DOCUMENTS

| | | | | |
|---|---|---|---|---|
| CN | 113517297 A | * | 10/2021 | G11C 11/2255 |
| CN | 113517303 A | * | 10/2021 | G11C 11/223 |
| CN | 113540114 A | * | 10/2021 | G11C 11/223 |
| TW | I493545 B | | 7/2015 | |
| TW | I597725 B | | 9/2017 | |

* cited by examiner

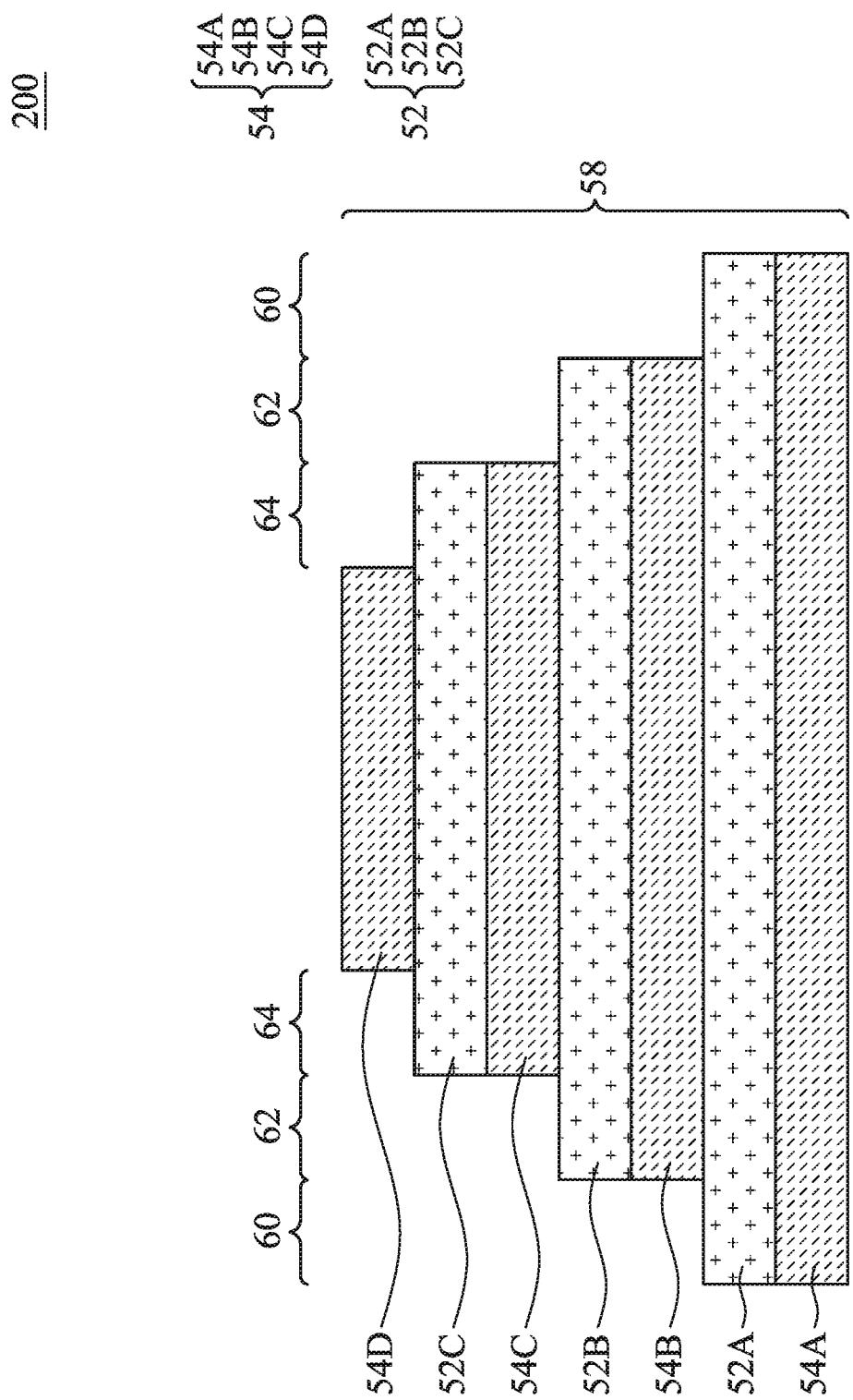

HYBRID MEMORY DEVICE AND METHOD OF FORMING THE SAME

PRIORITY CLAIM AND CROSS-REFERENCE

This application claims the benefits of U.S. Provisional Application No. 63/139,946, filed on Jan. 12, 2021, which application is hereby incorporated herein by reference in its entirety.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8, 9, 10, 11, 12A, 12B, 13, 14A, 14B, 15, 16, 17A, 17B, 18A, 18B, 19A, 19B, 20, 21A, 21B, 21C, 22A, 22B, 22C, 23A, 23B, 23C, 24A, 24B, 24C, 25A, 25B, 25C, 26A, 26B, 26C, 27A, 27B, 28A, 28B, 28C, 29A, 29B, 29C, and 29D illustrate varying views of intermediate steps in the manufacture of a hybrid memory array, in accordance with some embodiments.

DETAILED DESCRIPTION

Figure 1A:
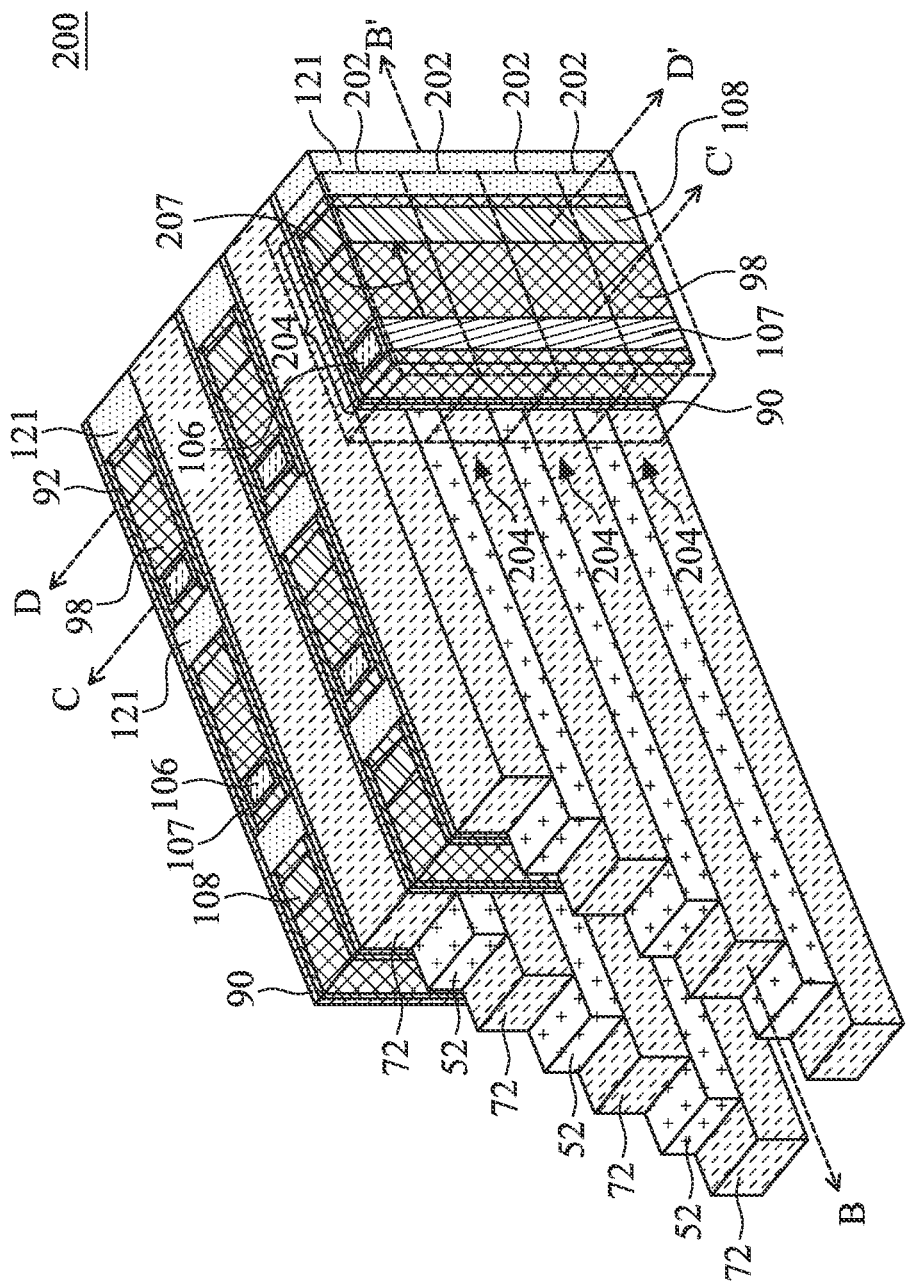
FIGS. 1A, 1B, and 1C illustrate a perspective view, a circuit diagram, and a top down view of a hybrid memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes a transistor-type memory and a resistive-type memory, and thus many be considered a "hybrid memory cell." The transistor-type memory of the memory cell includes a transistor having a word line region acting as a gate electrode, a bit line region acting as a first source/drain electrode, and a source line region acting as a second source/drain electrode. The transistor may be, for example, a thin film transistor (TFT). Each transistor further includes an insulating memory film (e.g., as a gate dielectric) and an oxide semiconductor (OS) channel region. The resistive-type memory of the memory cell includes a resistive memory layer formed on the bit line region such that current flowing between the bit line and the source line also flows through the resistive memory layer. The transistor-type memory and the resistive-type memory of each memory cell may be programmed or read using the same word lines, bit lines, and source lines corresponding to that memory cell. In this manner, different types of memory may be utilized for different purposes within the same memory array. For example, the transistor-type memory may be used for relatively frequent read/write operations, and the resistive-type memory may be used for relatively static data storage.

Figure 1B:
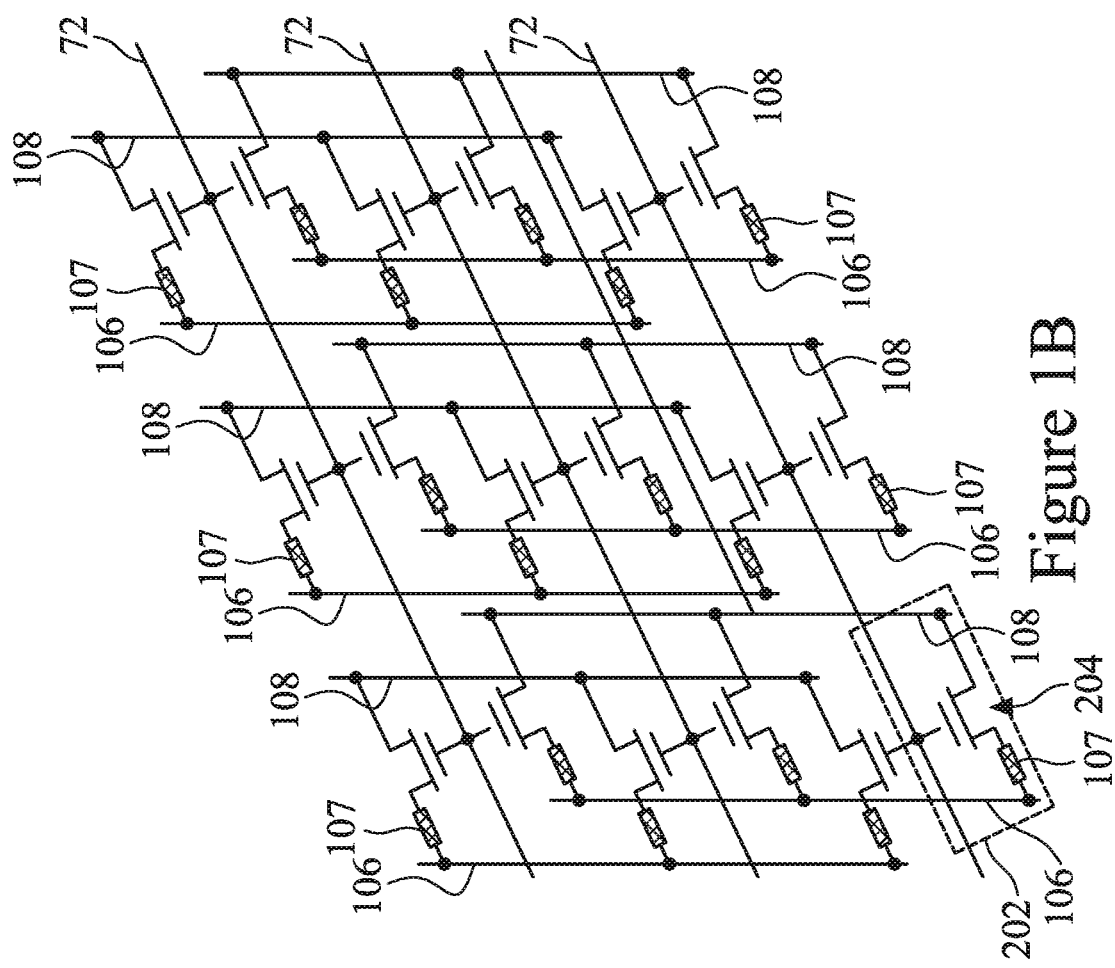
Figure 1C:
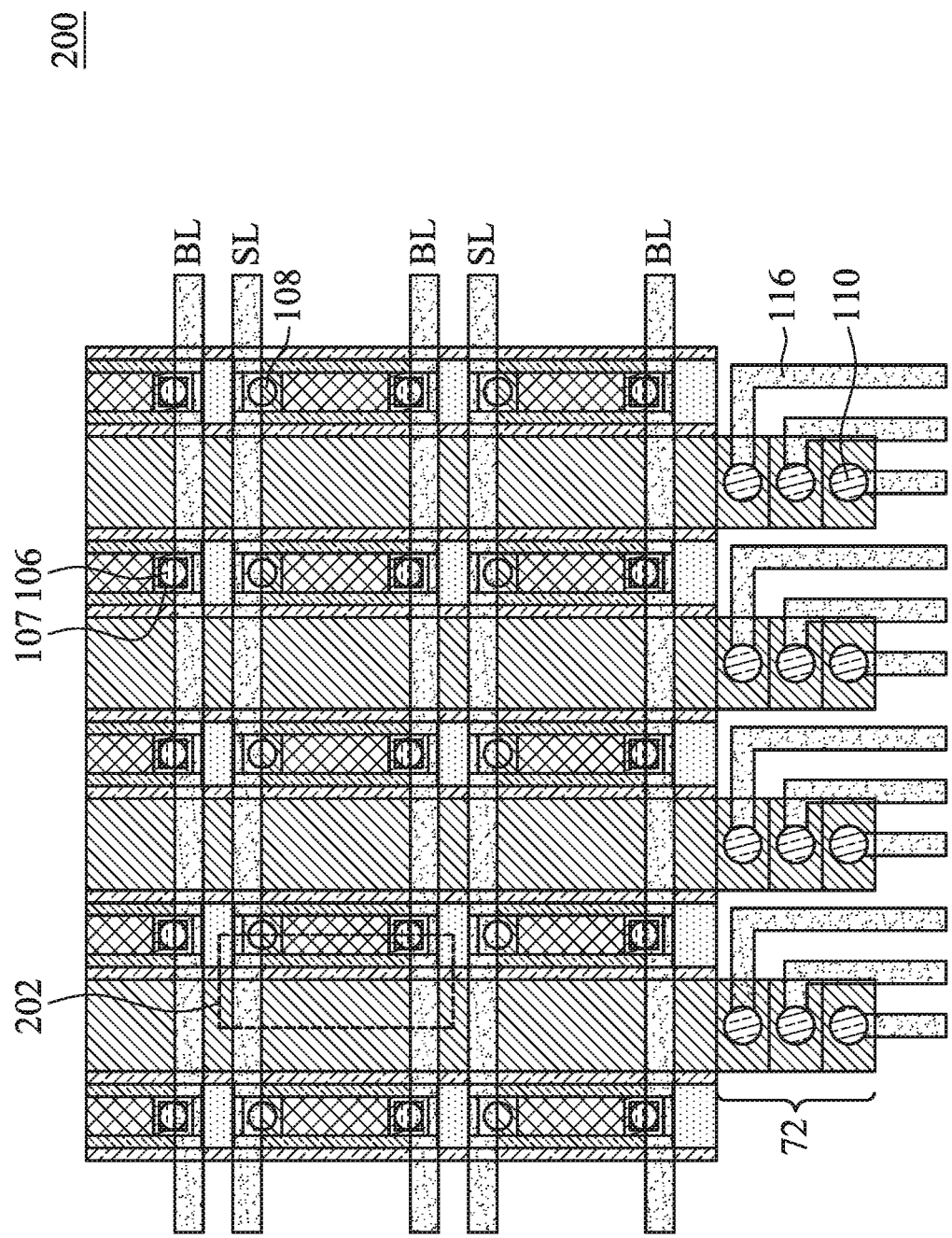

FIGS. 1A, 1B, and 1C illustrate examples of a hybrid memory array 200, in accordance with some embodiments. The hybrid memory array 200 includes resistive memory layers 107 formed around conductive lines 106, described in greater detail below. FIG. 1A illustrates an example of a portion of the hybrid memory array 200 in a perspective view; FIG. 1B illustrates a circuit diagram of the hybrid memory array 200; and FIG. 1C illustrates a top down view (e.g., a plan view) of the hybrid memory array 200 in accordance with some embodiments. The hybrid memory array 200 includes a plurality of memory cells 202, which may be arranged in a grid of rows and columns. The memory cells 202 may further stacked vertically to provide a three dimensional memory array, thereby increasing device density. In some embodiments, each memory cell 202 of the hybrid memory array 200 includes both a transistor-type memory and resistive-type memory, and thus may be referred to herein as "hybrid memory cells 202." The transistor-type memory and the resistive-type memory of each hybrid memory cell 202 may be independently programmed and read, described in greater detail below. The hybrid memory array 200 may be disposed in the back end of line (BEOL) of a semiconductor die. For example, the hybrid memory array 200 may be disposed in the interconnect layers of the semiconductor die, such as above one or more active devices (e.g., transistors or the like) formed on a semiconductor substrate.

The transistor-type memory of the hybrid memory array 200 may comprise, for example, a flash memory array, such as a NOR flash memory array, a thin film transistor (TFT) memory array, another charge-storage-based memory array, or the like. For example, each hybrid memory cell 202 may include a transistor 204 with an insulating memory film 90 as a gate dielectric. In some embodiments, a gate of each transistor 204 is electrically coupled to a respective word line (e.g., conductive line 72), a first source/drain region of each transistor 204 is electrically coupled to a respective bit line (e.g., conductive line 106), and a second source/drain region of each transistor 204 is electrically coupled to a respective source line (e.g., conductive line 108), which electrically couples the second source/drain region to ground. The hybrid memory cells 202 in a same horizontal row of the hybrid memory array 200 may share a common word line (e.g., 72), while the hybrid memory cells 202 in a same vertical column of the hybrid memory array 200 may share a common source line (e.g., 108) and a common bit line (e.g., 106).

The hybrid memory array 200 includes a plurality of vertically stacked conductive lines 72 (e.g., word lines). The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, as shown in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the hybrid memory array 200, and conductive contacts may be made to an exposed portion of each of the conductive lines 72 (see, for example, FIGS. 29A-D).

The hybrid memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each hybrid memory cell 202. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the hybrid memory array 200 may also include an oxide semiconductor (OS) layer 92. The OS layer 92 may provide channel regions for the transistors 204 of the hybrid memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 207). Accordingly, the OS layer 92 may be considered a channel layer in some cases.

A memory film 90 is disposed between the conductive lines 72 and the OS layer 92, and the memory film 90 may provide gate dielectrics for the transistors 204. In some embodiments, the memory film 90 comprises a ferroelectric material, such as a hafnium oxide, hafnium zirconium oxide, silicon-doped hafnium oxide, or the like. Accordingly, the hybrid memory array 200 may also be referred to as a Ferroelectric Random Access Memory (FeRAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the hybrid memory cells 202), and a continuous region of the memory film 90 may extend across a plurality of hybrid memory cells 202. Depending on a polarization direction of a particular region of the memory film 90, a threshold voltage of a corresponding transistor 204 varies, and a digital value (e.g., 0 or 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift may improve the efficiency of reading the digital value stored in the transistor-type memory of the corresponding hybrid memory cell 202, and may reduce the chance of erroneous readings.

As discussed above, each hybrid memory cell 202 of the hybrid memory array 200 includes a resistive-type memory in addition to a transistor-type memory. For example, each hybrid memory cell 202 may include a resistive memory layer 107 that extends between the corresponding conductive line 106 (e.g., the bit line) and the OS layer 92. Thus, a current flowing from the conductive lines 106 to the conductive lines 108 (e.g., the current shown by arrow 207) also flows through the resistive memory layer 107. In some embodiments, the resistance of the resistive memory layer 107 may be controlled by the application of appropriate voltages and/or currents across the resistive memory layer 107. For example, the resistive memory layer 107 may be controlled to be in either a high resistance state or a low resistance state. Depending on a resistance state of the resistive memory layer 107, the current flowing through the corresponding transistor 204 varies, and a digital value (e.g., 0 or 1) can be stored. In this manner, both the transistor-type memory and the resistor-type memory of a hybrid memory cell 202 may be written to or read from by applying appropriate voltages to a conductive line 106 (e.g., a bit line), a conductive line 108 (e.g., a source line), and a conductive line 72 (e.g., a word line) corresponding to that hybrid memory cell 202. This is shown in FIG. 1B, which schematically shows a resistive memory layer 107 of each hybrid memory cell 202 as electrically coupled between a corresponding conductive line 106 and a corresponding transistor 204. The read/write operations for the resistive-type memory described herein are explained in greater detail below for FIGS. 37A through 39C.

The resistive-type memory of the hybrid memory array 200 may be, for example, a Resistive Random Access Memory (RRAM or ReRAM), PCRAM, CBRAM, or the like. The type and physical mechanism of the resistive-type memory of the memory array may depend on the particular material of the resistive memory layer 107. For example, some types of resistive-type memory may be set to a particular resistance state by applying an electric field across a resistive memory layer 107 (e.g., by controlling a voltage across the resistive memory layer 107), and other types of resistive-type memory may be set to a particular resistance state by heating a resistive memory layer 107 (e.g., by controlling current through the resistive memory layer 107). In some embodiments, the resistive memory layer 107 may be formed of or comprise a metal-containing high-k dielectric material, which may be a metal oxide. The metal may be a transitional metal. In some embodiments, resistive memory layer 107 comprises $HfO_x$, $ZrO_x$, $TaO_x$, $TiO_x$, $VO_x$, $NiO_x$, $NbO_x$, $LaO_x$, the like, or a combination thereof. In other embodiments, the resistive memory layer 107 comprises $AlO_x$, $SnO_x$, $GdO_x$, IGZO, $Ag_2S$, the like, or a combination thereof. In other embodiments, the resistive memory layer 107 comprises a chalcogenide material such as $GeS_2$, GeSe, AgGeSe, GeSbTe, doped GeSbTe (e.g., doped with N, Si, C, Ga, In, the like, or a combination thereof), the like, or a combination thereof. These are examples, and other resistive-type memories, other resistive memory layer 107 materials or combinations of materials, and other read/write techniques are possible, and all are also considered within the scope of the present disclosure.

FIG. 1A further illustrates reference cross-sections of the hybrid memory array 200 that are used in later figures. Reference cross-section B-B' is along a longitudinal axis of conductive lines 72 and in a direction, for example, parallel to the direction of current flow (e.g., arrow 207) of the transistors 204. Reference cross-section C-C' is parallel to cross-section B-B' and is parallel to a longitudinal axis of the conductive lines 72. Reference cross-section C-C' extends through the conductive lines 106 and the resistive memory layers 107. Reference cross-section D-D' is parallel to reference cross-section C-C' and extends through the conductive lines 108. Subsequent figures refer to these reference cross-sections for clarity.

Figure 2:
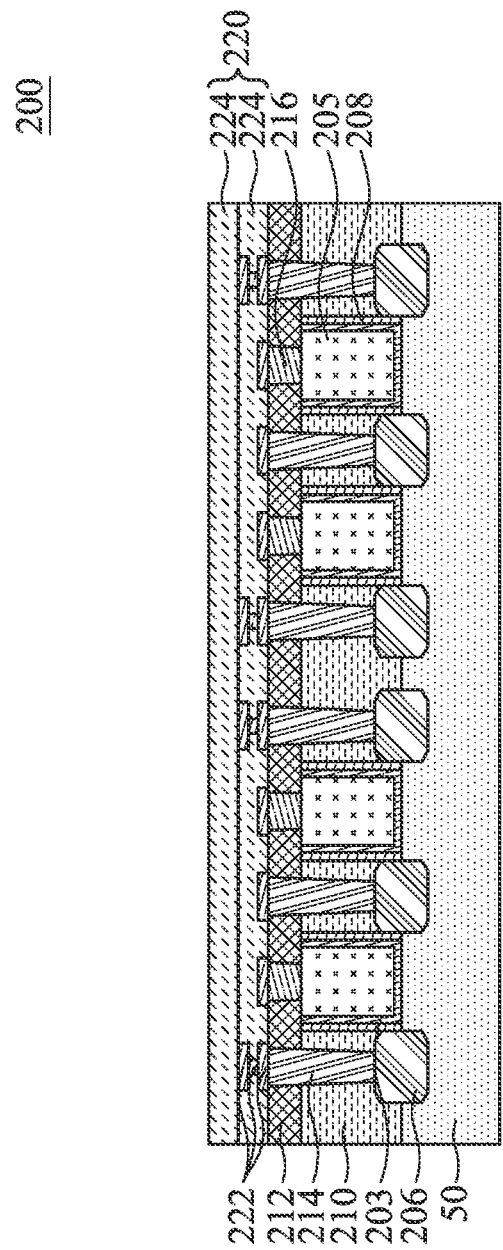

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 203 over top surfaces of the substrate 50 and gate electrodes 205 over the gate dielectric layers 203. Source/drain regions 206 are disposed in the substrate 50 on opposite sides of the gate dielectric layers 203 and the gate electrodes 205. Gate spacers 208 are formed along sidewalls of the gate dielectric layers 203 and separate the source/drain regions 206 from the gate electrodes 205 by appropriate lateral distances. In some embodiments, the transistors may be planar field effect transistors (FETs), fin field effect transistors (FinFETs), nano-field effect transistors (nanoFETs), or the like.

A first ILD 210 surrounds and isolates the source/drain regions 206, the gate dielectric layers 203, and the gate electrodes 205 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
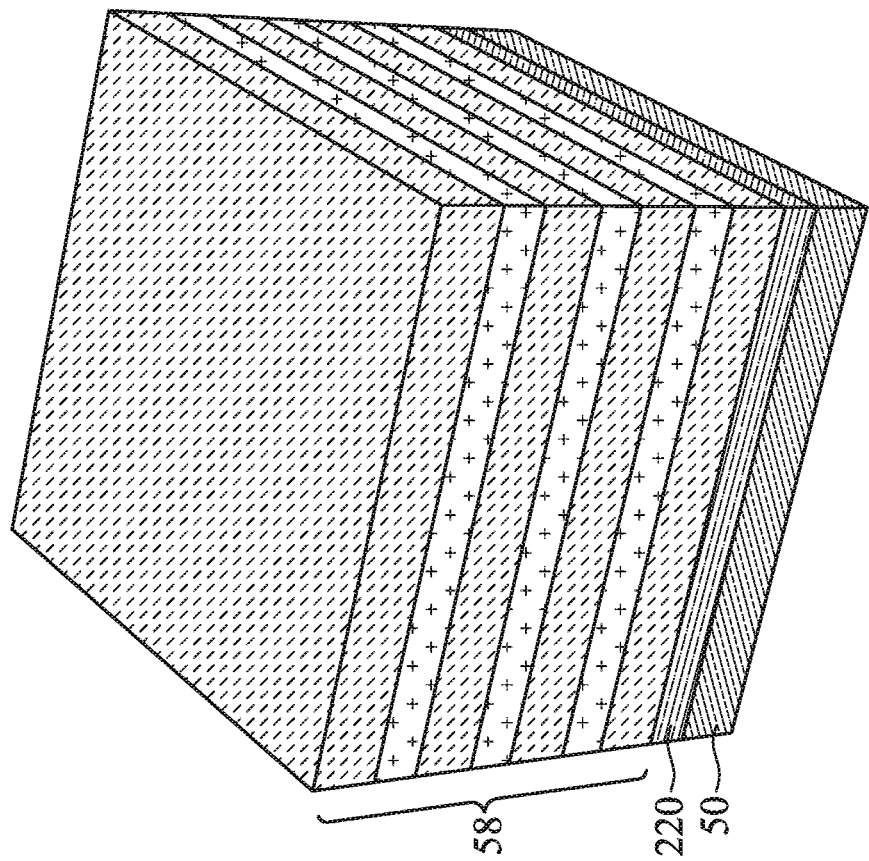
Figure 3B:
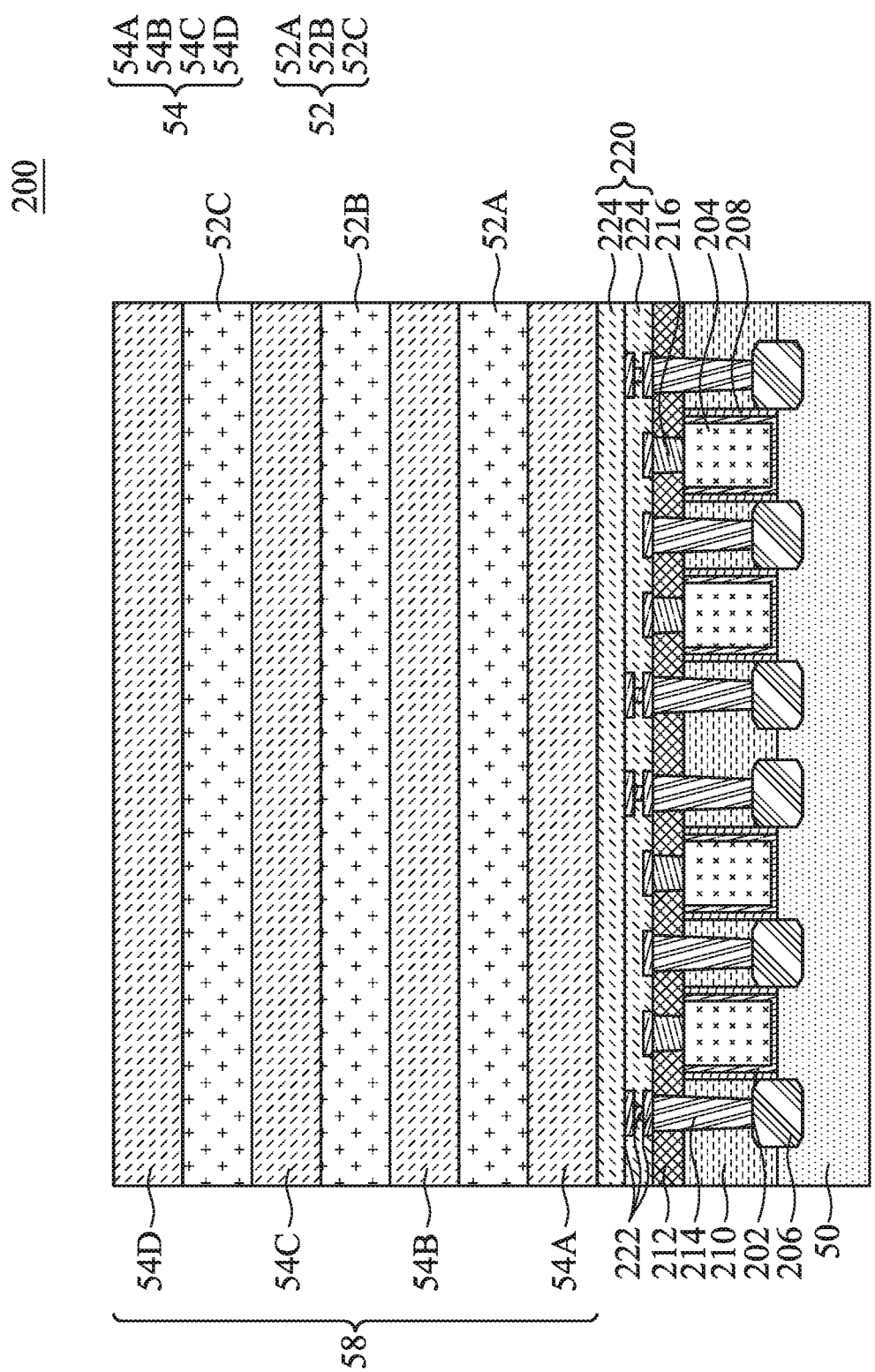

FIGS. 3A through 29D illustrate various views of intermediate steps in the manufacture of a hybrid memory array 200 similar to that shown in FIGS. 1A-C, in accordance with some embodiments. Turning first to FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the hybrid memory array 200 (see FIGS. 1A and 1B).

The multi-layer stack 58 includes alternating layers of conductive lines 54A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

In some embodiments, a multi-layer stack 58 may be formed as alternating layers of dummy dielectric layers (not separately shown in the figures) and dielectric layers 52. The dummy dielectric layers may be formed instead of the conductive layers 54 shown in FIGS. 3A-3B, and then subsequently removed and replaced with conductive layers to form conductive lines 72 (see FIGS. 17A-C). The material of the dummy dielectric layers may have a different etch selectivity from the material of the dielectric layers 52, such that the dummy dielectric layers may be selectively removed while leaving the dielectric layers 52. For example, in some embodiments, the dummy dielectric layers may comprise a nitride while the dielectric layers 52 comprise an oxide. Other materials are possible. In embodiments in which the multi-layer stack 58 includes dummy dielectric layers, the multi-layer stack 58 may be processed in a manner similar to that described for FIGS. 4-16 before replacing the dummy dielectric layers with conductive layers.

Figure 4:
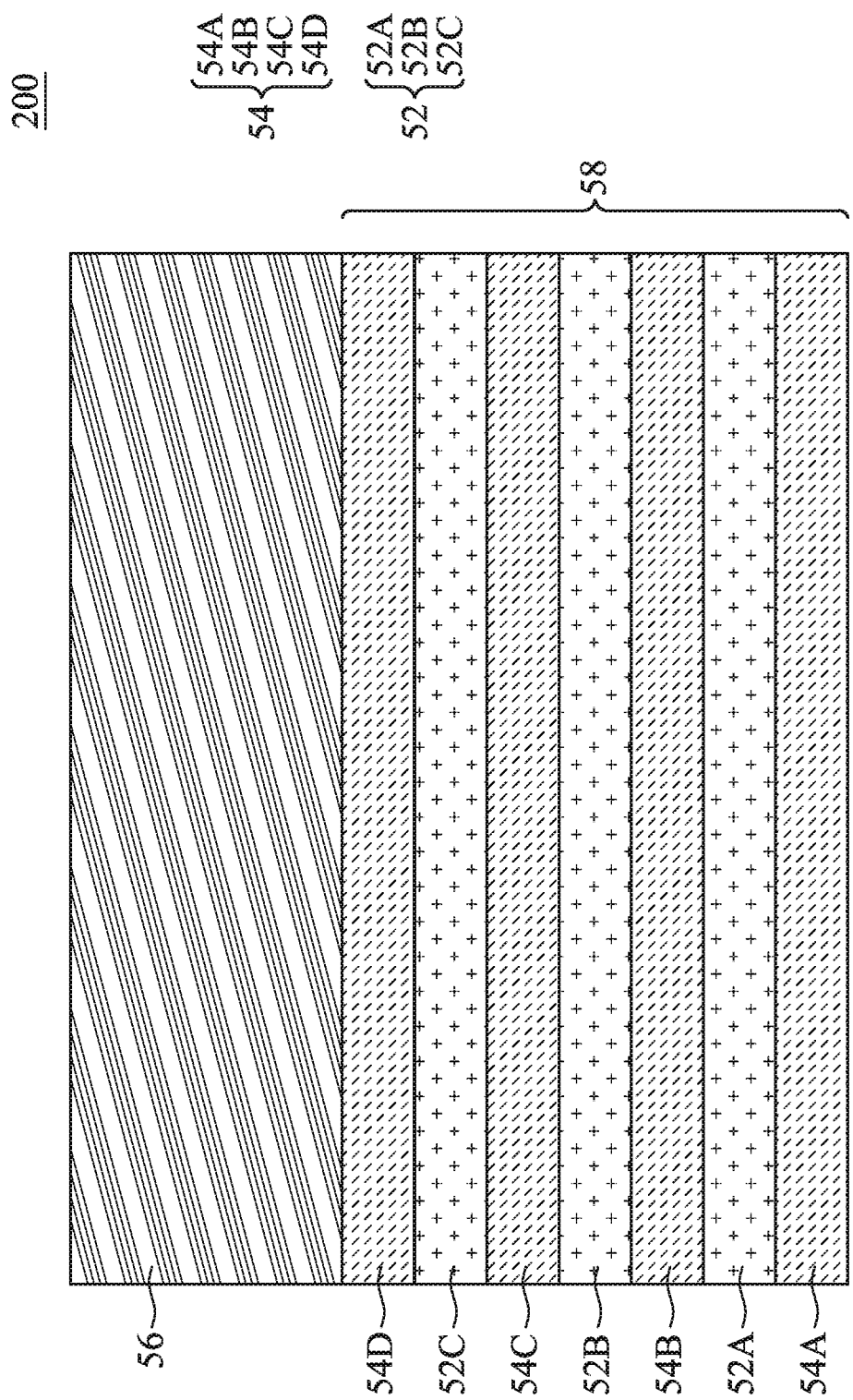

FIGS. 4 through 12B are views of intermediate stages in the manufacturing a staircase structure of the hybrid memory array 200, in accordance with some embodiments. FIGS. 4 through 11 and 12B are illustrated along reference cross-section B-B' illustrated in FIG. 1. FIG. 12A is illustrated in a perspective view. In FIG. 4, a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed, for example, using a spin-on technique.

Figure 5:
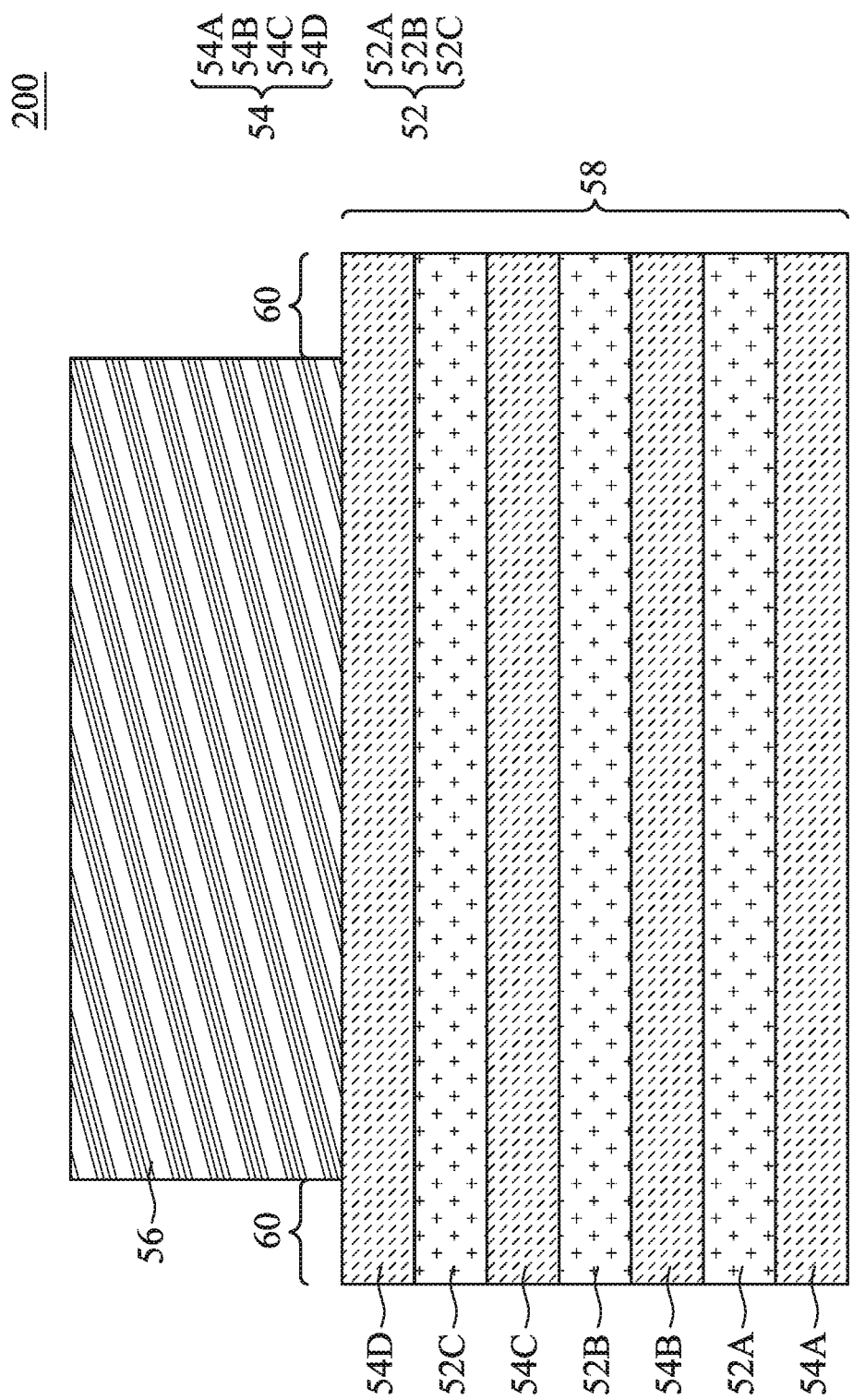

In FIG. 5, the photoresist 56 is patterned to expose the multi-layer stack 58 in regions 60 while masking remaining portions of the multi-layer stack 58. For example, a topmost layer of the multi-layer stack 58 (e.g., conductive layer 54D) may be exposed in the regions 60. The photoresist 56 may be patterned using acceptable photolithography techniques.

Figure 6:
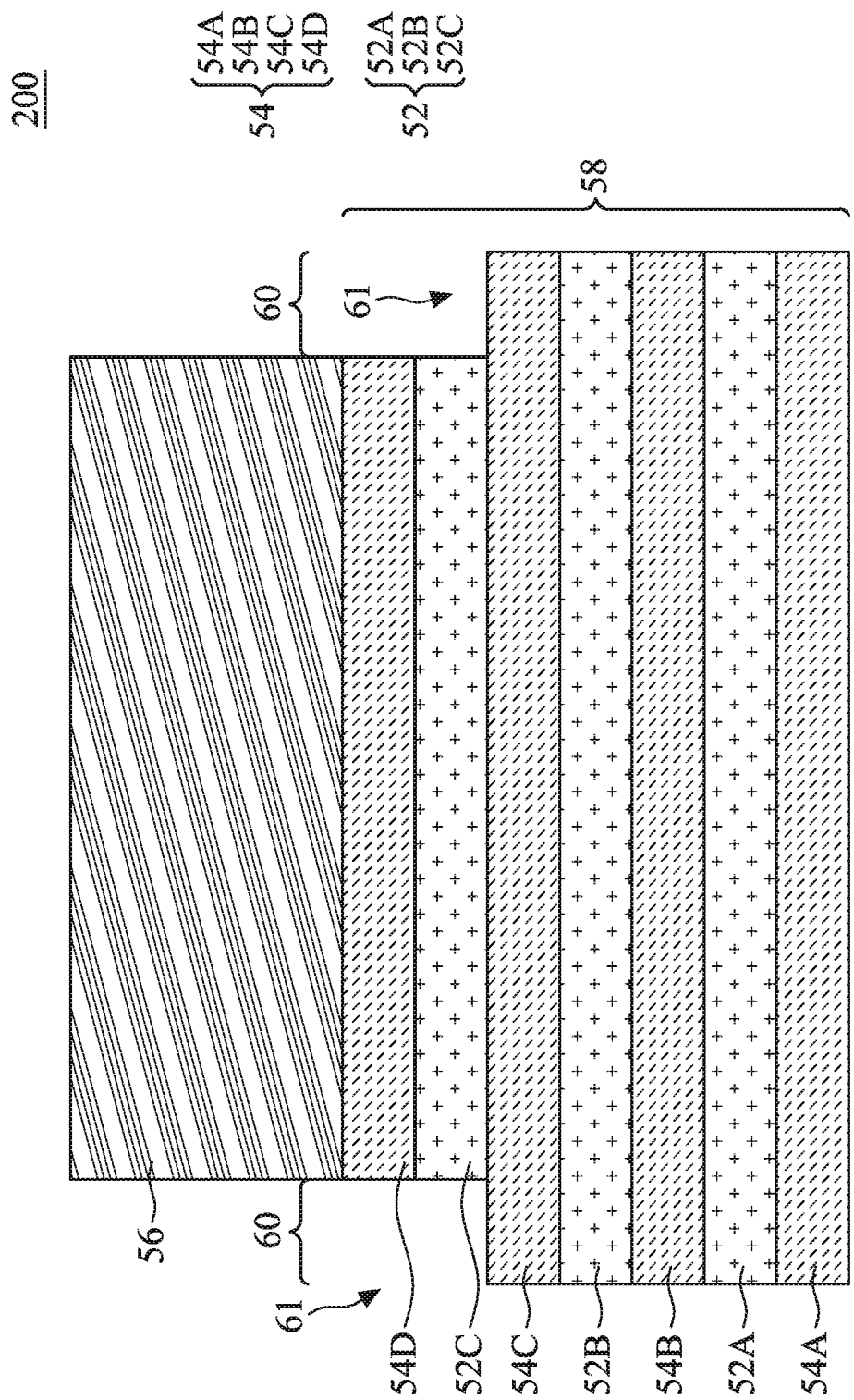

In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the conductive layer 54D and the dielectric layer 52C may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
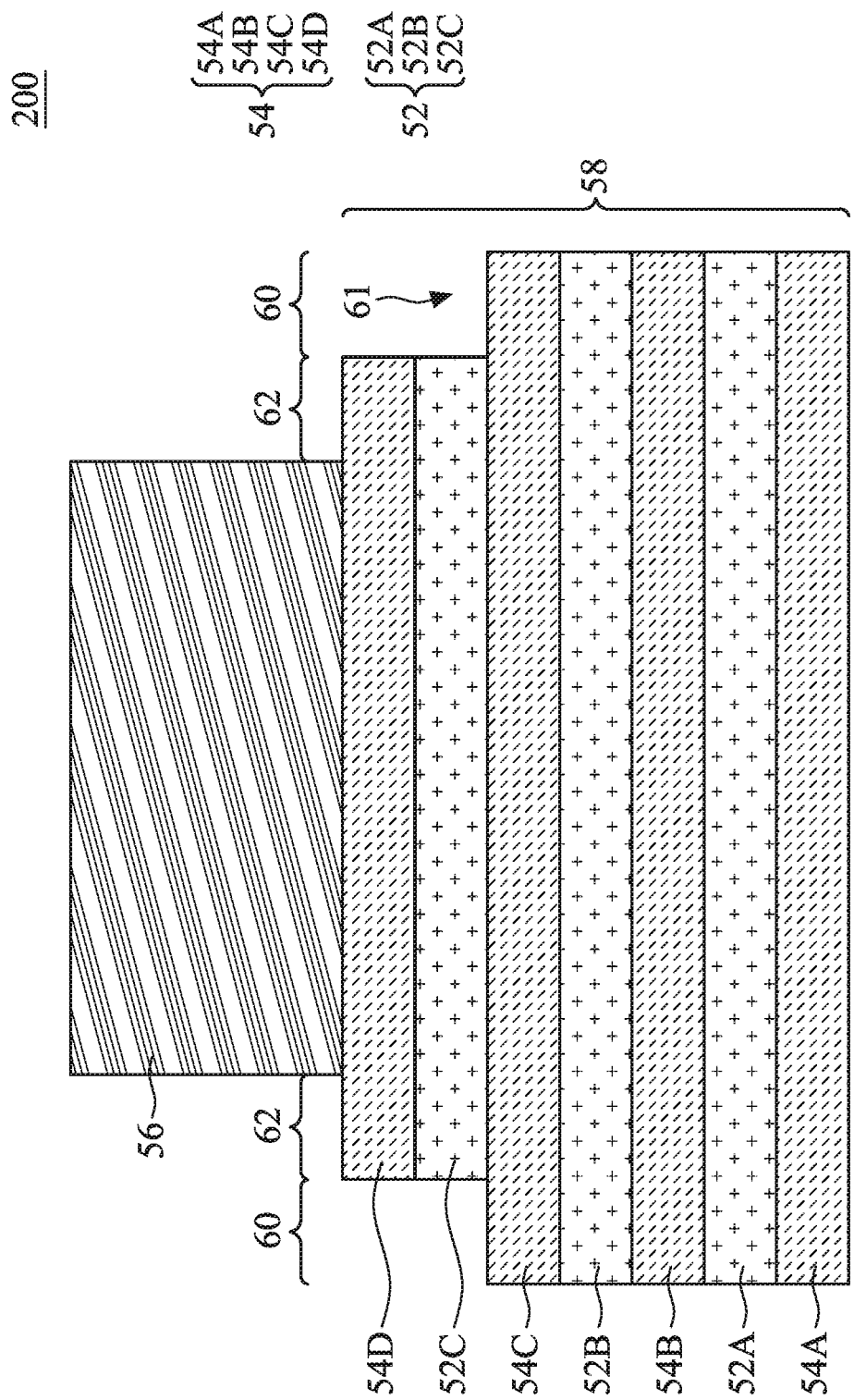

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
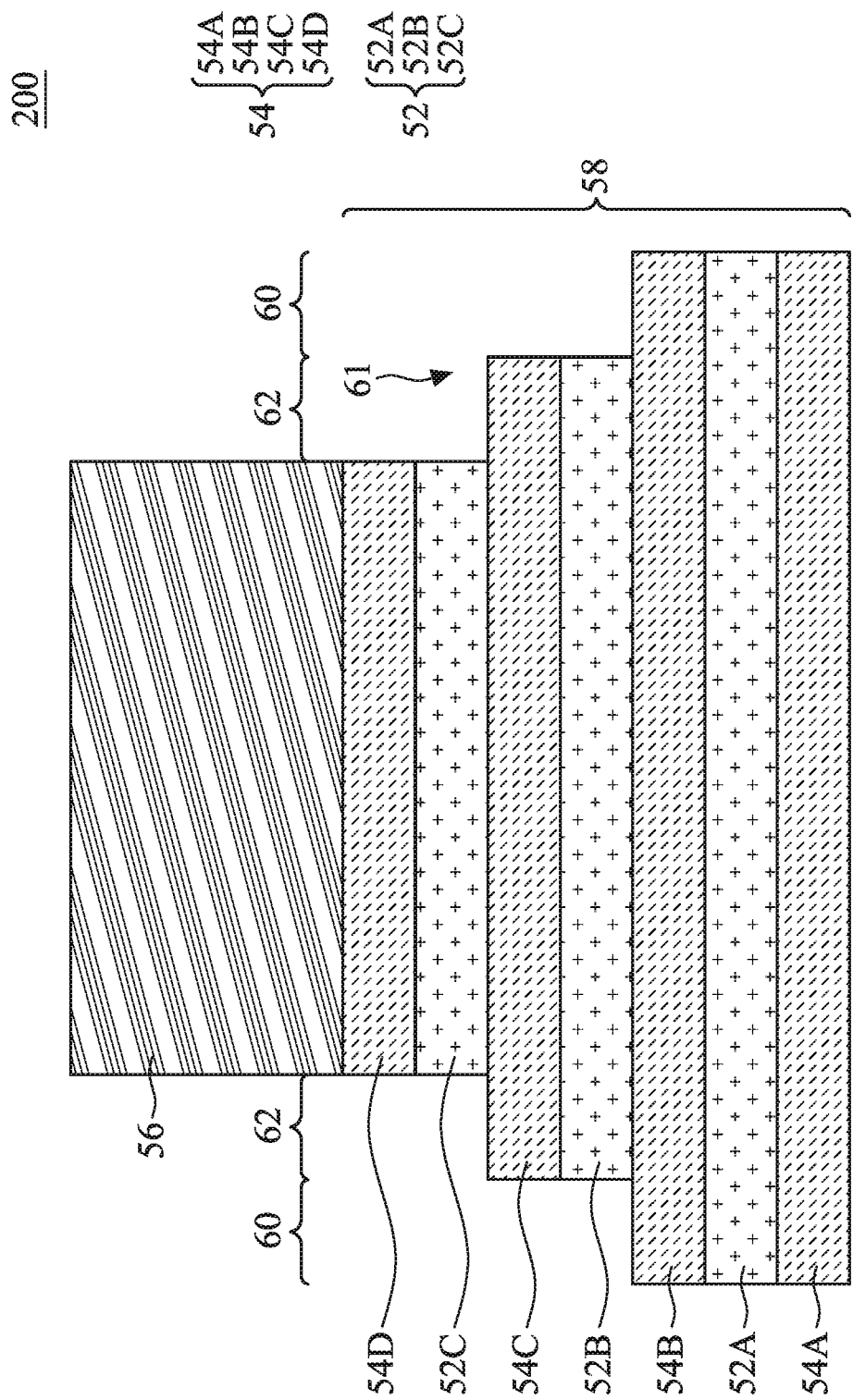

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
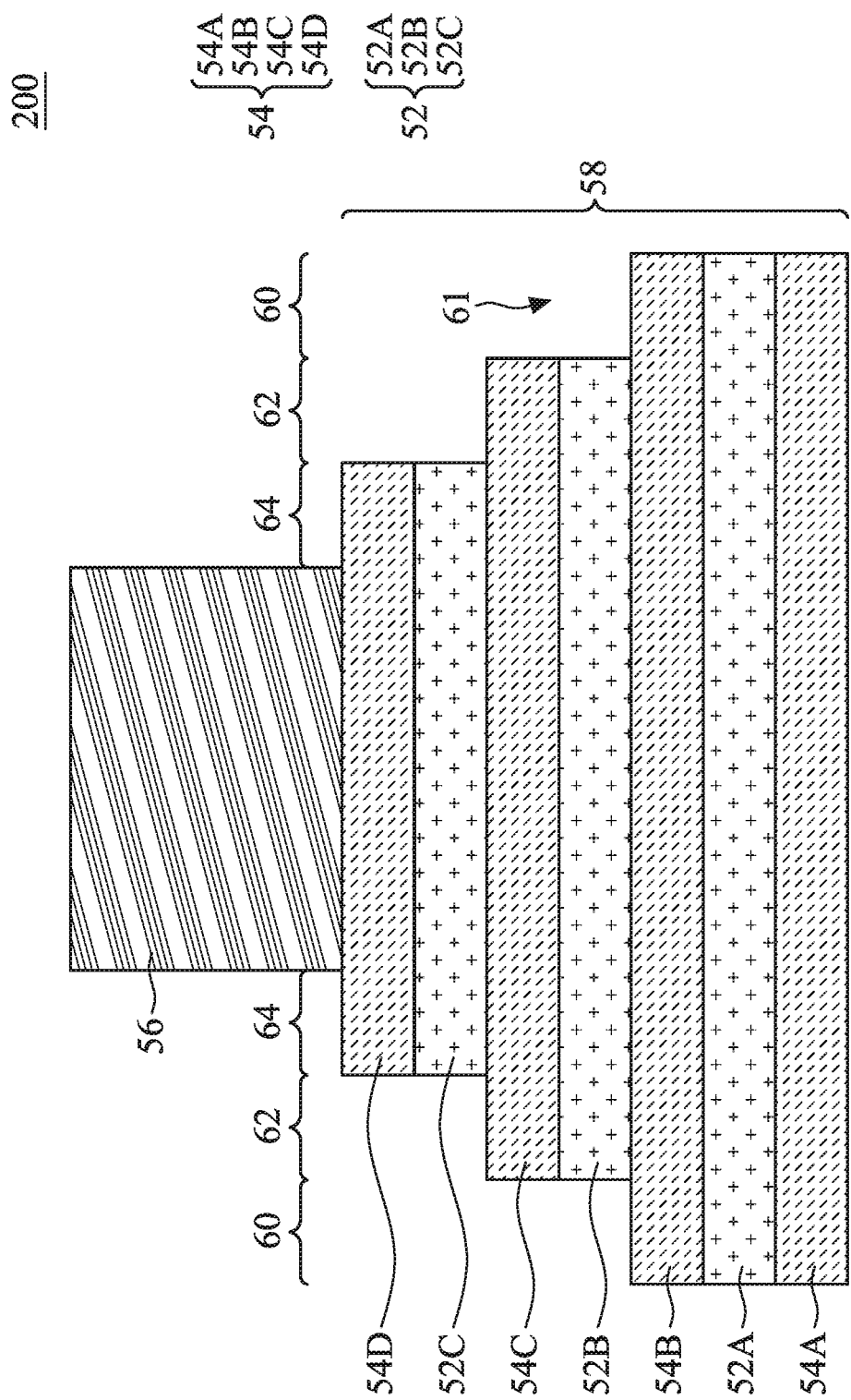

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 542D may be exposed in the regions 64.

Figure 10:
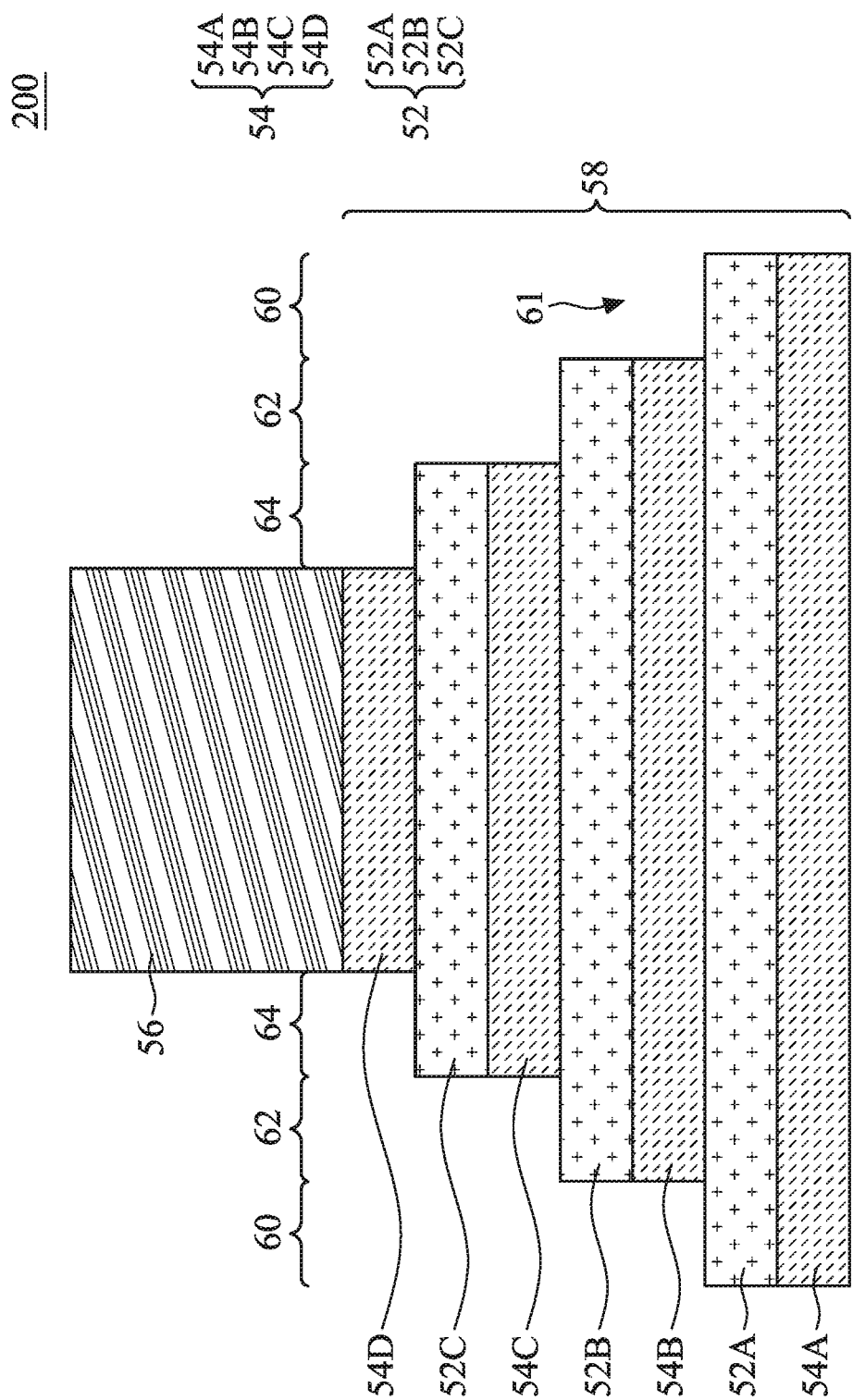

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

In FIG. 11, the photoresist 56 may be removed, such as by an acceptable ashing or wet strip process. Thus, a staircase structure is formed in the multi-layer stack 58. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure to each of the conductive layers 54 in subsequent processing steps.

Figure 12A:
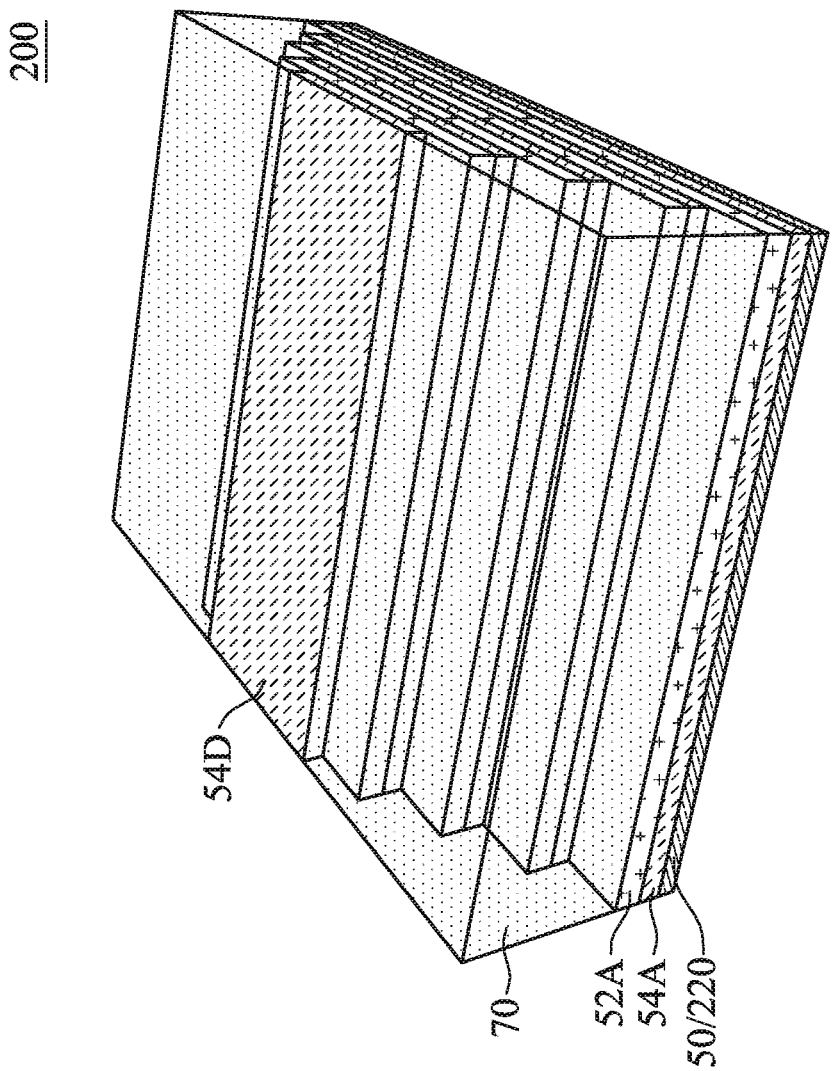
Figure 12B:
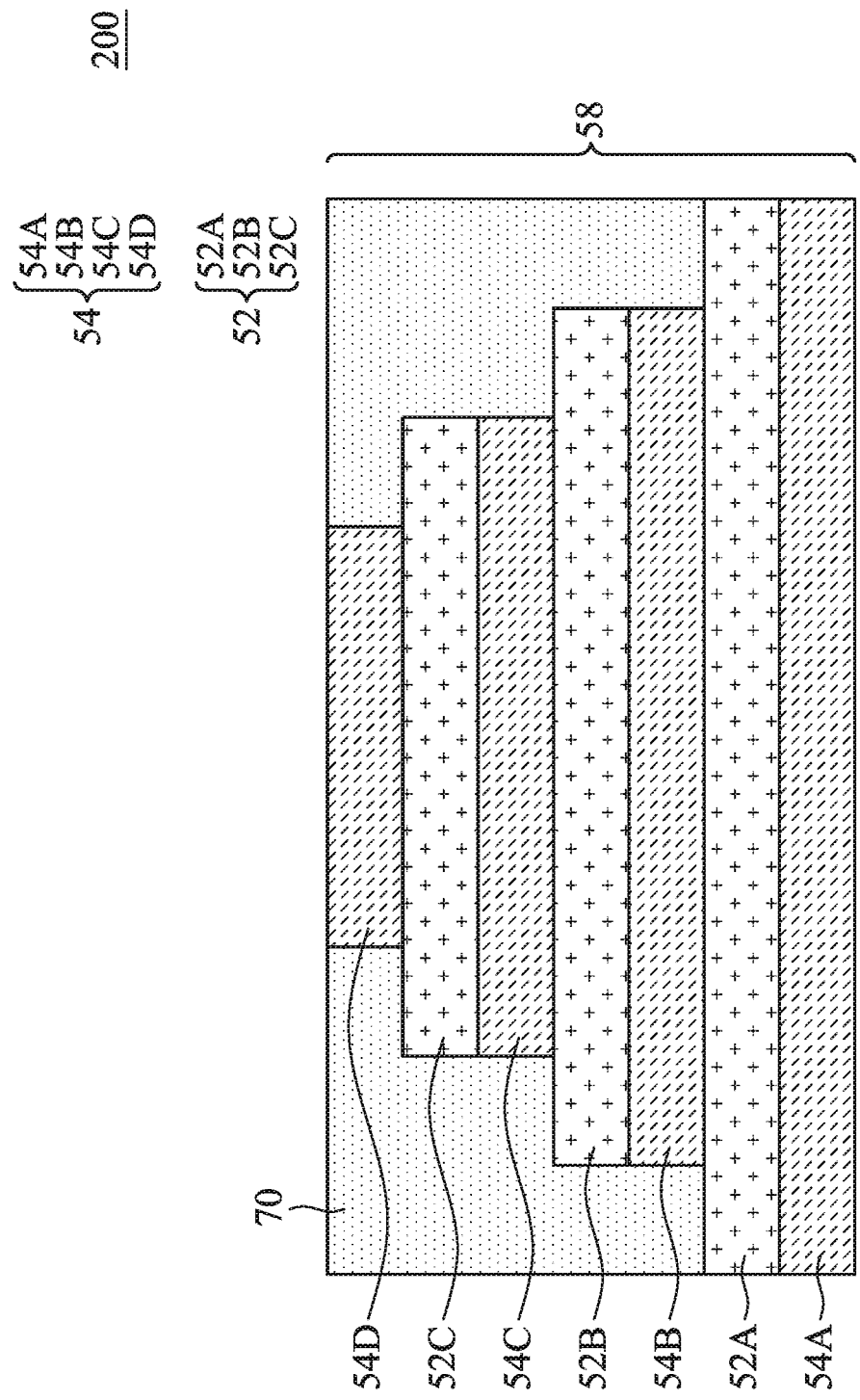

In FIGS. 12A and 12B, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIGS. 12A-B, a removal process may be performed to the IMD 70 to remove excess dielectric material over the multi-layer stack 58. In some embodiments, a planarization process such as a chemical mechanical polish (CMP), a grinding process, an etch-back process, combinations thereof, or the like may be utilized. The planarization process exposes the multi-layer stack 58 such that top surfaces of the multi-layer stack 58 and the IMD 70 are level after the planarization process is complete.

FIGS. 13 through 21C are views of intermediate stages in the manufacturing of the hybrid memory array 200, in accordance with some embodiments. In FIGS. 13 through 21C, the multi-layer stack 58 is formed and trenches 86 are formed in the multi-layer stack 58, thereby defining the conductive lines 72. The conductive lines 72 may correspond to word lines in the hybrid memory array 200, and the conductive lines 72 may further provide gate electrodes for the resulting transistors 204 of the hybrid memory array 200. FIGS. 14A, 17A, 18A, 19A, and 21A are illustrated in a perspective view. FIGS. 13, 14B, 15, 16, 17B, 18B, 19B, 20, and 21C are illustrated along reference cross-section C-C' illustrated in FIG. 1A. FIG. 21B is illustrated in a plan view.

Figure 13:
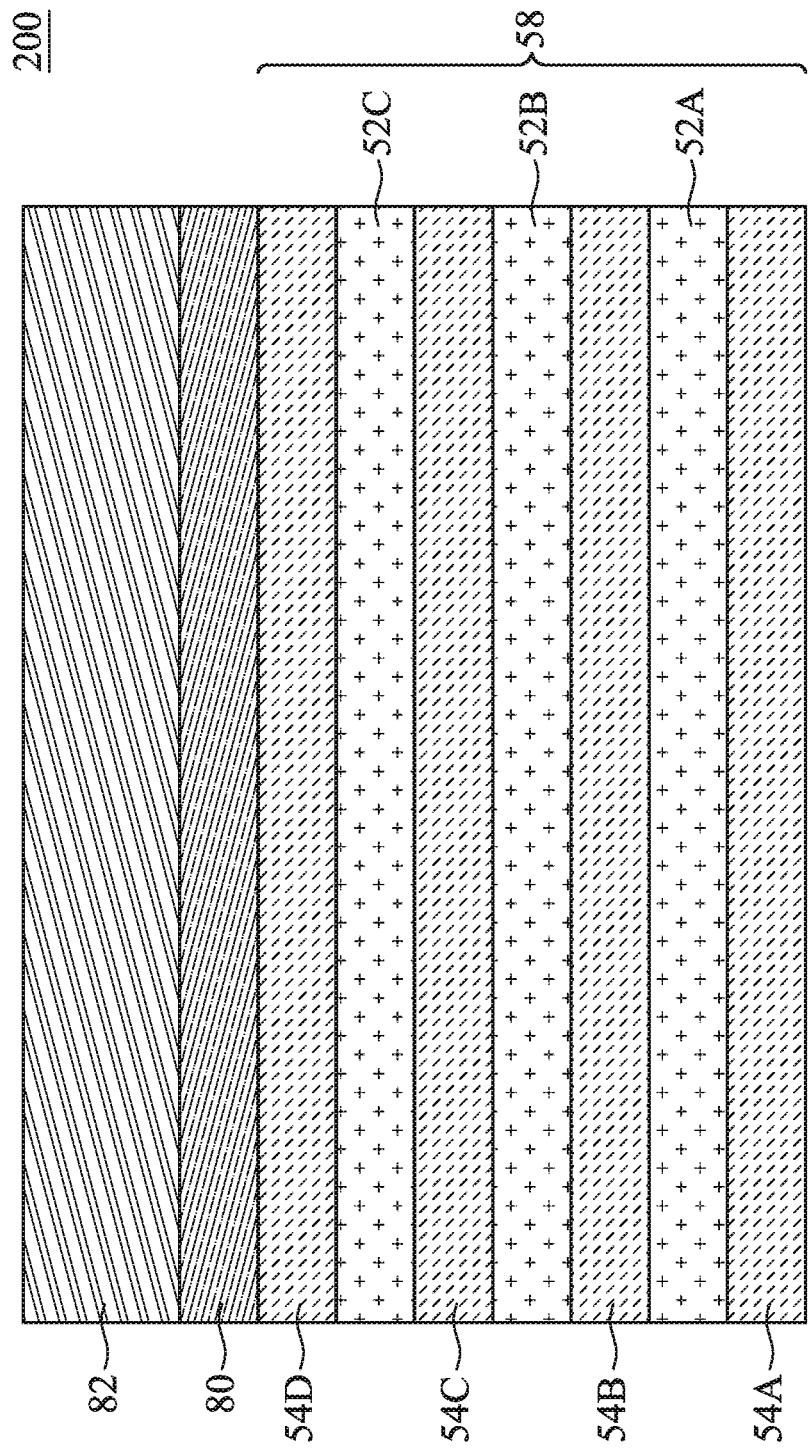

In FIG. 13, a hard mask 80 and a photoresist 82 are deposited over the multi-layer stack 58. The hard mask 80 may include, for example, silicon nitride, silicon oxynitride, or the like, which may be deposited by CVD, PVD, ALD, PECVD, or the like. The photoresist 82 can be formed by using a spin-on technique, for example.

Figure 14A:
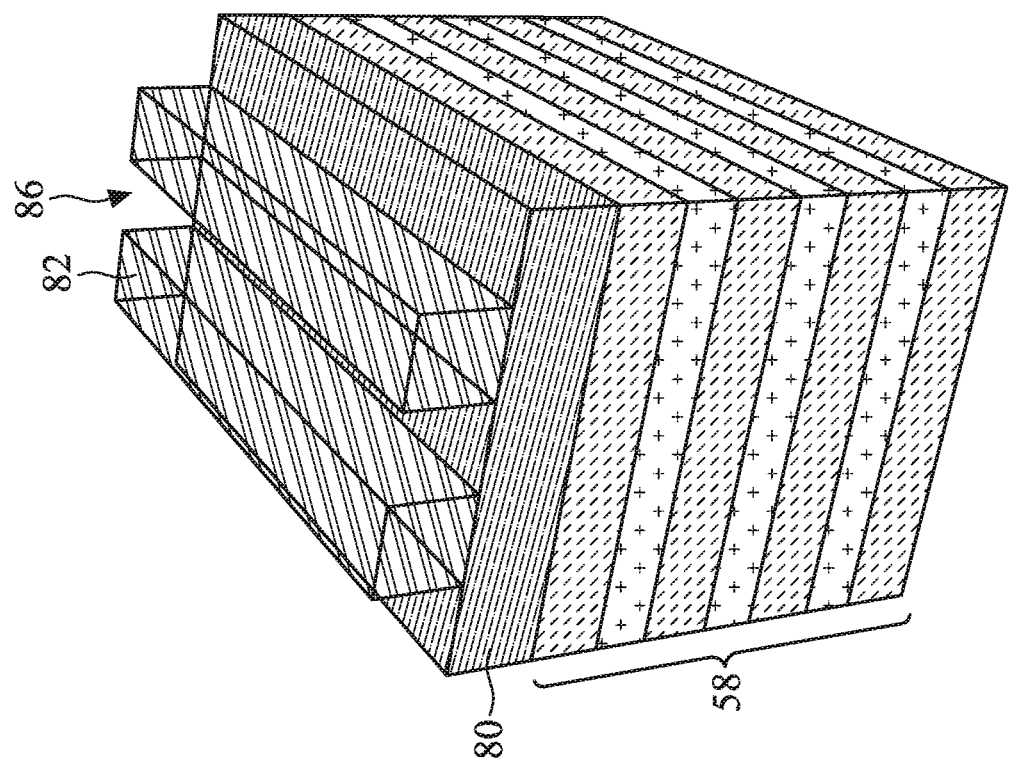
Figure 14B:
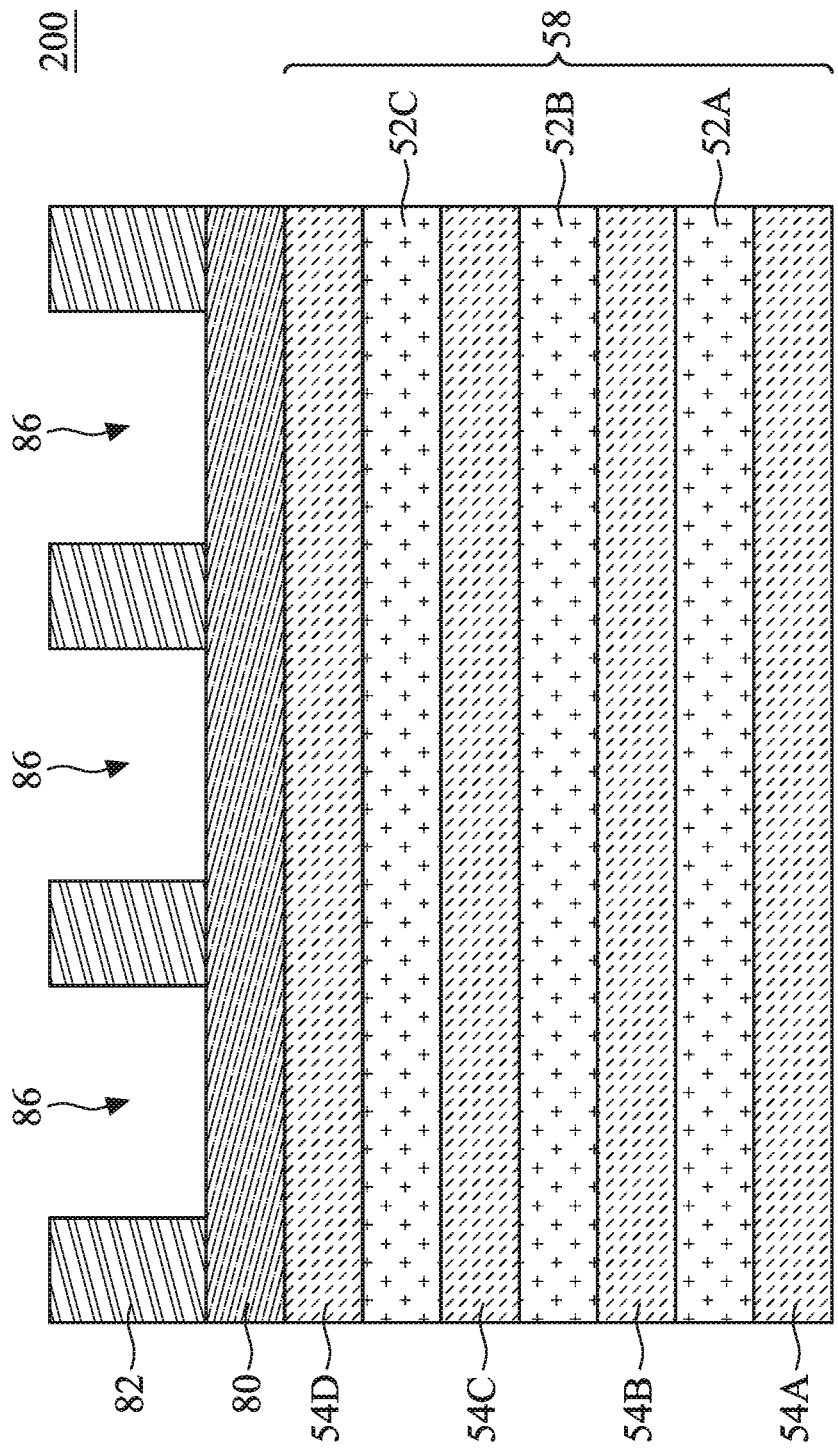

In FIGS. 14A and 14B, the photoresist 82 is patterned to form trenches 86. The photoresist 82 can be patterned using acceptable photolithography techniques. For example, the photoresist 82 be exposed to light for patterning. After the exposure process, the photoresist 82 may be developed to remove exposed or unexposed portions of the photoresist 82 depending on whether a negative or positive resist is used, thereby defining the pattern of the trenches 86.

Figure 15:
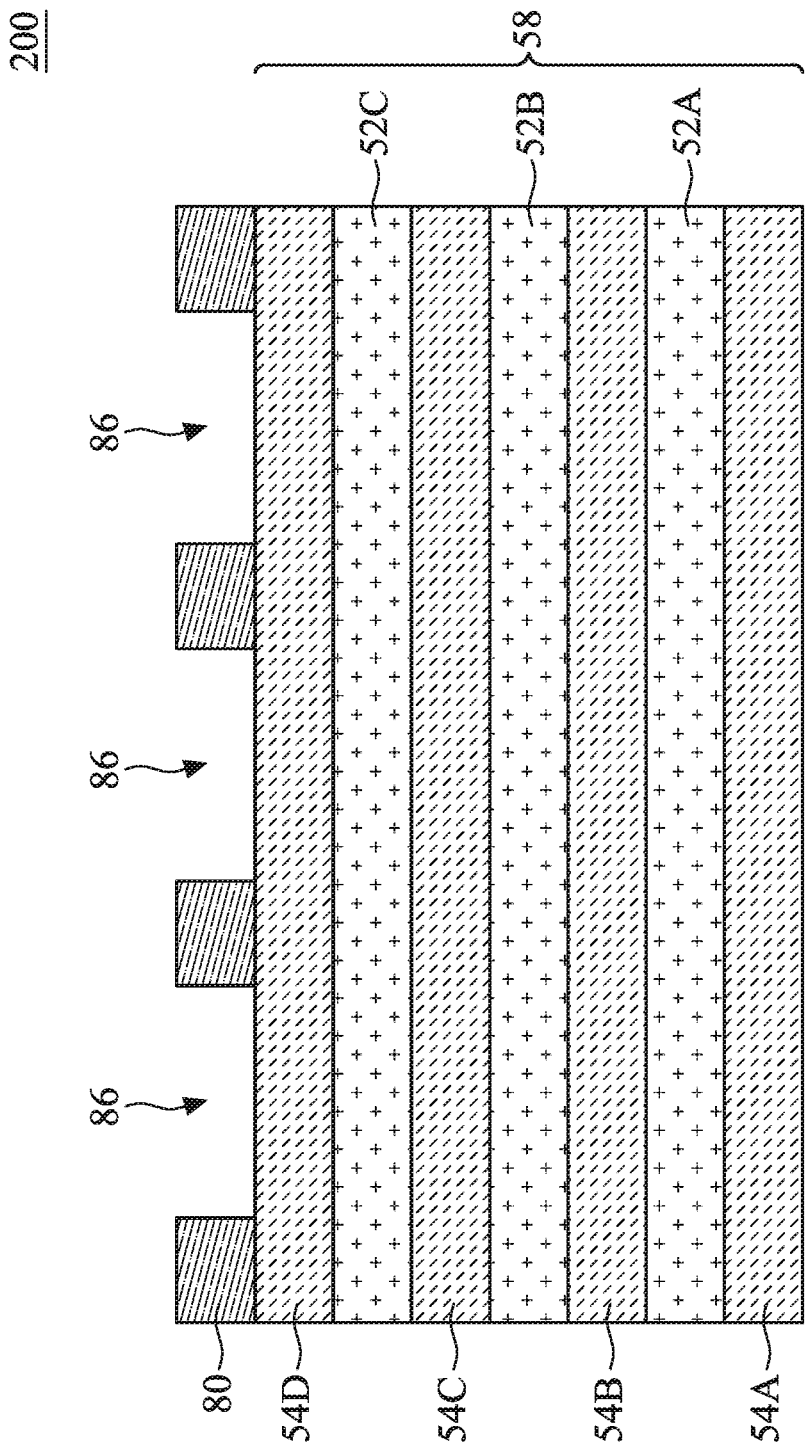

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
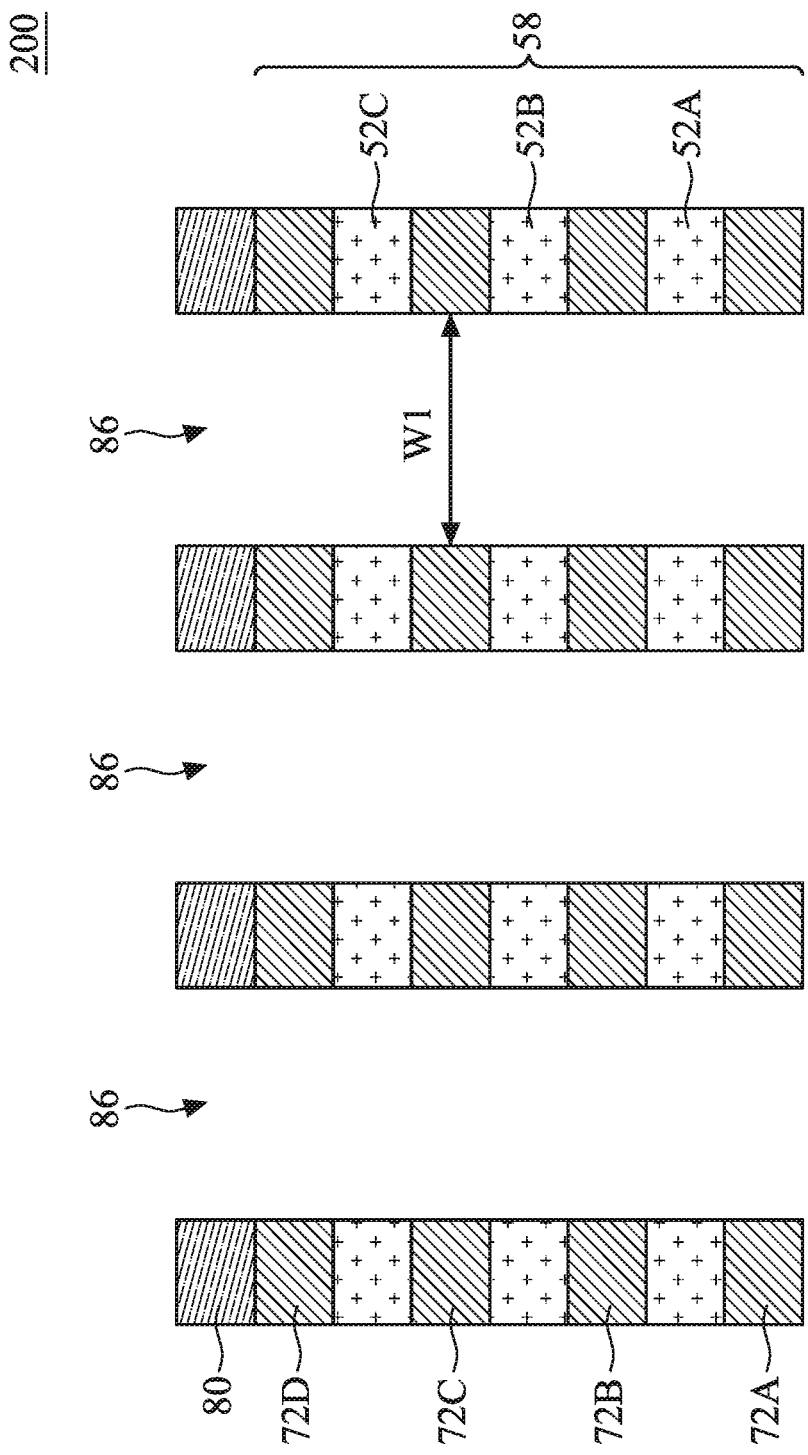

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other.

Figure 17A:
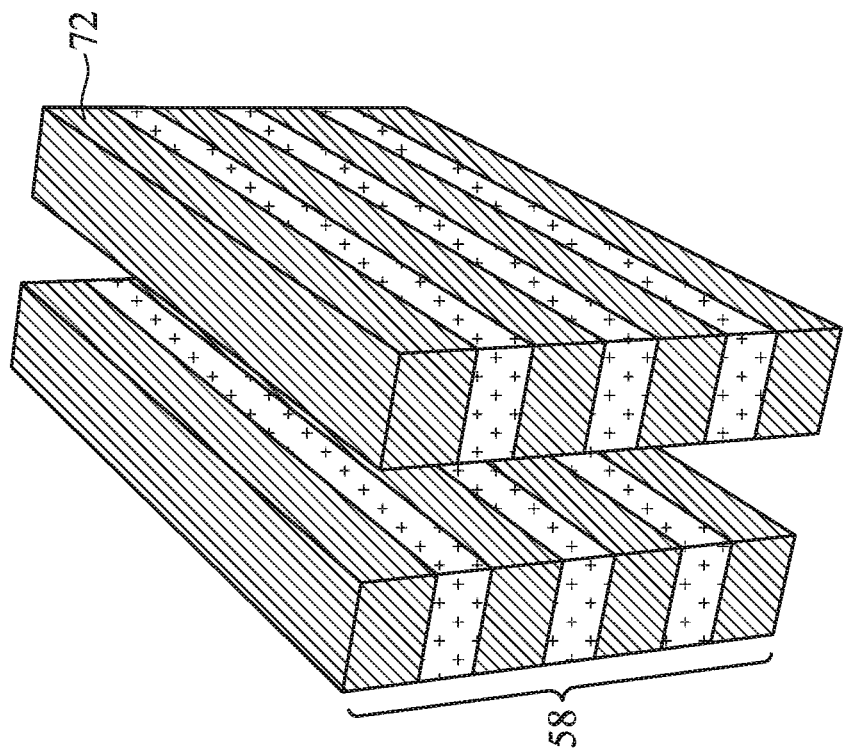
Figure 17B:
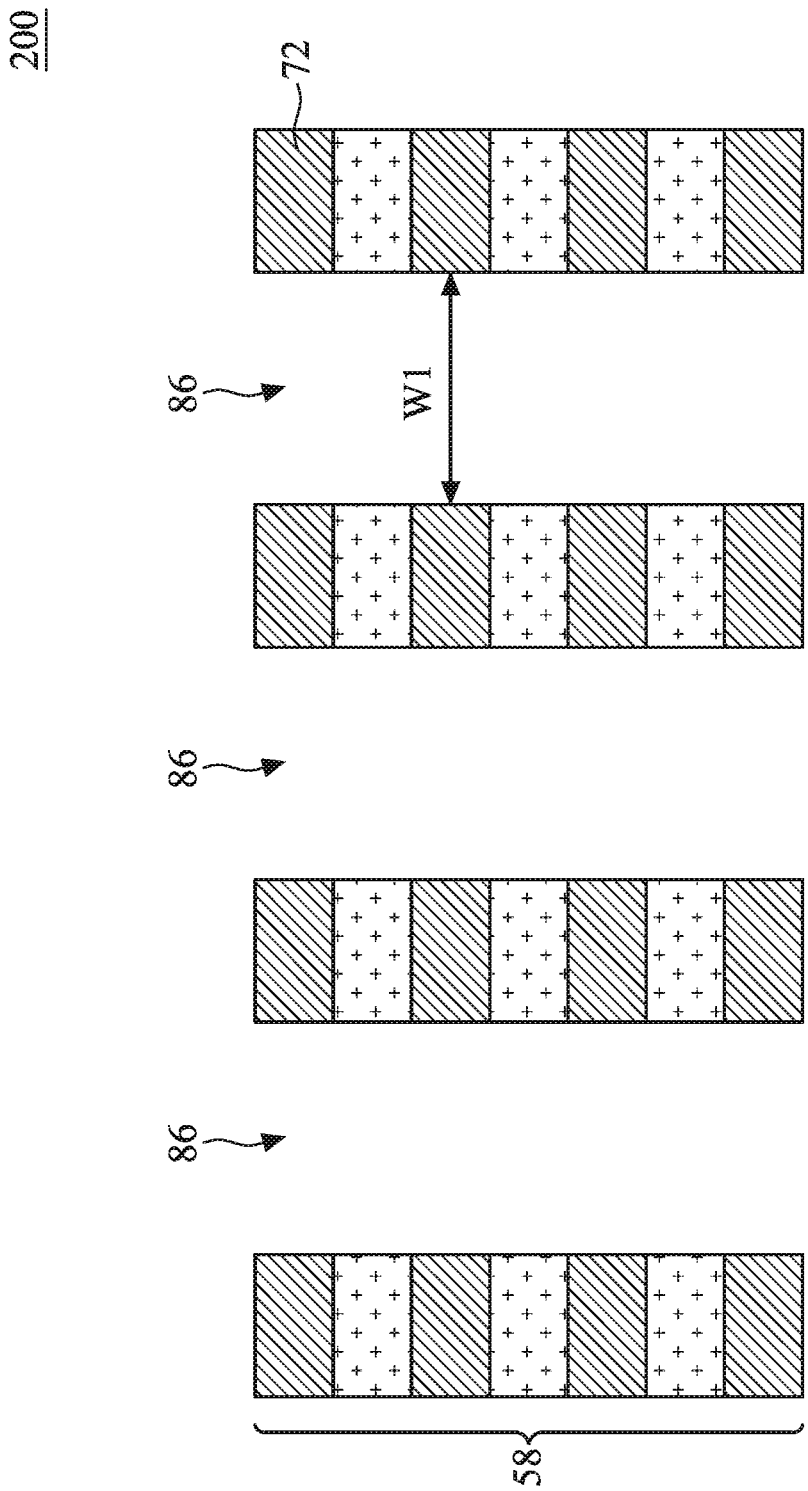

In FIGS. 17A and 17B, the hard mask 80 is removed by an acceptable process, such as a wet etching process, a dry etching process, a planarization process, combinations thereof, or the like. Due to the staircase shape of the multi-layered stack 58 (see e.g., FIG. 12), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D. In some embodiments, the trenches 86 may be formed having a width W1 that is in the range of about 50 nm to about 100 nm, though other widths are possible.

In embodiments in which dummy dielectric layers are formed (described previously for FIGS. 3A-B, the dummy dielectric layers may be removed before or after removal of the hard mask 80. The dummy dielectric layers may be removed, for example, by an acceptable process such as a wet etching process or a dry etching process selective to the material of the dummy dielectric layers over the material of the dielectric layers 52, leaving gaps (not shown in the figures) between the dielectric layers 52. Portions of the dummy dielectric layers (e.g., at the periphery of the multi-layer stack 58) may remain between the dielectric layers 52 to provide physical support between the dielectric layers 52 and to define the gaps. Subsequently, the conductive material of the conductive lines 72 may be deposited in the gaps using similar processes and materials as described previously for the conductive layers 54 (see FIGS. 3A-B). After the replacement of the dummy dielectric layers with conductive lines 72, a multi-layer stack is formed that may be similar to the multi-layer stack 58 as shown in FIGS. 17A-B, and subsequent processing may proceed similarly as the processing of the multi-layer stack 58 as described below in FIGS. 18A through 29D. In other embodiments, the dummy dielectric layers may be replaced with conductive lines 72 at a different step than the step shown in FIGS. 17A-B.

Figure 18A:
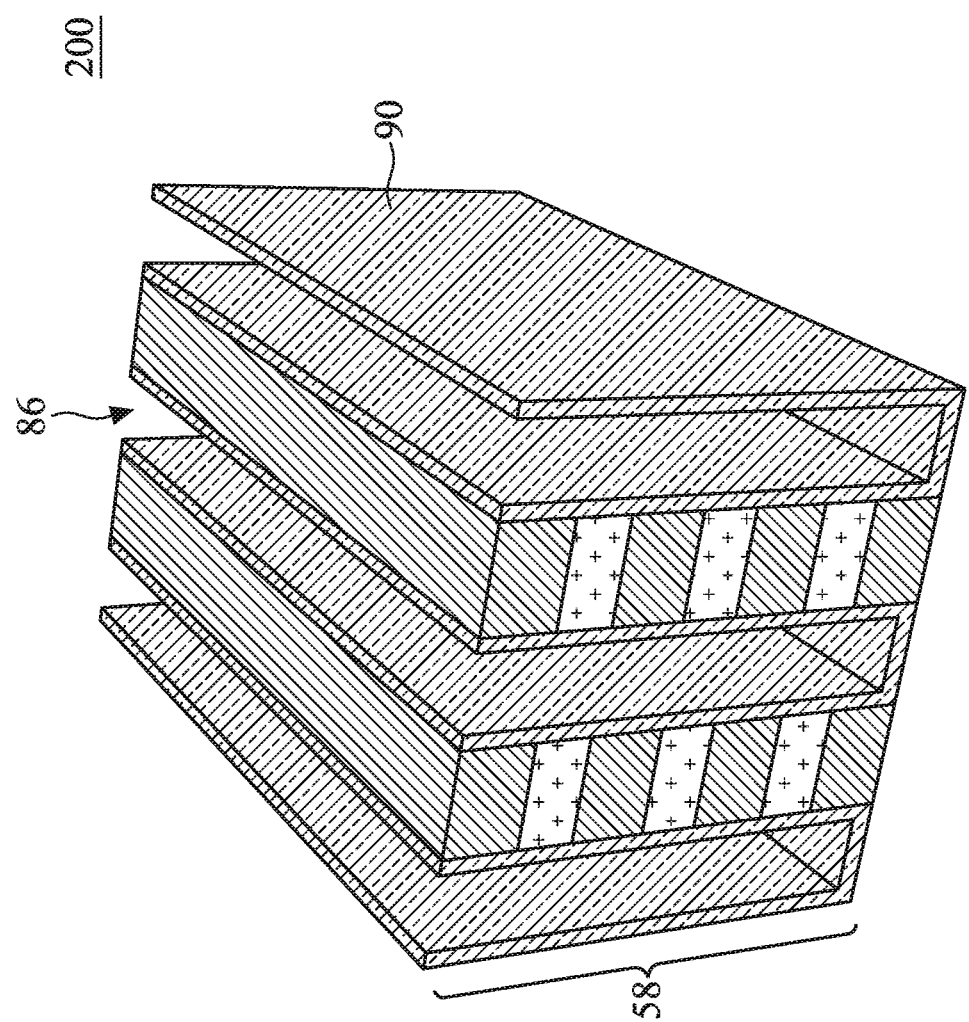
Figure 18B:
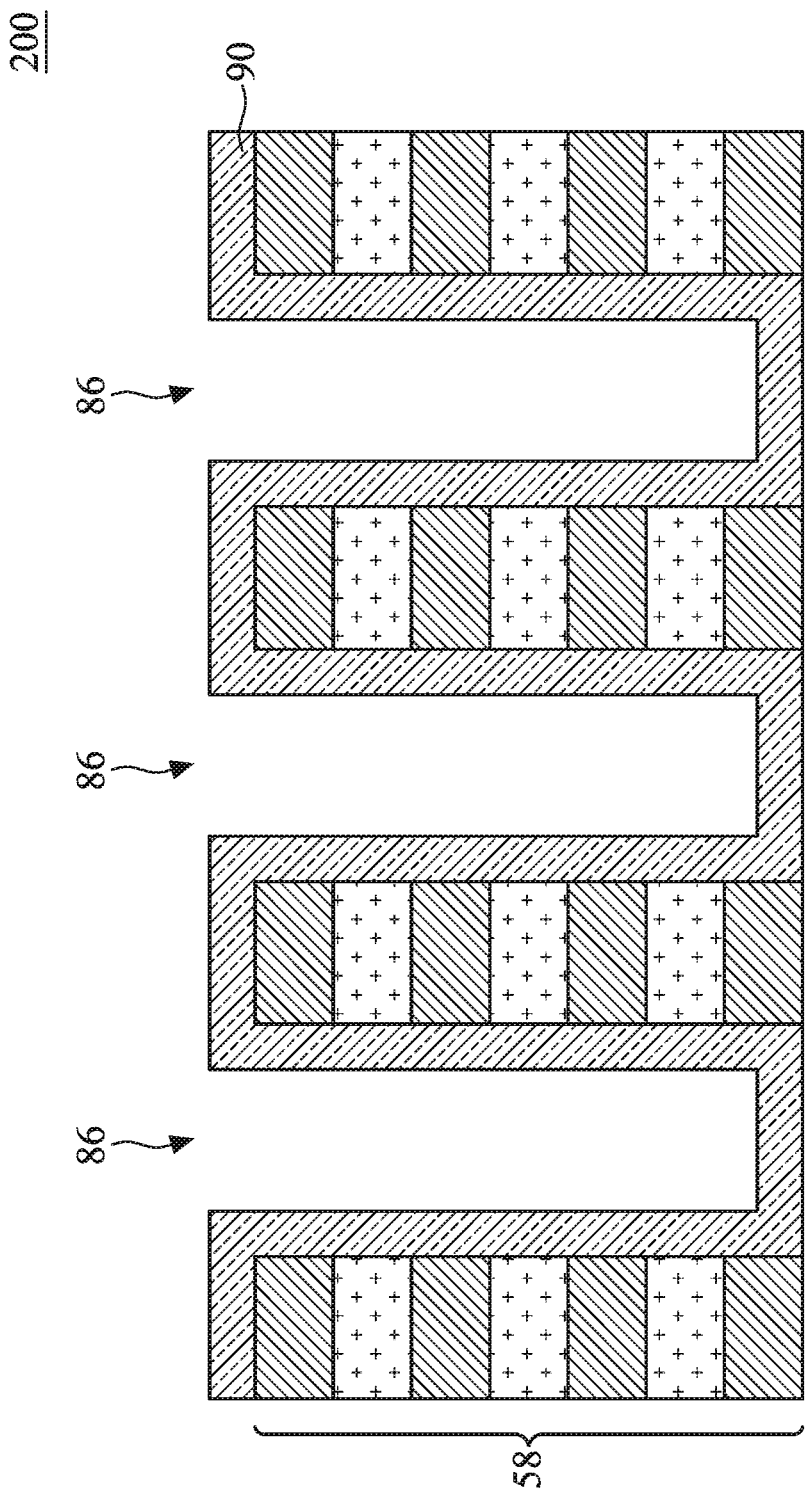

In FIGS. 18A and 18B, the memory film 90 is conformally deposited in the trenches 86. The memory film 90 may comprise a material that is capable of storing a bit, such as material capable of switching between two different polarization directions by applying an appropriate voltage differential across the memory film 90. For example, the polarization of the memory film 90 may change due to an electric field resulting from applying the voltage differential. In some embodiments, the memory film 90 comprises a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory film 90 may be a multilayer structure comprising a layer of $SiN_x$ between two $SiO_x$ layers (e.g., an ONO structure). In still other embodiments, the memory film 90 comprises a different ferroelectric material or a different type of memory material. The memory film 90 may be deposited by CVD, PVD, ALD, PECVD, or the like to extend along sidewalls and bottom surfaces of the trenches 86. In some embodiments, after the memory film 90 is deposited, an annealing step may be performed. In some embodiments, the memory film 90 may be deposited to a thickness that is in the range of about 5 nm to about 15 nm, though other thicknesses are possible.

Figure 19A:
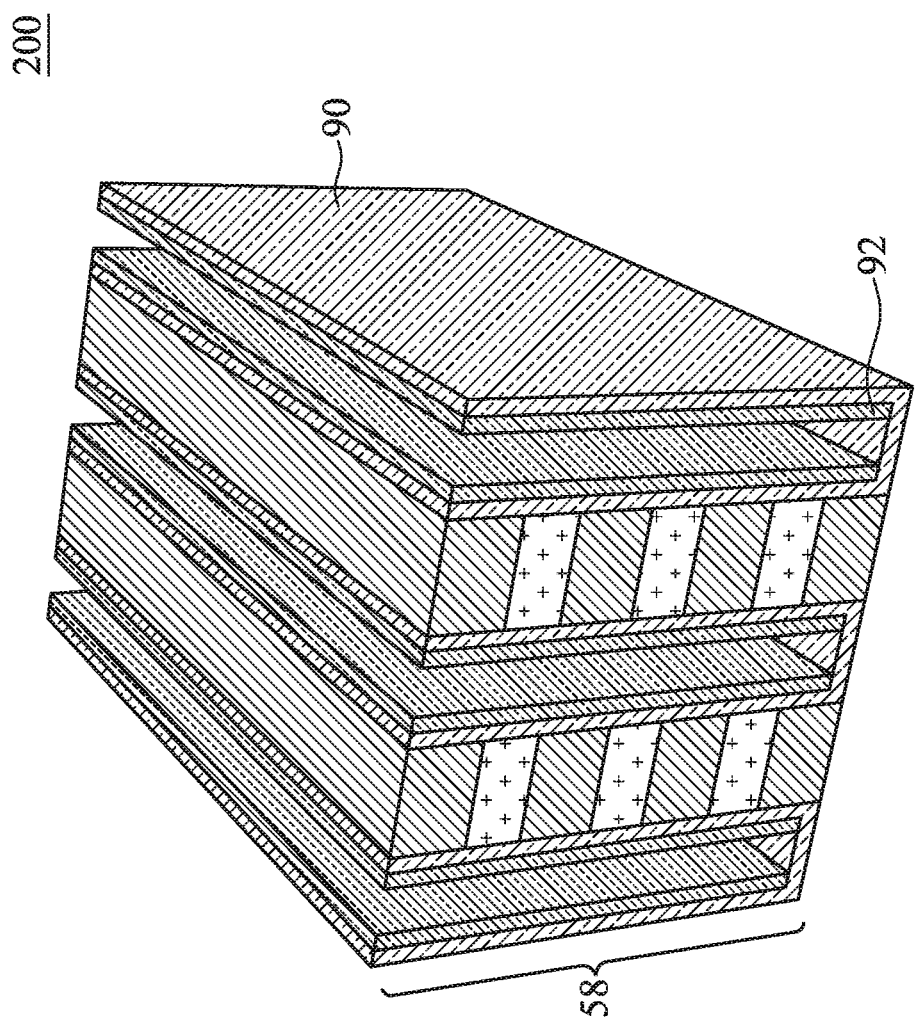
Figure 19B:
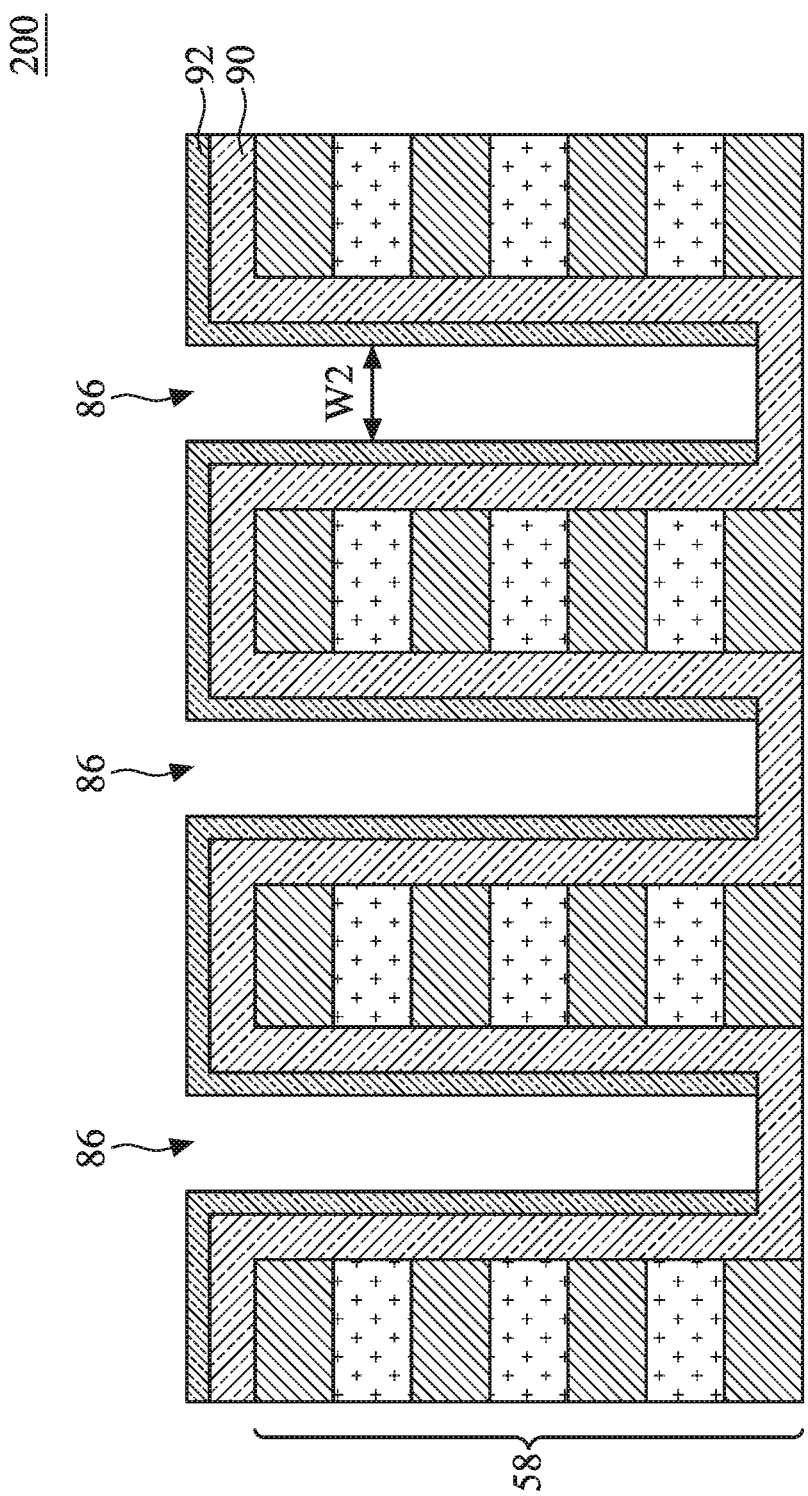

In FIGS. 19A and 19B, the OS layer 92 is conformally deposited in the trenches 86 over the memory film 90. The OS layer 92 comprises a material suitable for providing a channel region for a transistor (e.g., transistors 204, see FIG. 1A). In some embodiments, the OS layer 92 comprises an indium-comprising material, such as $In_xGa_yZn_zMO$, where M may be Ti, Al, Sn, W, or the like. X, Y, and Z may each be any value between 0 and 1. For example, the OS layer 92 may comprise indium gallium zinc oxide, indium titanium oxide, indium tungsten oxide, indium oxide, the like, or combinations thereof. In other embodiments, a different semiconductor material than these examples may be used for the OS layer 92. The OS layer 92 may be deposited by CVD, PVD, ALD, PECVD, or the like. The OS layer 92 may extend along sidewalls of the memory film 90 within the trenches 86. In other embodiments, the OS layer 92 may also extend on bottom surfaces of the memory film 90 within the trenches 86 (not shown). In some embodiments, after the OS layer 92 is deposited, an annealing step (e.g., at a temperature range of about 300° C. to about 450° C.) in oxygen-related ambient may be performed to activate the charge carriers of the OS layer 92. In some embodiments, the OS layer 92 may be deposited to a thickness that is in the range of about 1 nm to about 15 nm, though other thicknesses are possible. In some embodiments, after depositing the OS layer 92, the trenches 86 may have a width W2 that is in the range of about 20 nm to about 70 nm, though other widths are possible.

Figure 20:
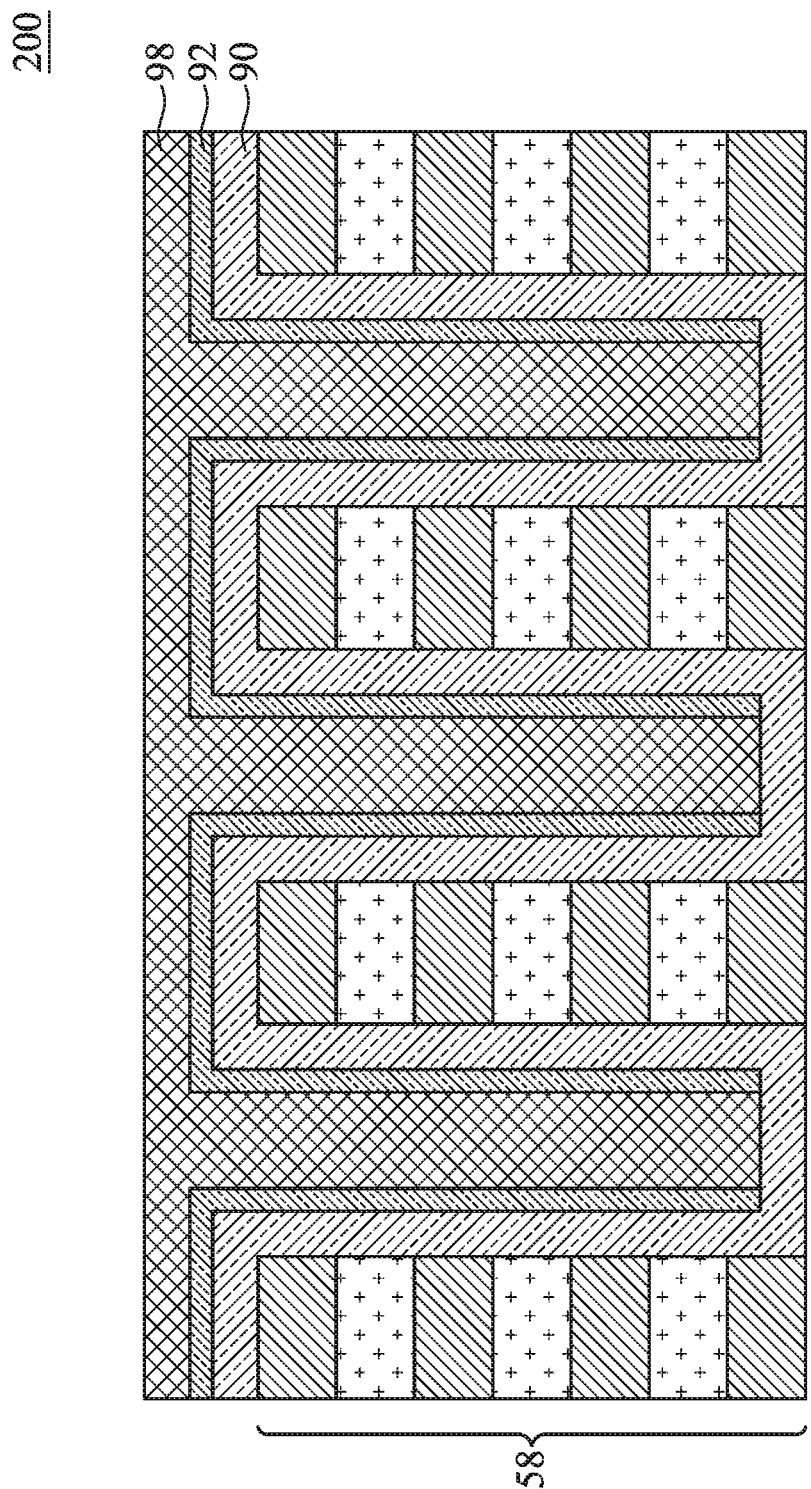

In FIG. 20, a dielectric material 98 is deposited on sidewalls and a bottom surface of the trenches 86. The dielectric material 98 may comprise, for example, silicon oxide, silicon nitride, silicon oxynitride, or the like, which may be deposited by CVD, PVD, ALD, PECVD, or the like. As shown in FIG. 20, the dielectric material 98 may fill the trenches 86 and may cover the multi-layer stack 58.

Figure 21A:
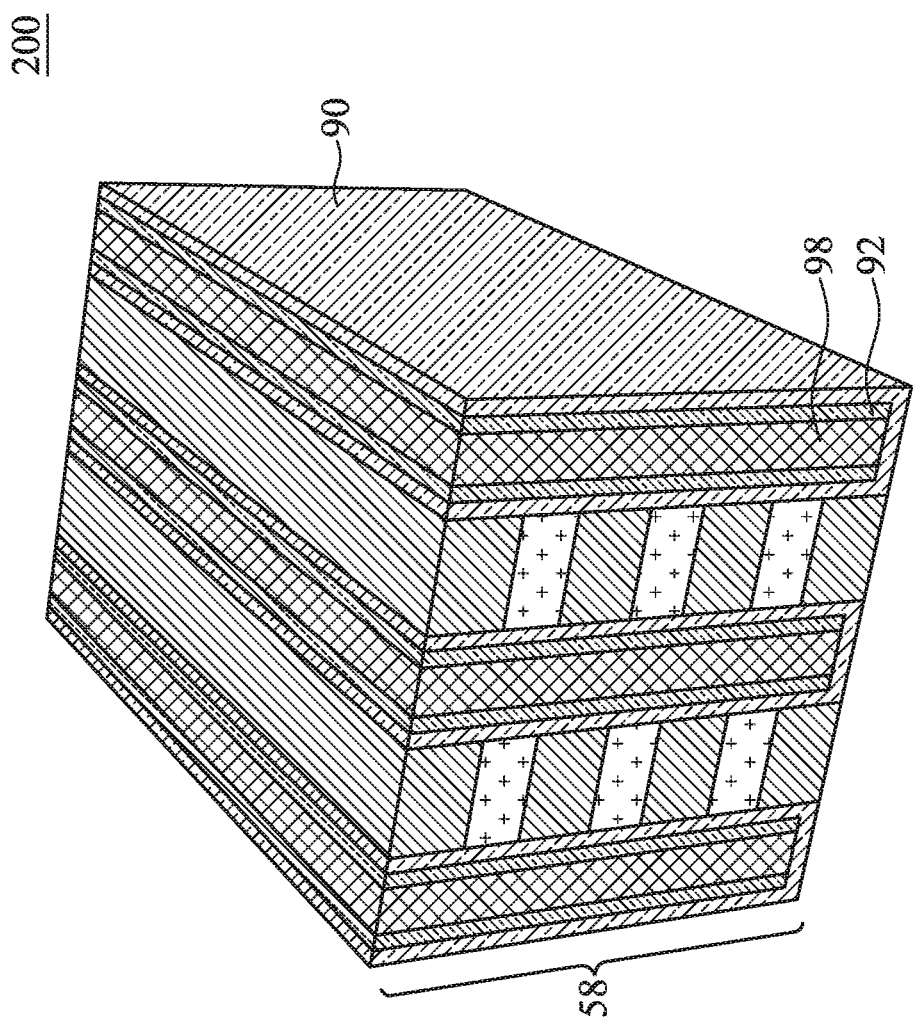
Figure 21B:
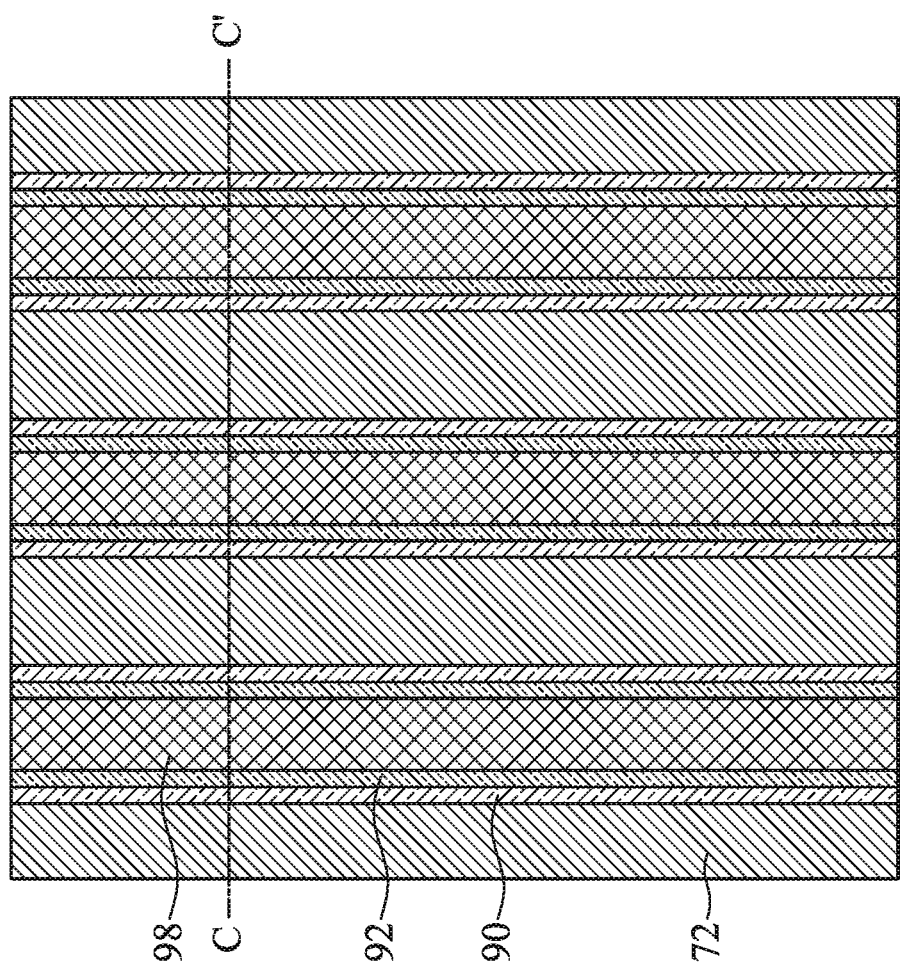
Figure 21C:
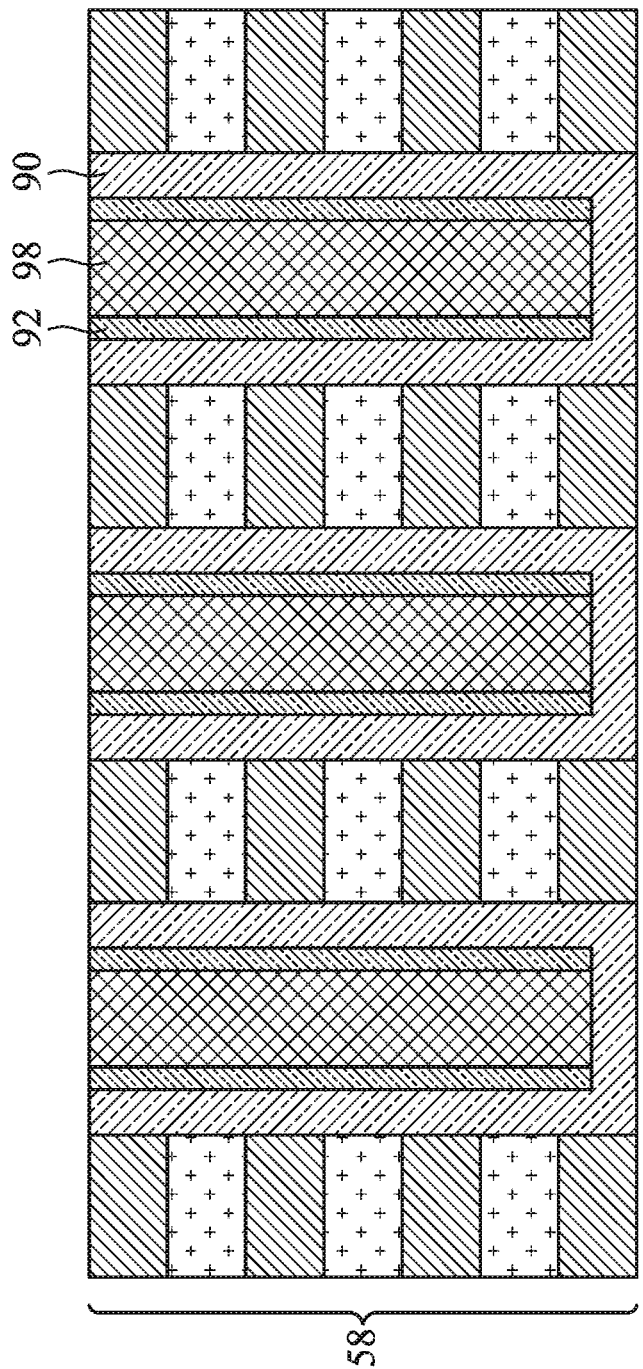

In FIGS. 21A, 21B, and 21C, a removal process is performed to remove excess dielectric material 98 over the multi-layer stack 58, in accordance with some embodiments. FIG. 21A illustrates a perspective view, FIG. 21B illustrates a plan view, and FIG. 21C illustrates a cross-sectional view through the reference cross-section C-C' shown in FIG. 1A and FIG. 21B. In some embodiments, a planarization process such as a chemical mechanical polish (CMP), a grinding process, an etch-back process, combinations thereof, or the like may be utilized to expose the multi-layer stack 58 such that top surfaces of the multi-layer stack 58 are level after the planarization process is complete.

Figure 22A:
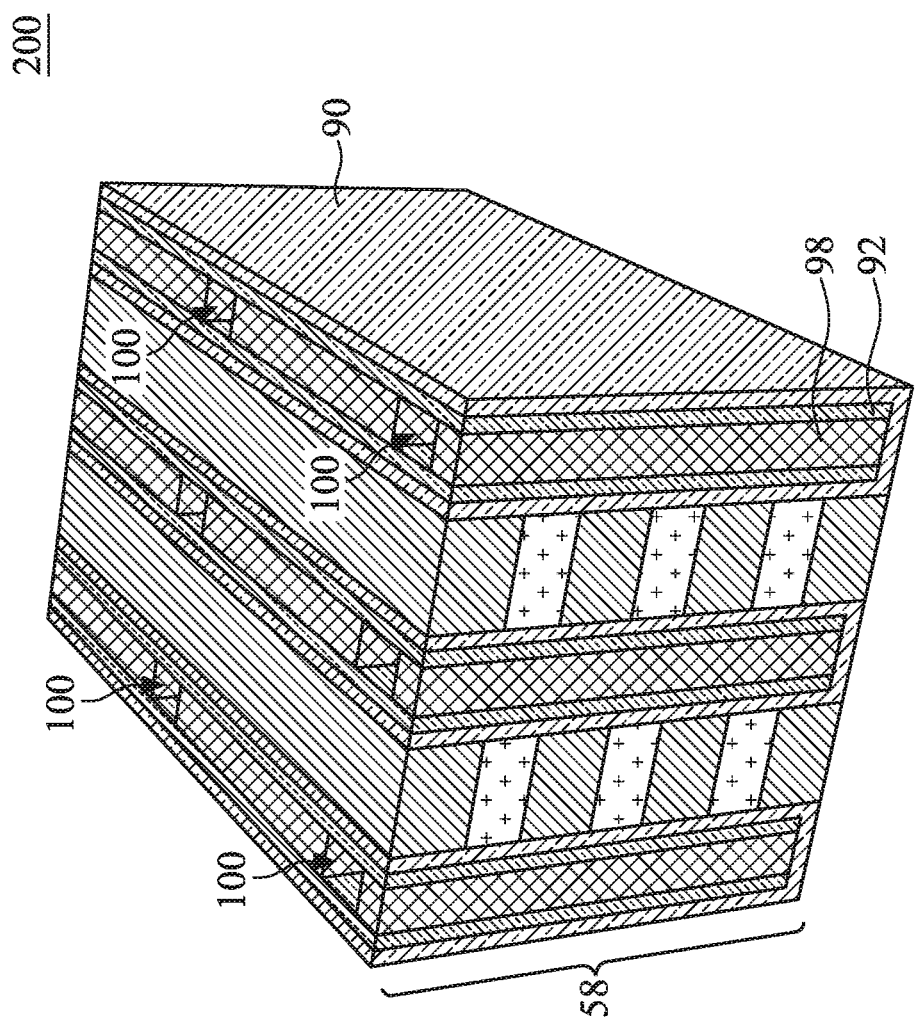
Figure 22B:
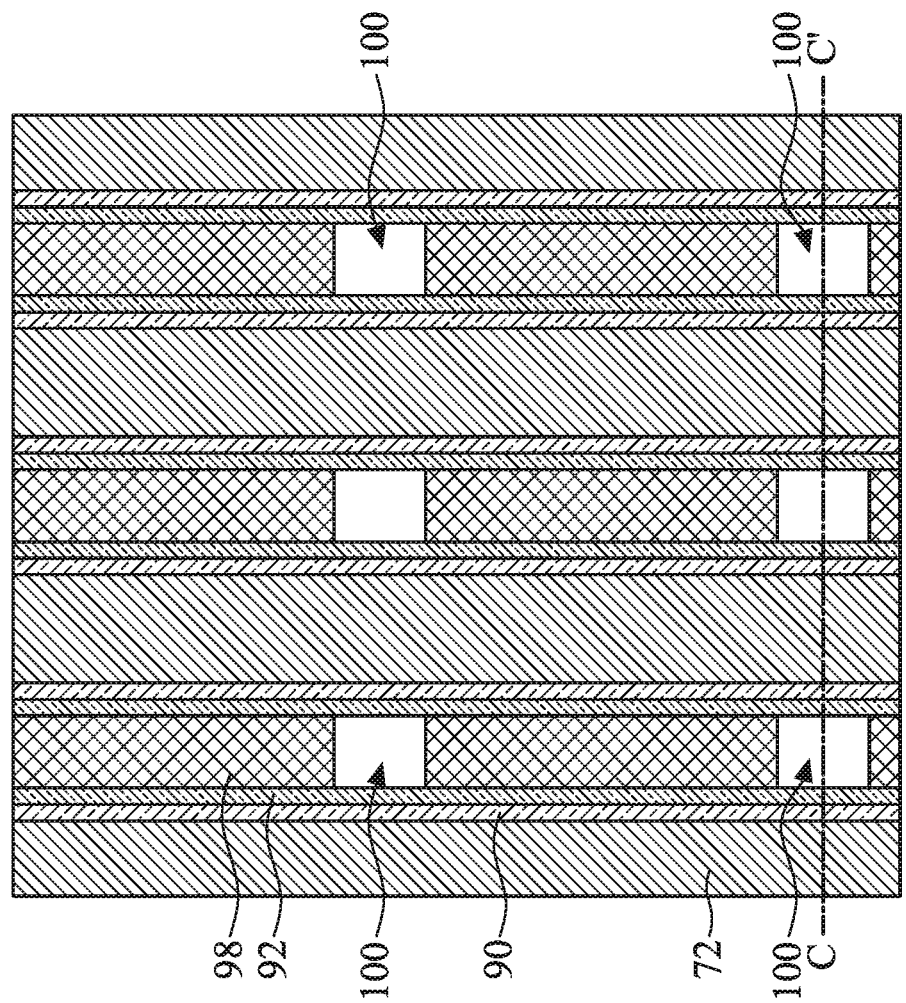
Figure 22C:
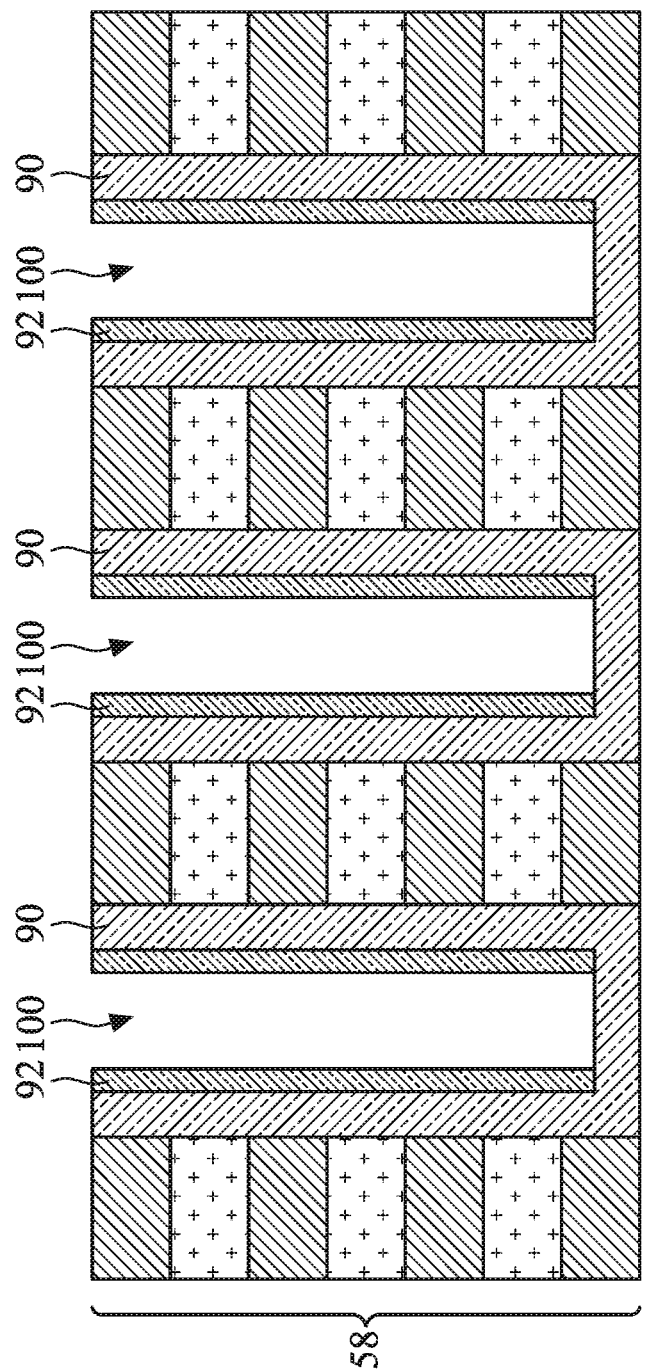

In FIGS. 22A, 22B, and 22C, trenches 100 are patterned through the dielectric material 98, in accordance with some embodiments. FIG. 22A is illustrated in a perspective view, FIG. 22B is illustrated in a plan view, and FIG. 22C is illustrated in a cross-sectional view along reference cross-section C-C' of FIG. 22B. The trenches 100 may be disposed between opposing sidewalls of the multi-layer stack 58, and define regions in which the resistive memory layers 107 (see FIGS. 23A-C) and conductive lines 106 (see FIGS. 24A-C) are subsequently formed. Patterning the trenches 100 may be performed using a combination of photolithography and etching, in some embodiments. For example, a photoresist may be deposited over the multi-layer stack 58. The photoresist can be formed by using a suitable technique such as a spin-on technique, for example. The photoresist may then be patterned to define openings that expose regions of the dielectric material 98. The photoresist can be patterned using acceptable photolithography techniques.

Portions of the dielectric material 98 exposed by the openings may then be removed by etching, forming trenches 100 in the dielectric material 98. The trenches 100 in the dielectric material 98 may expose sidewall surfaces of the OS layer 92, in some embodiments. The etching may be any acceptable etch process, such as by wet or dry etching, a reactive ion etch (RIE), neutral beam etch (NBE), the like, or a combination thereof. The etching may be anisotropic. In some embodiments, the trenches 100 may have a depth that is in the range of about 1000 nm to about 2000 nm, though other depths are possible. After the trenches 100 are patterned, the photoresist may be removed by ashing, for example.

Figure 23A:
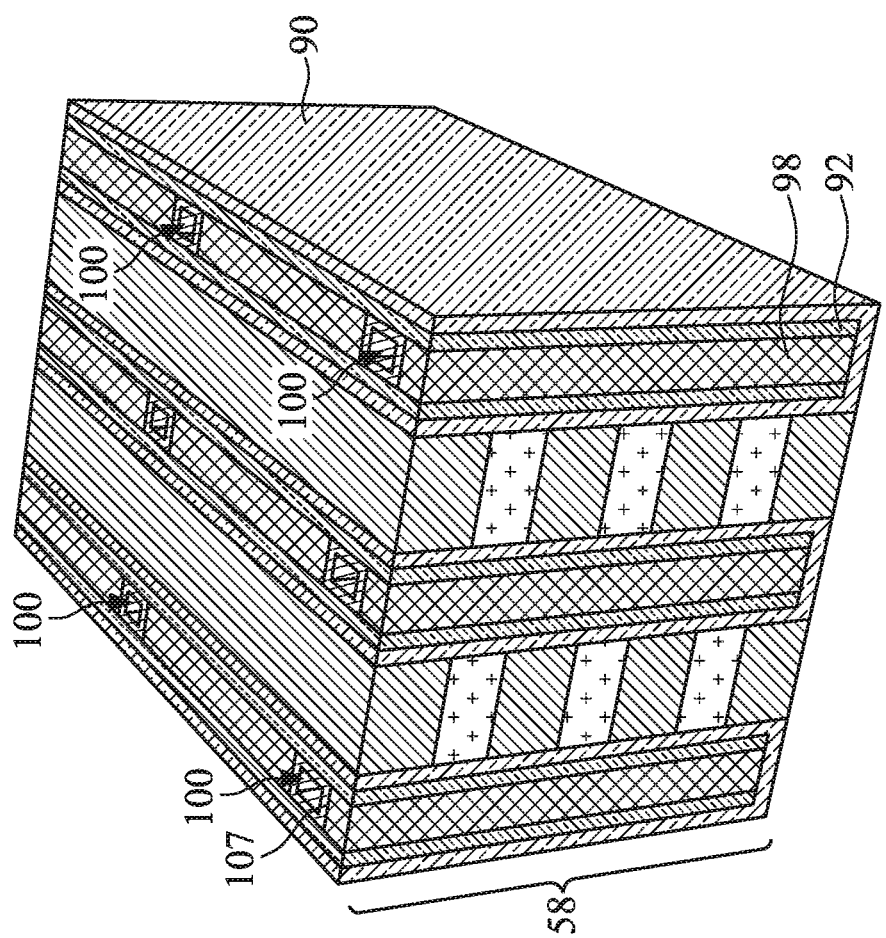
Figure 23B:
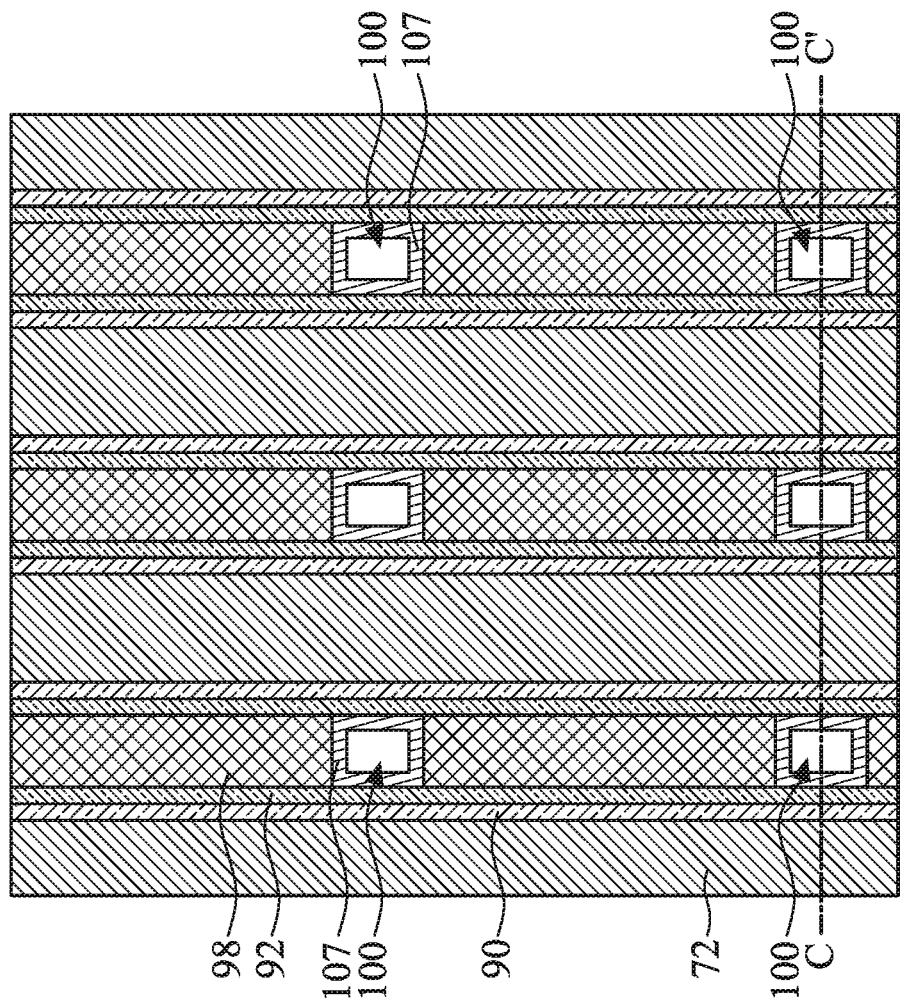
Figure 23C:
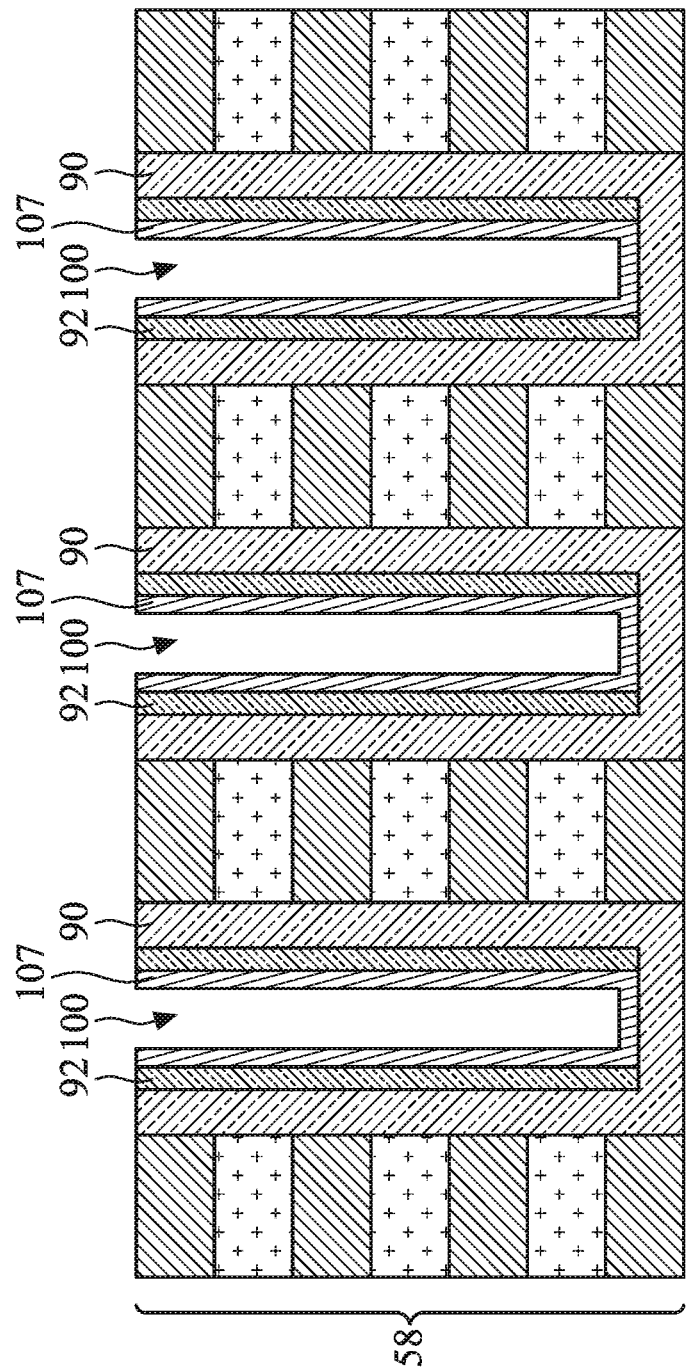

In FIGS. 23A, 23B, and 23C, the resistive memory layer 107 is conformally deposited in the trenches 100, in accordance with some embodiments. The resistive memory layer 107 may comprise a material that is capable of storing a bit, such as material capable of switching between two different resistance states by applying an appropriate voltage differential across the resistive memory layer 107 or flowing an appropriate current through the resistive memory layer 107. For example, the resistive memory layer 107 may comprise one or more layers of metal oxide, a phase-change material, or other suitable materials. The resistive memory layer 107 may be deposited by CVD, PVD, ALD, PECVD, or the like, and may extend along sidewalls and bottom surfaces of the trenches 100. As such, the resistive memory layer 107 may be deposited on sidewall surfaces of the OS layer 92 exposed by the trenches 100. In other embodiments, the resistive memory layer 107 is not deposited on bottom surfaces of the trenches 100. As shown in FIGS. 23A-C, the resistive memory layer 107 may be deposited to a thickness that does not completely fill the trenches 100. In some embodiments, the resistive memory layer 107 may be deposited to a thickness that is in a range of about 10 nm to about 20 nm, though other thicknesses are possible. In some embodiments, a planarization process is performed to remove excess material of the resistive memory layer 107.

Figure 24A:
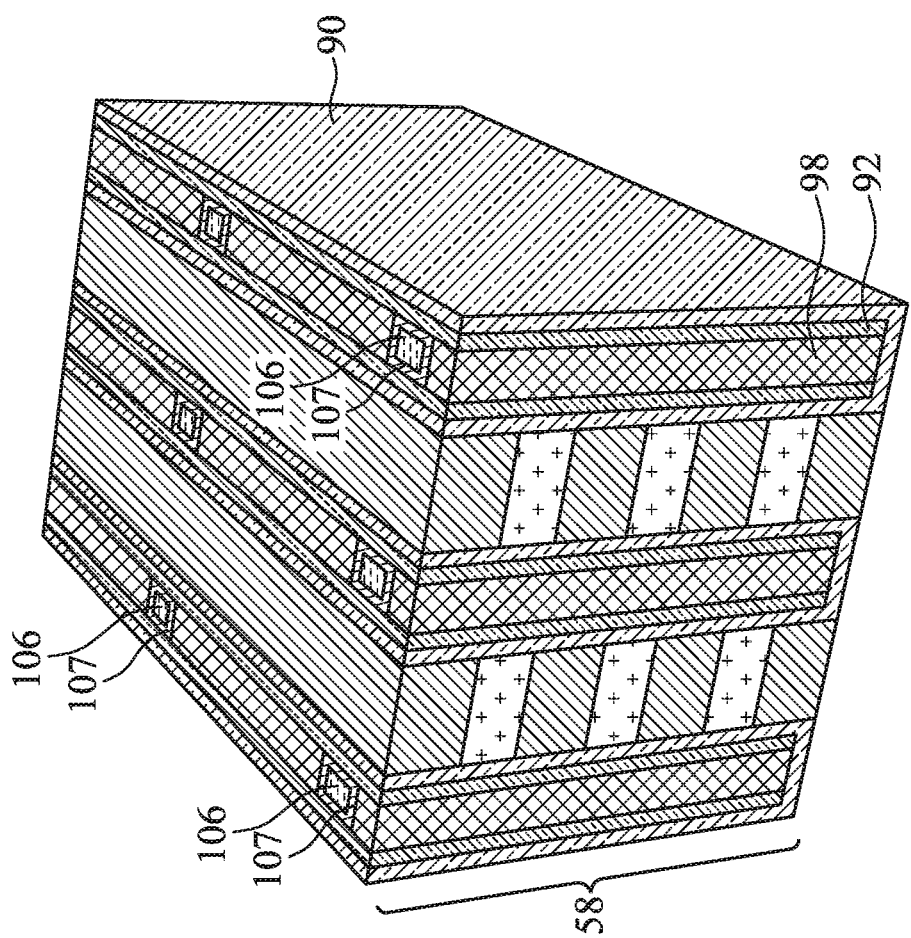
Figure 24B:
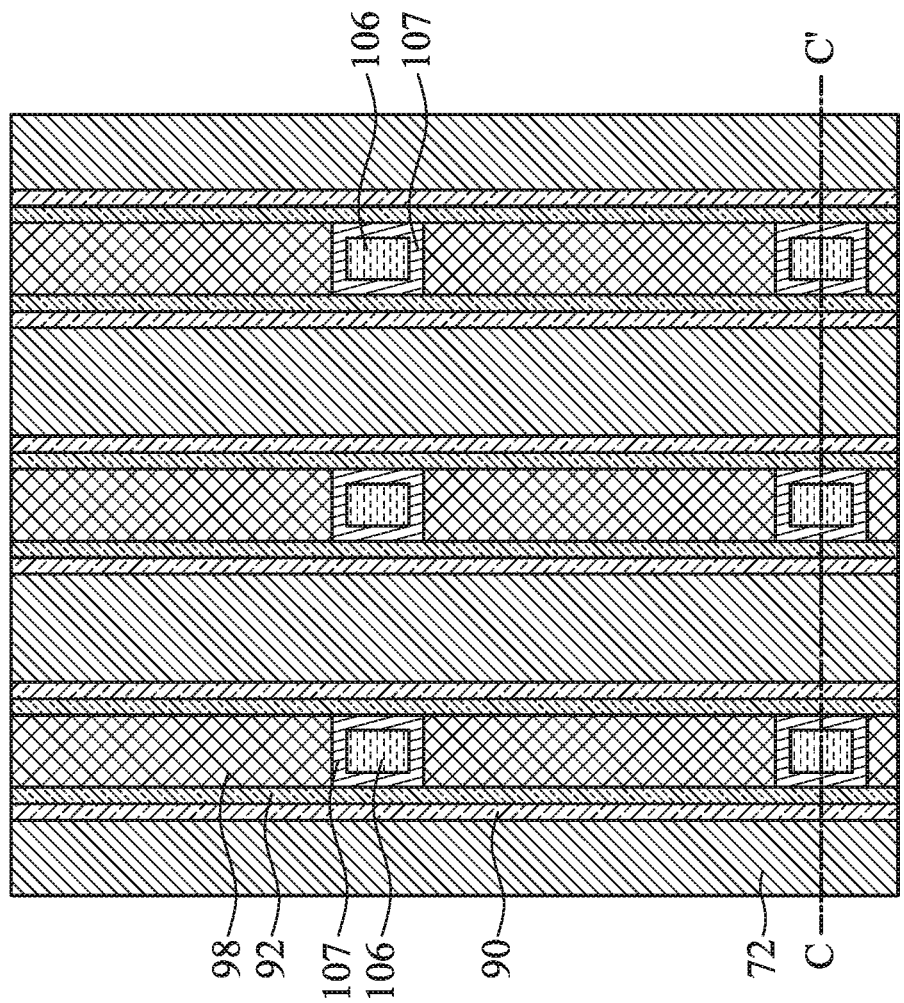
Figure 24C:
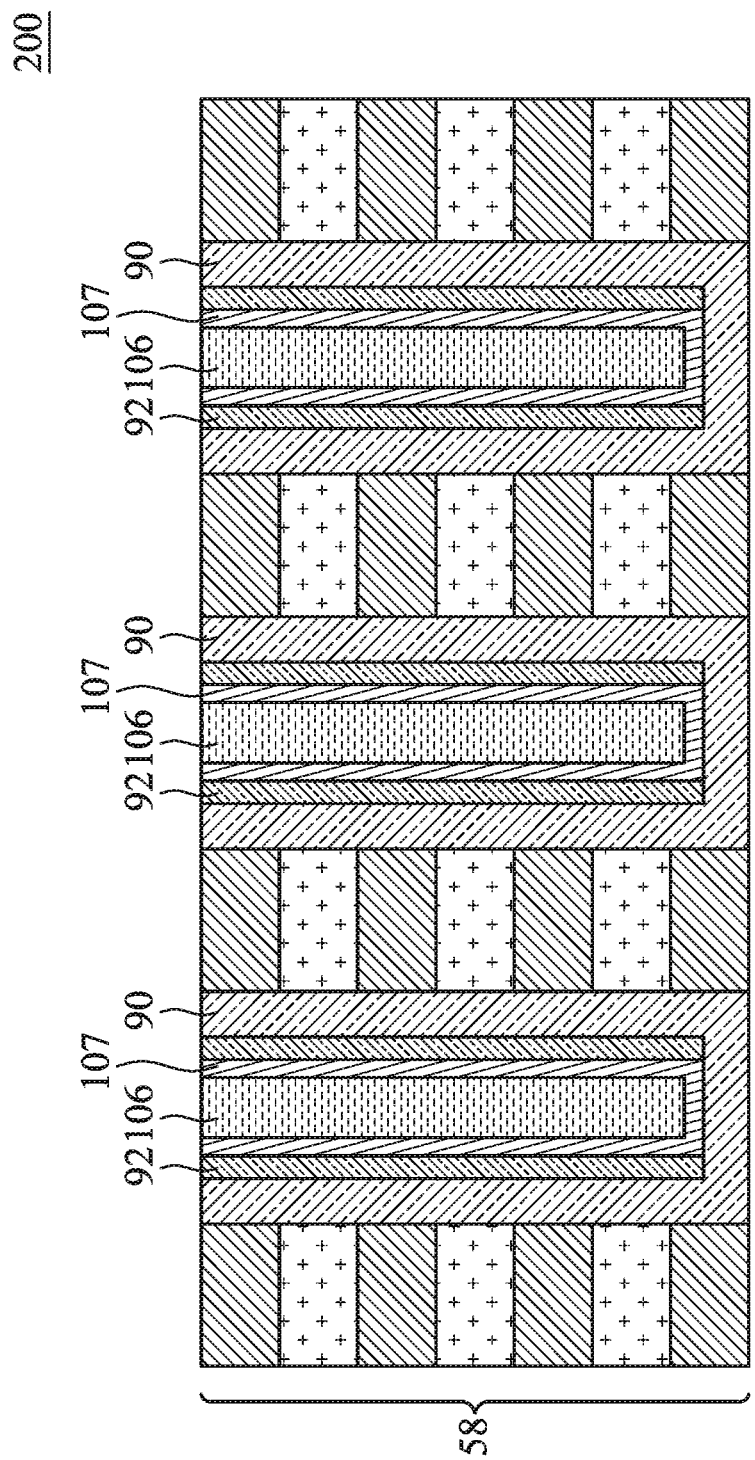
Figure 25A:
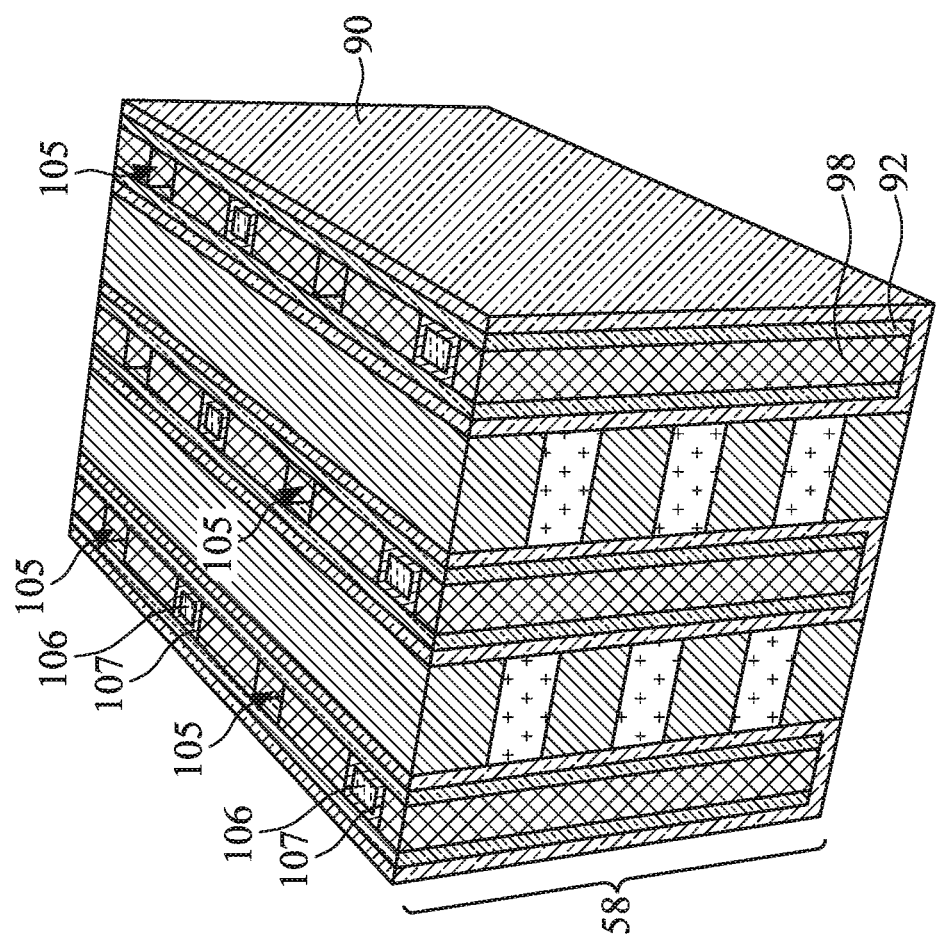
Figure 25B:
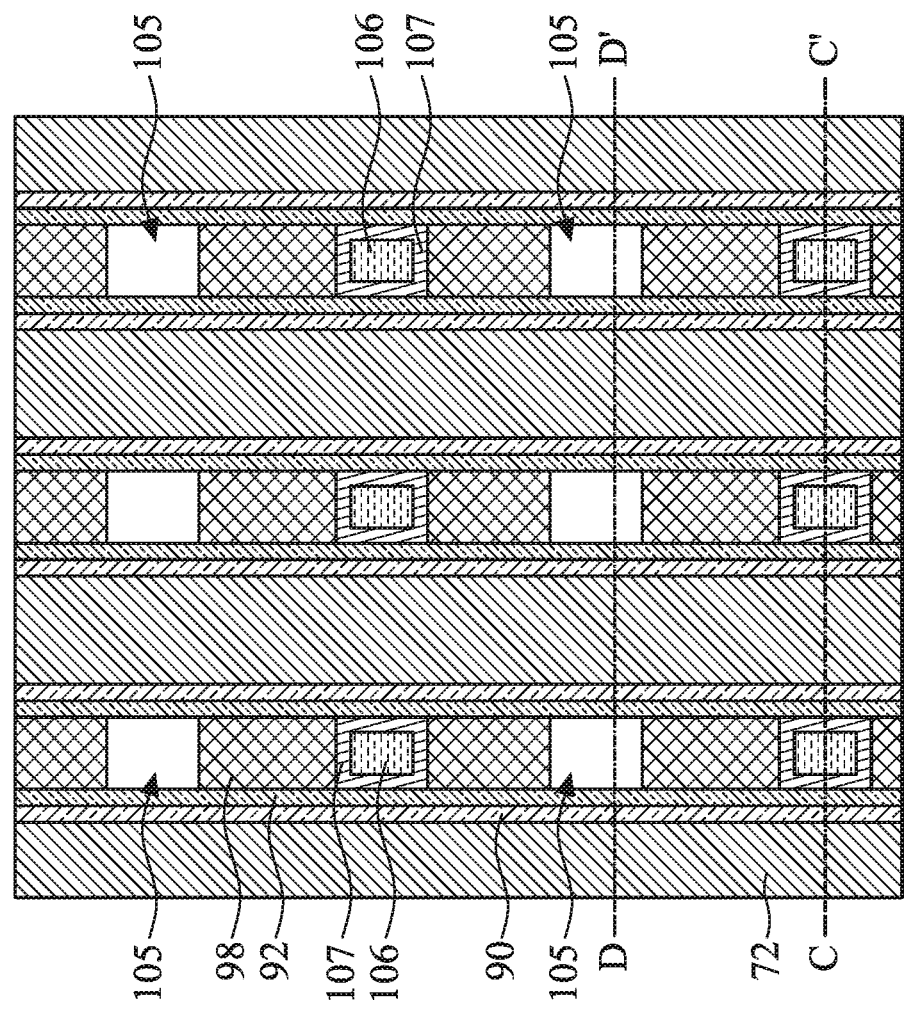
Figure 25C:
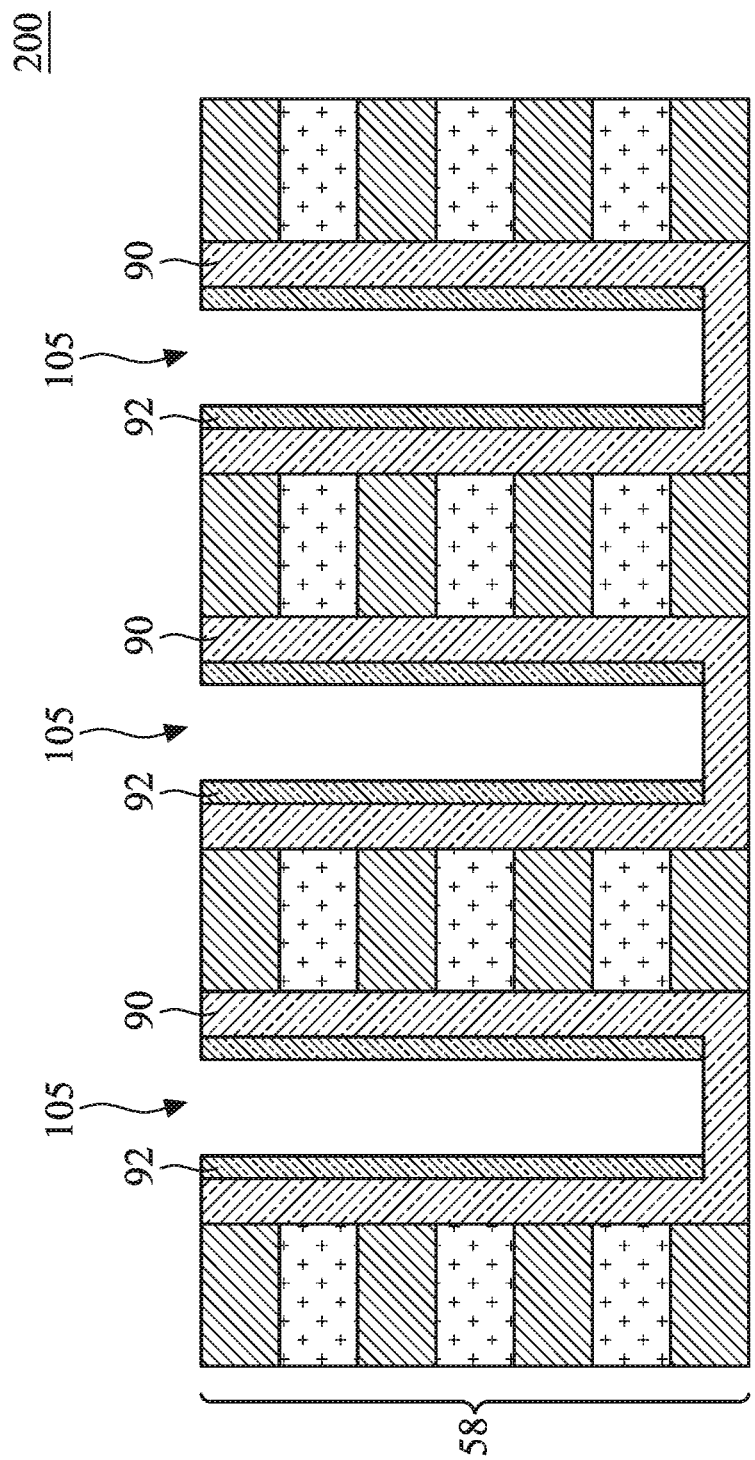
Figure 26A:
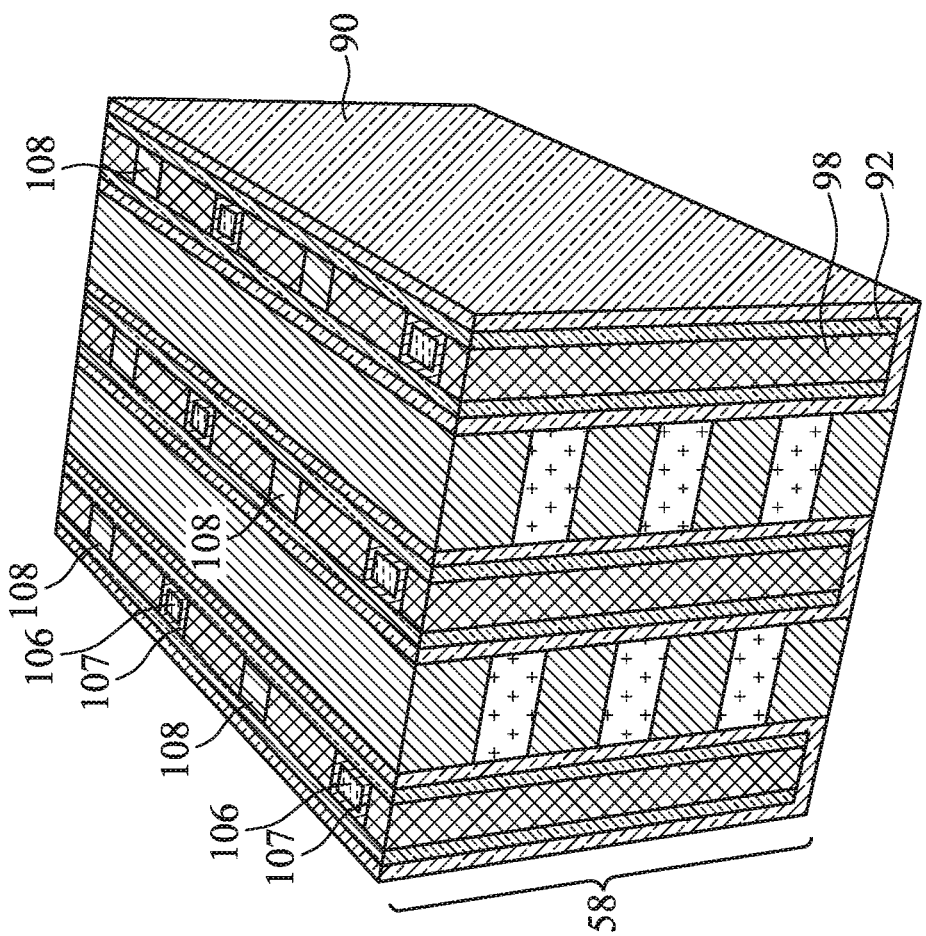
Figure 26B:
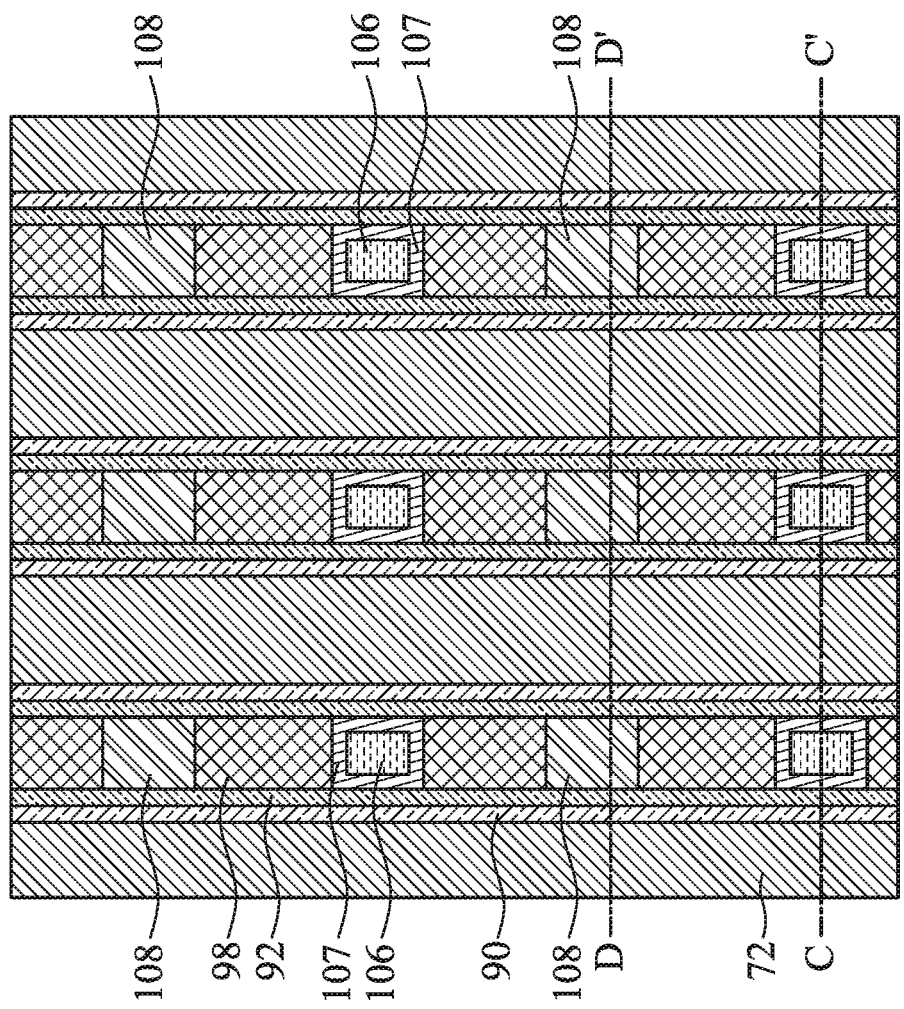
Figure 26C:
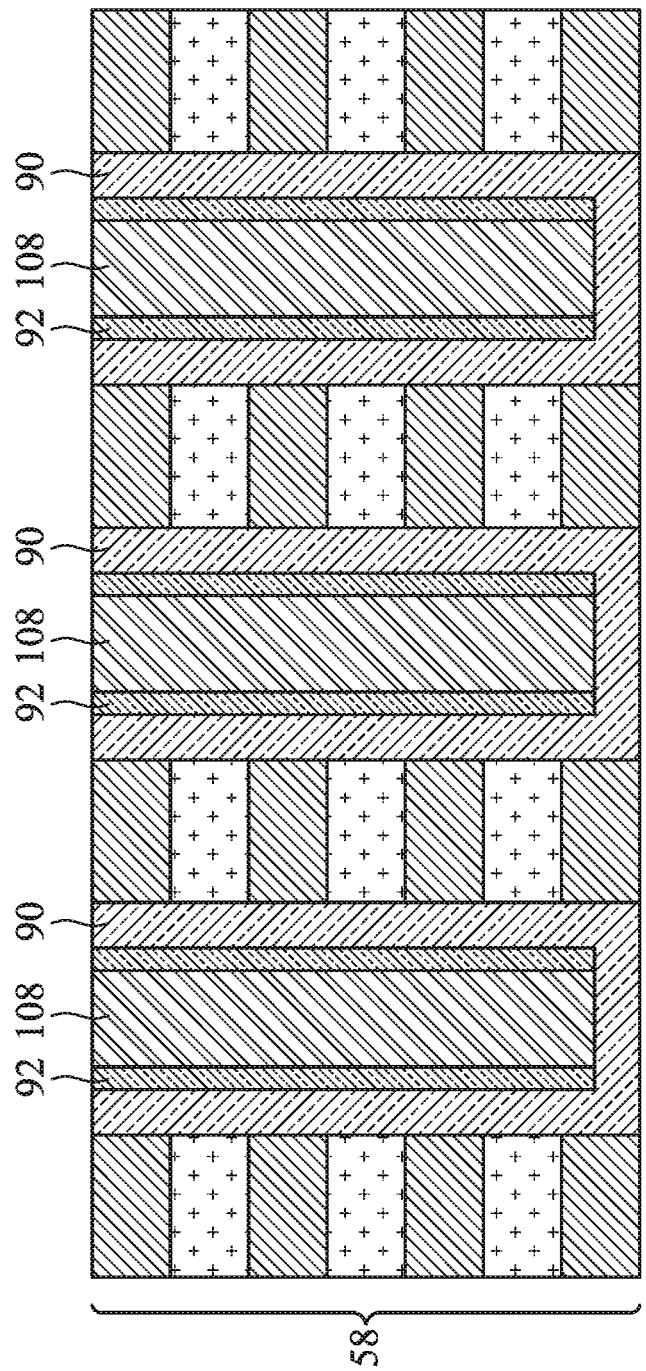

FIGS. 24A through 26C illustrate intermediate steps of manufacturing conductive lines 106 (e.g., bit lines) and conductive lines 108 (e.g., source lines) in the hybrid memory array 200, in accordance with some embodiments. The conductive lines 106 may correspond to bit lines in the memory array, and the conductive lines 108 may correspond to source lines in the hybrid memory array 200. The conductive lines 106 and 108 may extend along a direction perpendicular to the conductive lines 72 such that individual hybrid memory cells 202 of the hybrid memory array 200 may be selected for read and write operations. The read and write operations may be applied to either the resistive-type memory (e.g., the resistive memory layer 107) or the transistor-type memory (e.g., transistor 204) of the hybrid memory cells 202, depending on the applied voltages (described in greater detail below). FIGS. 24A, 25A, and 26A illustrate a perspective view. FIGS. 24B, 25B, and 26B illustrate a plan view. FIG. 24C illustrates a cross-sectional view along the reference cross-section C-C' shown in FIGS. 1A and 24A. FIGS. 25C and 26C illustrate cross-sectional views along the reference cross-section D-D' shown in FIGS. 1A, 25B, and 26B.

In FIGS. 24A, 24B, and 24C, the trenches 100 are filled with a conductive material, forming conductive lines 106, in accordance with some embodiments. The conductive material covers the resistive memory layer 107, and the conductive material may be separated from the OS layer 92 and/or the dielectric material 98 by the resistive memory layer 107. The conductive material may comprise one or more materials such as copper, titanium, titanium nitride, tantalum, tantalum nitride, tungsten, ruthenium, aluminum, molybdenum, combinations thereof, or the like, which may be each formed using, for example, CVD, ALD, PVD, PECVD, or the like. After the conductive material is deposited, a planarization process may be performed to remove excess portions of the conductive material. In some embodiments, the excess material of the resistive memory layer 107 may be removed by the same planarization process as the excess conductive material. In the resulting structure, top surfaces of the multi-layer stack 58, the memory film 90, the OS layer 92, the dielectric material 98, resistive memory layer 107, and the conductive lines 106 may be substantially level (e.g., coplanar within process variations).

In FIGS. 25A, 25B, and 25C, trenches 105 are patterned for the conductive lines 108. The trenches 105 may be patterned using techniques similar to those used to pattern the trenches 100 (see FIGS. 22A-C). For example, the trenches 105 may be formed by patterning the dielectric material 98 using a combination of photolithography and etching. The trenches 105 in the dielectric material 98 may expose sidewall surfaces of the OS layer 92, in some embodiments.

In FIGS. 26A, 26B, and 26C, the trenches 105 are filled with a conductive material, forming conductive lines 108, in accordance with some embodiments. The conductive material may be similar to the conductive material of the conductive lines 106, and may be formed in a similar manner. After the conductive material is deposited, a planarization process may be performed to remove excess portions of the conductive material. In the resulting structure, top surfaces of the multi-layer stack 58, the memory film 90, the OS layer 92, the dielectric material 98, resistive memory layer 107, the conductive lines 106, and the conductive lines 108 may be substantially level (e.g., coplanar within process variations).

FIGS. 22A through 26C illustrate an embodiment in which the resistive memory layer 107 and conductive lines 106 are formed before the conductive lines 108. However, in other embodiments, these features may be formed in a different order or using different techniques. For example, in other embodiments, a single photolithography and etching sequence may be used to form both the trenches 100 (see FIGS. 22A-C) and the trenches 105 (see FIGS. 25A-C). In other embodiments, the conductive lines 108 may be formed before the resistive memory layer 107 and/or the conductive lines 106. In other embodiments, the conductive material of the conductive lines 106 and the conductive lines 108 may be deposited in a single deposition step. These and other variations are considered within the scope of the present disclosure.

Figure 27A:
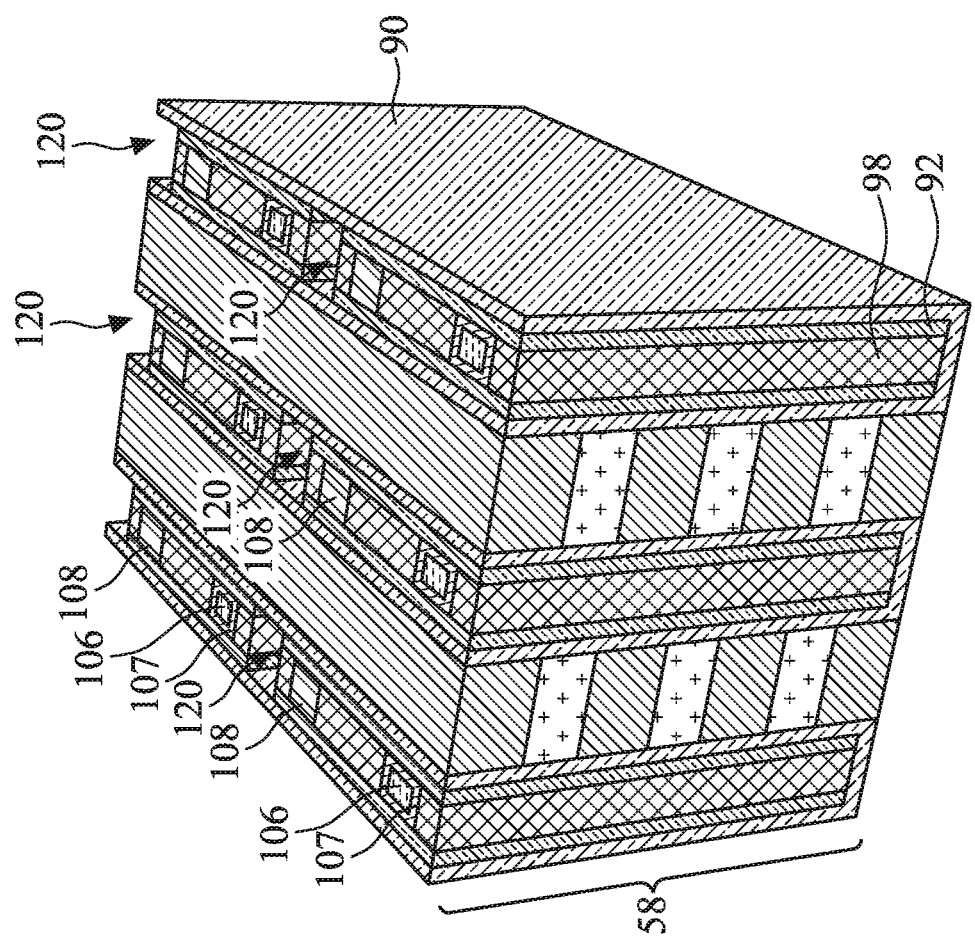
Figure 27B:
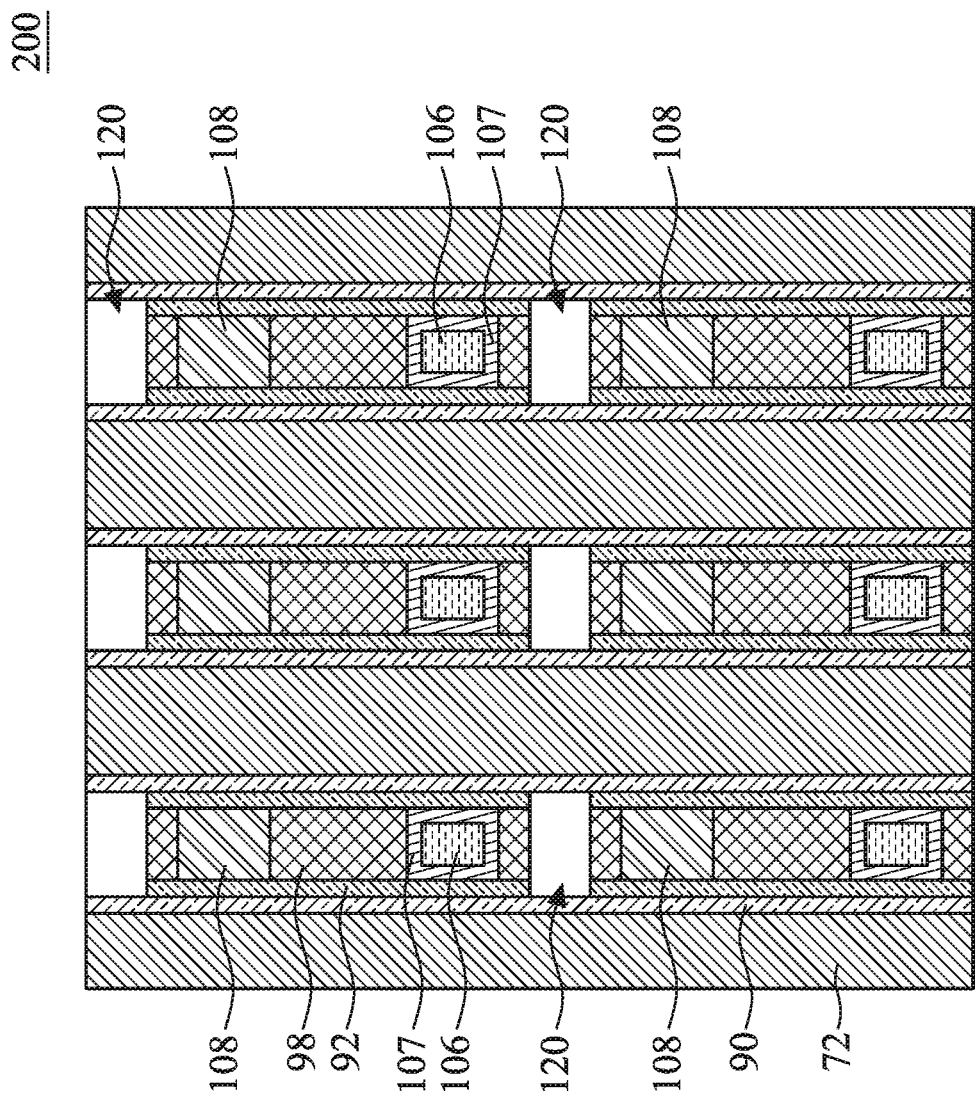
Figure 28A:
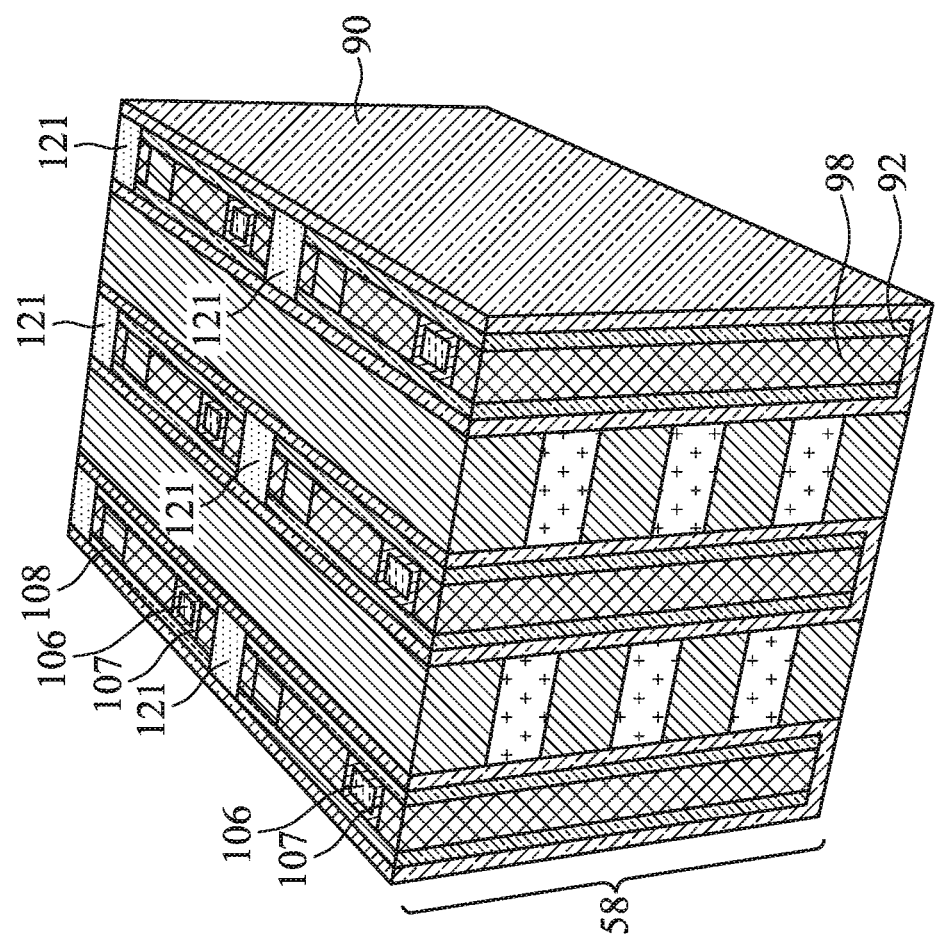
Figure 28B:
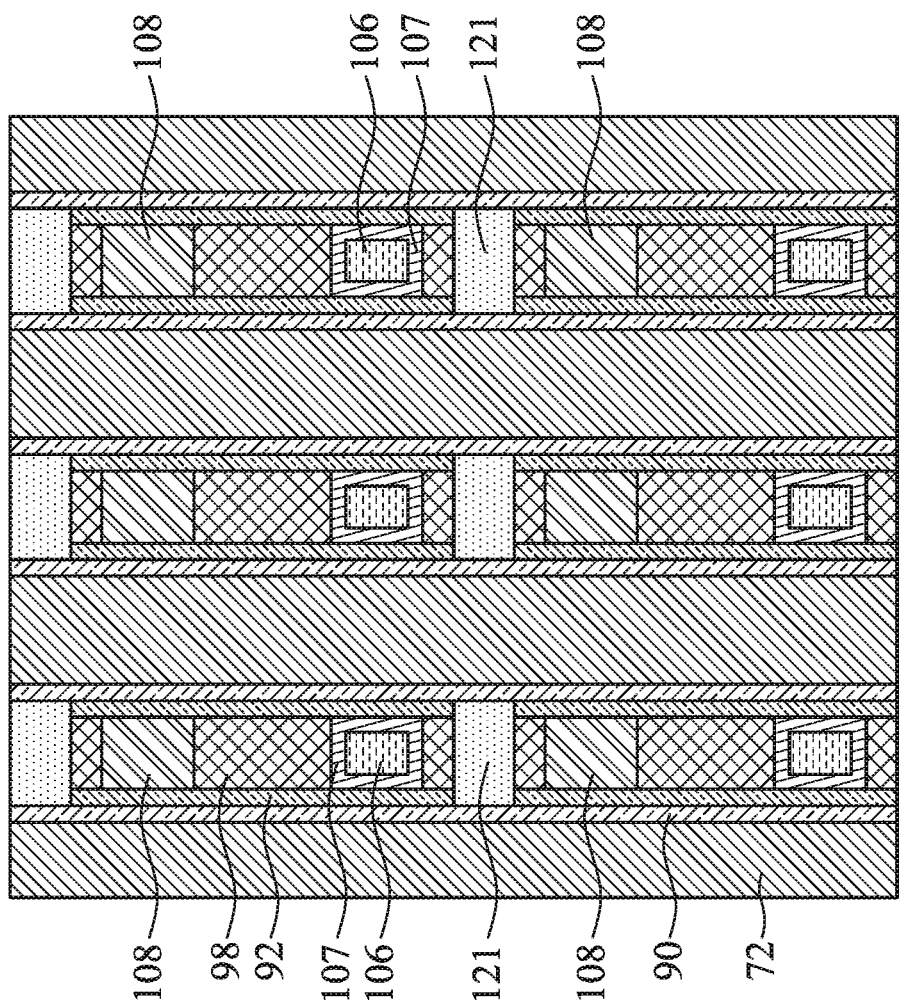
Figure 28C:
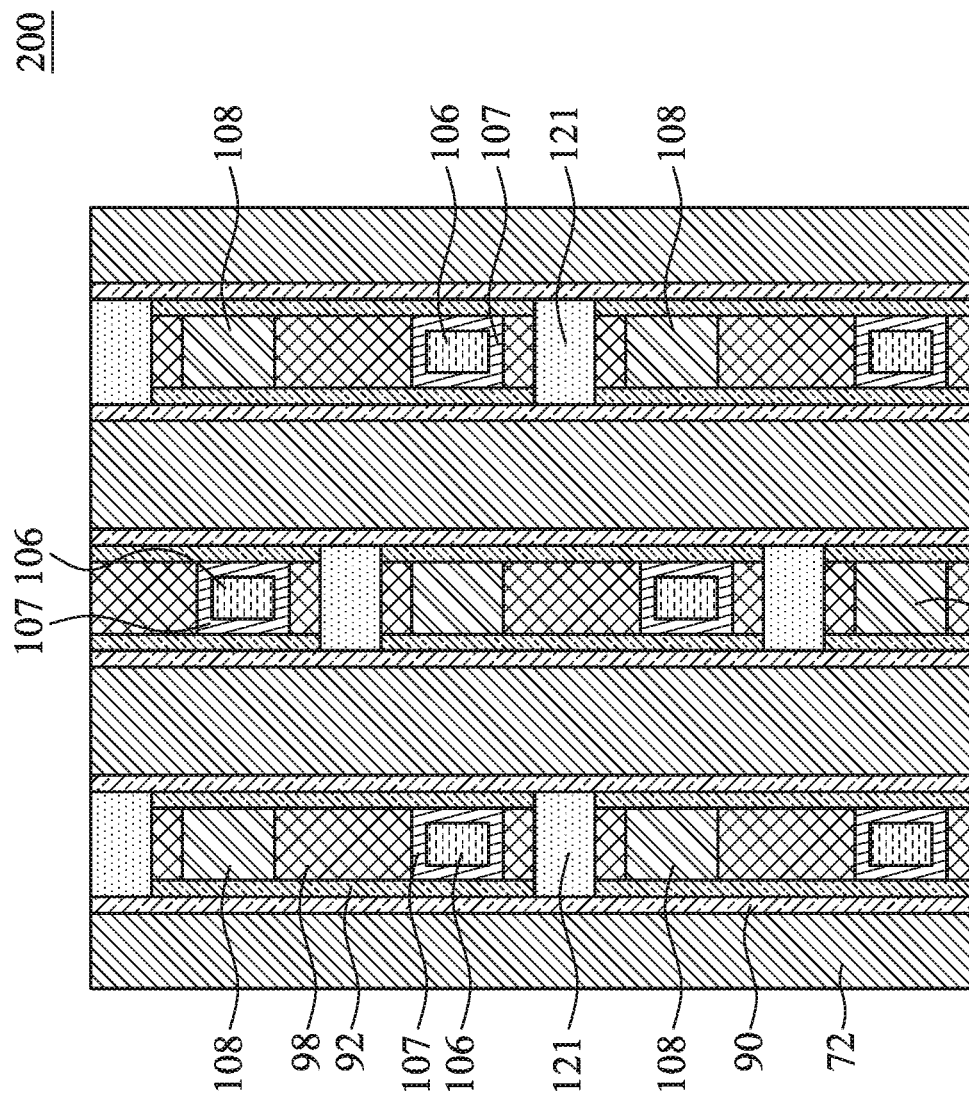

FIGS. 27A through 28C illustrate the formation of dielectric material 121, in accordance with some embodiments. The dielectric material 121 is formed in the hybrid memory array 200 to separate and isolate adjacent hybrid memory cells 202. In other embodiments, the dielectric material 121 may be formed during a different process step, such as before forming the resistive memory layer 107, the conductive lines 106, and/or the conductive lines 108. FIGS. 27A and 28A are illustrated in a perspective view, and FIGS. 27B, 28B, and 28C are illustrated in a plan view. FIG. 28C shows an embodiment similar to that of FIG. 28B, except with a different arrangement of conductive lines 106 and conductive lines 108.

In FIGS. 27A and 27B, trenches 120 are patterned through the dielectric material 98 and the OS layer 92, in accordance with some embodiments. Patterning the trenches 120 may be performed using a combination of photolithography and etching, in some embodiments. For example, a photoresist may be deposited over the multi-layer stack 58. The photoresist can be formed by using a suitable technique such as a spin-on technique, for example. The photoresist may then be patterned to define openings that expose regions of the dielectric material 98 and the OS layer 92. The photoresist can be patterned using acceptable photolithography techniques.

Portions of the dielectric material 98 and the OS layer 92 exposed by the openings may then be removed by etching, forming trenches 100 in the dielectric material 98. The trenches 120 in the dielectric material 98 may expose sidewall surfaces of the memory film 90, in some embodiments. The etching may be any acceptable etch process, such as by wet or dry etching, RIE, NBE, the like, or a combination thereof. The etching may be anisotropic. After the trenches 120 are patterned, the photoresist may be removed by ashing, for example.

In FIGS. 28A and 28B, a dielectric material 121 is deposited in the trenches 120, in accordance with some embodiments. The dielectric material 121 may comprise, for example, silicon oxide, silicon nitride, silicon oxynitride, the like, or combinations thereof. The material of the dielectric material 121 may be the same as or different from the material of the dielectric material 98. The dielectric material 121 may be deposited using a suitable technique, such as CVD, PVD, ALD, PECVD, or the like. The dielectric material 121 may extend along sidewalls and along bottom surfaces of the memory film 90 within the trenches 120. After deposition, a planarization process (e.g., a CMP, etch-back, or the like) may be performed to remove excess portions of the dielectric material 121. In the resulting structure, top surfaces of the multi-layer stack 58, the memory film 90, the OS layer 92, the resistive memory layer 107, the conductive lines 106, the conductive lines 108, and the dielectric material 121 may be substantially level. In this manner, adjacent conductive lines 106 and conductive lines 108 are separated by an isolation region formed from the dielectric material 121 and by the dielectric material 98.

Turning to FIG. 28C, a plan view of an intermediate step in the formation of a hybrid memory array 200 is shown, in accordance with some embodiments. The hybrid memory array 200 shown in FIG. 28C is similar to that shown in FIG. 28B, except that the hybrid memory cells 202 are formed in a "staggered" or "interleaved" arrangement. For example, in FIG. 28B, the conductive lines 106 and conductive lines 108 that are in a same row of the hybrid memory array 200 are aligned, but in FIG. 28C, the conductive lines 106 and conductive lines 108 are offset. This is an example arrangement, and other configurations or arrangements are possible.

Figure 29A:
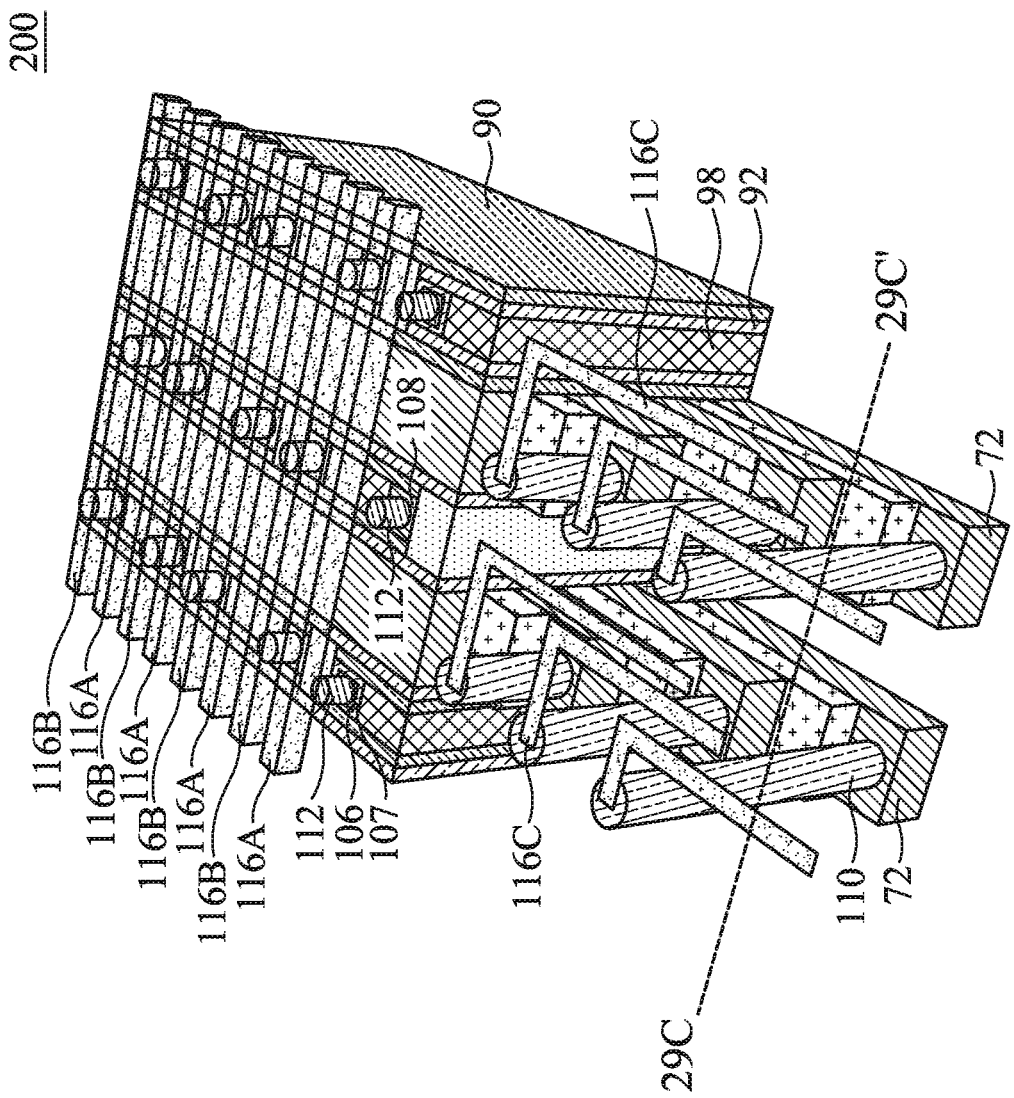
Figure 29B:
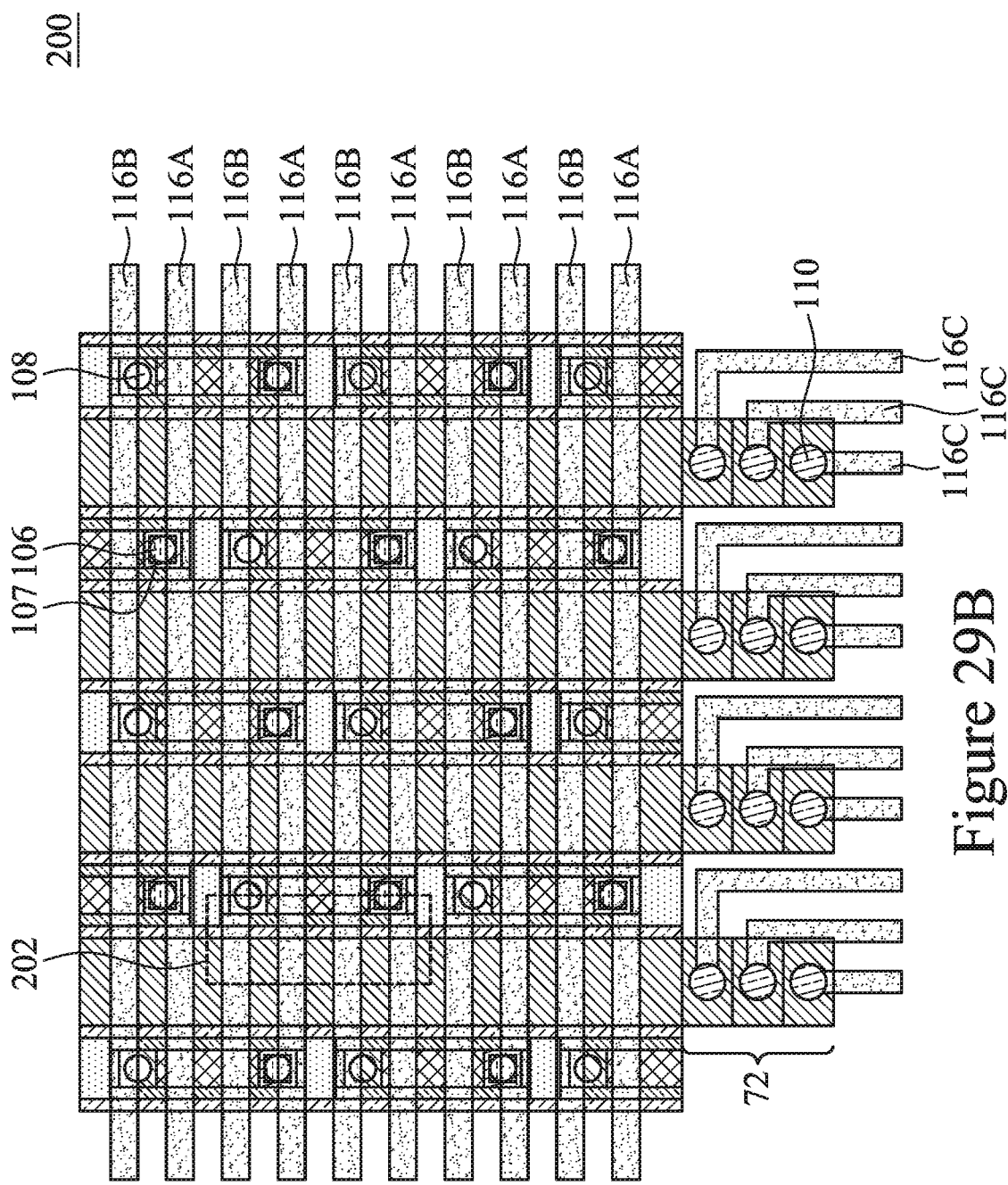
Figure 29C:
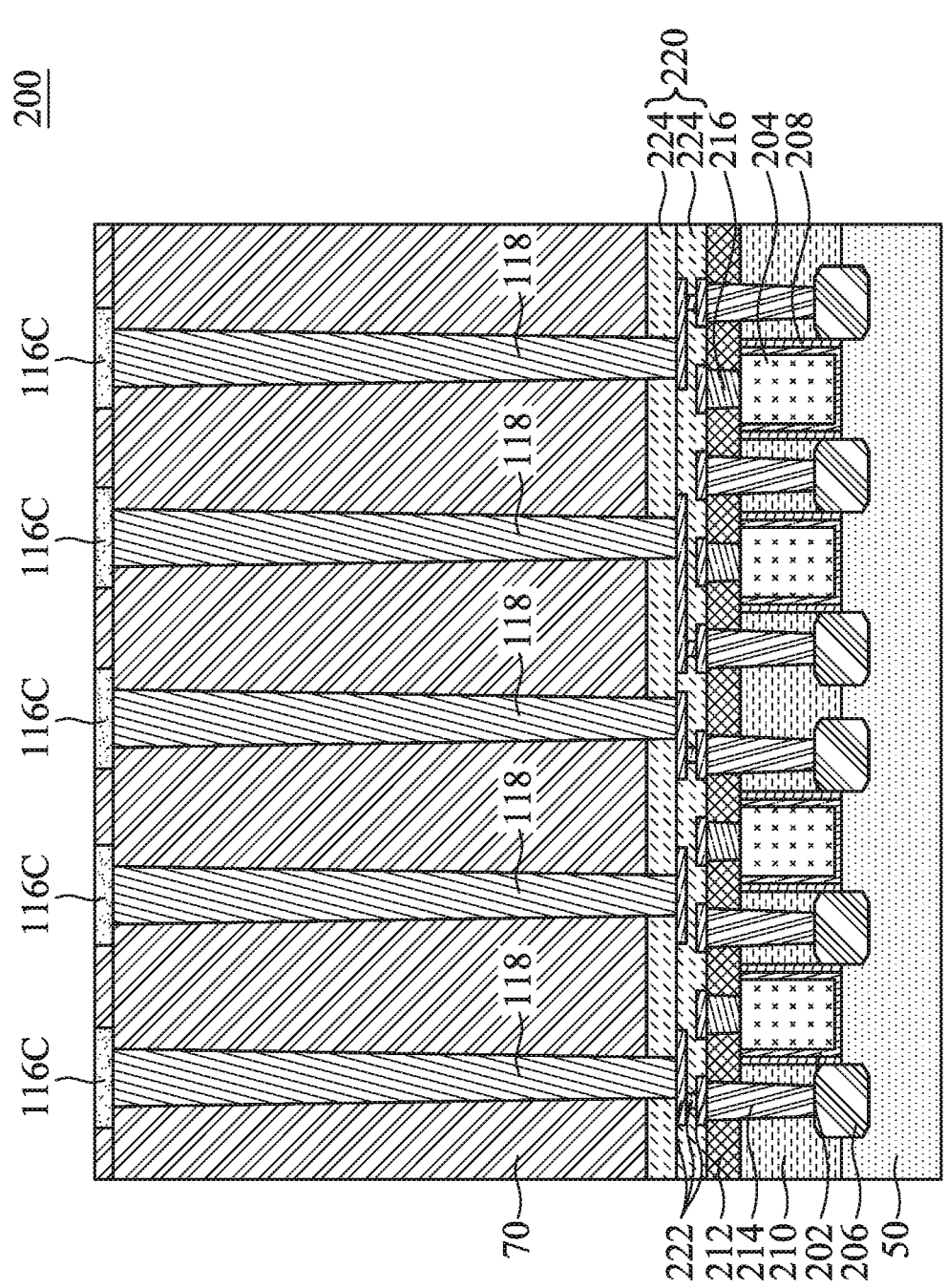
Figure 29D:
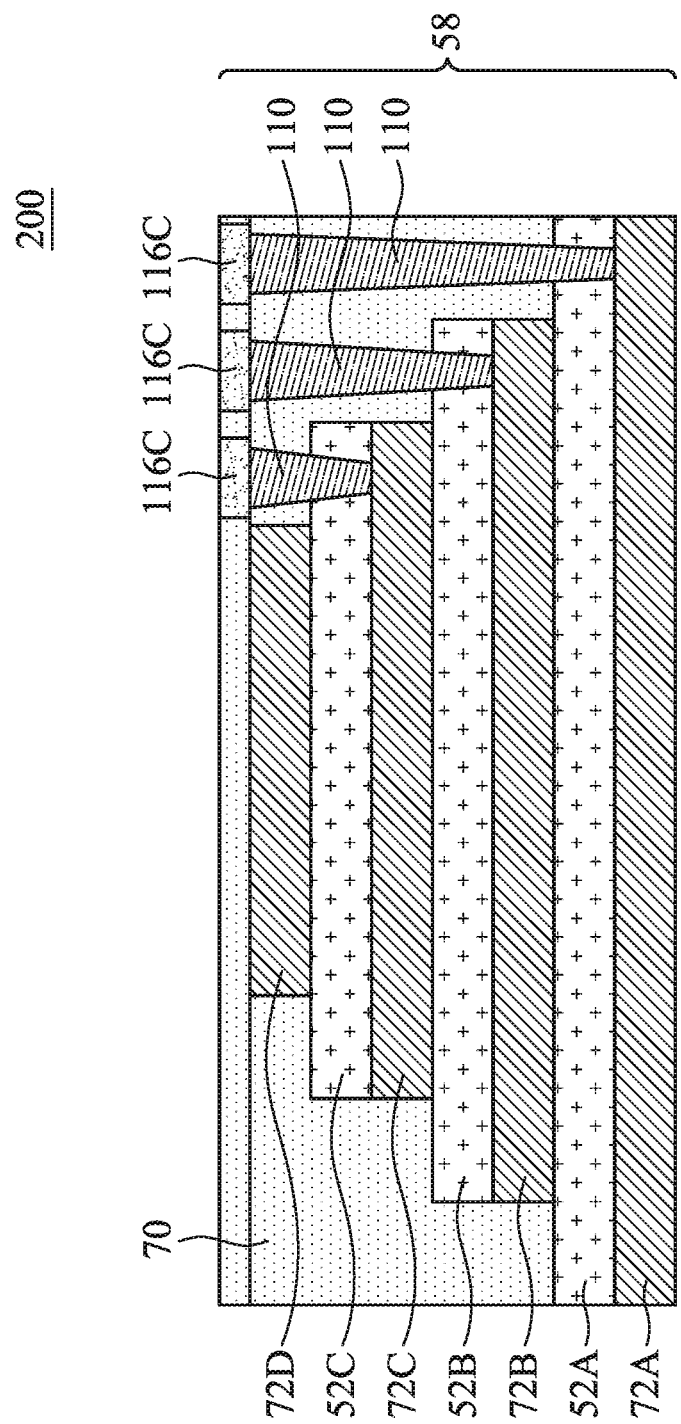

In FIGS. 29A, 29B, 29C, and 29D, contacts 110 are made to the conductive lines 72, the conductive lines 106, and the conductive lines 108, in accordance with some embodiments. The arrangement of hybrid memory cells 202 shown in FIGS. 29A-D is similar to the "staggered" arrangement shown in FIG. 28C. FIG. 29A illustrates a perspective view of the hybrid memory array 200; FIG. 29B illustrates a top-down view of the hybrid memory array 200; FIG. 29C illustrates a cross-sectional view of the device and underlying substrate along the line 29C-29C' of FIG. 29A; and FIG. 29D illustrates a cross-sectional view of the device along line B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of the IMD 70. The remaining liner and conductive material form the contacts 110 in the openings.

As illustrated by the perspective view of FIG. 29A, conductive contacts 112 may also be made to the conductive lines 106 and the conductive lines 108, respectively. The conductive contacts 112 may be electrically connected to conductive lines 116A and 116B. The conductive contacts no may be electrically connected to conductive lines 116C, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 29C. Other conductive vias may be formed through the IMD 70 to electrically connect the conductive lines 116A and 116B to the underlying circuitry of the interconnect structure 220. In alternate embodiments, routing and/or power lines to and from the hybrid memory array 200 may be provided by an interconnect structure formed over the hybrid memory array 200 in addition to or in lieu of the interconnect structure 220. In this manner, a hybrid memory array 200 may be formed comprising hybrid memory cells 202, in which each hybrid memory cell 202 is a hybrid memory cell that includes both a resistive-type memory (e.g., resistive memory layer 107) and a transistor-type memory (204), in accordance with some embodiments.

Figure 30A:
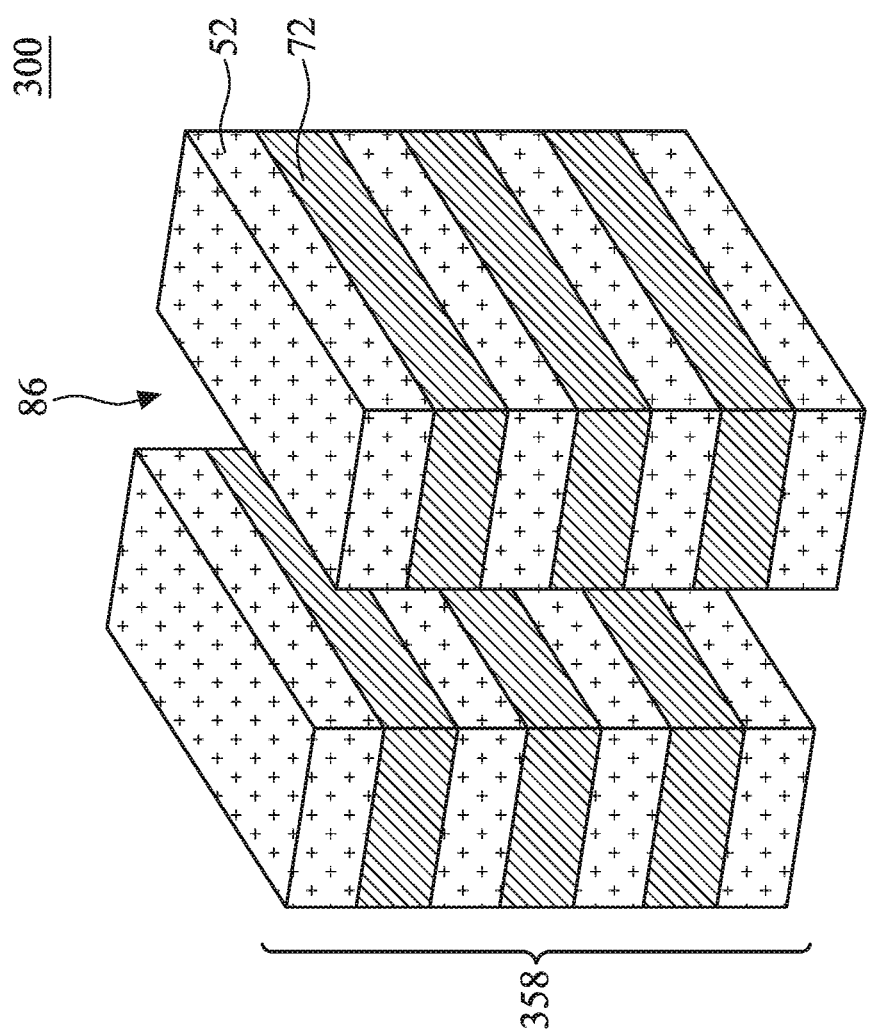
FIGS. 30A, 30B, 31A, 31B, 32, 33, 34, 35, 36A, 36B, 36C, and 36D illustrate varying views of intermediate steps in the manufacture of a hybrid memory array, in accordance with some embodiments.
Figure 34:
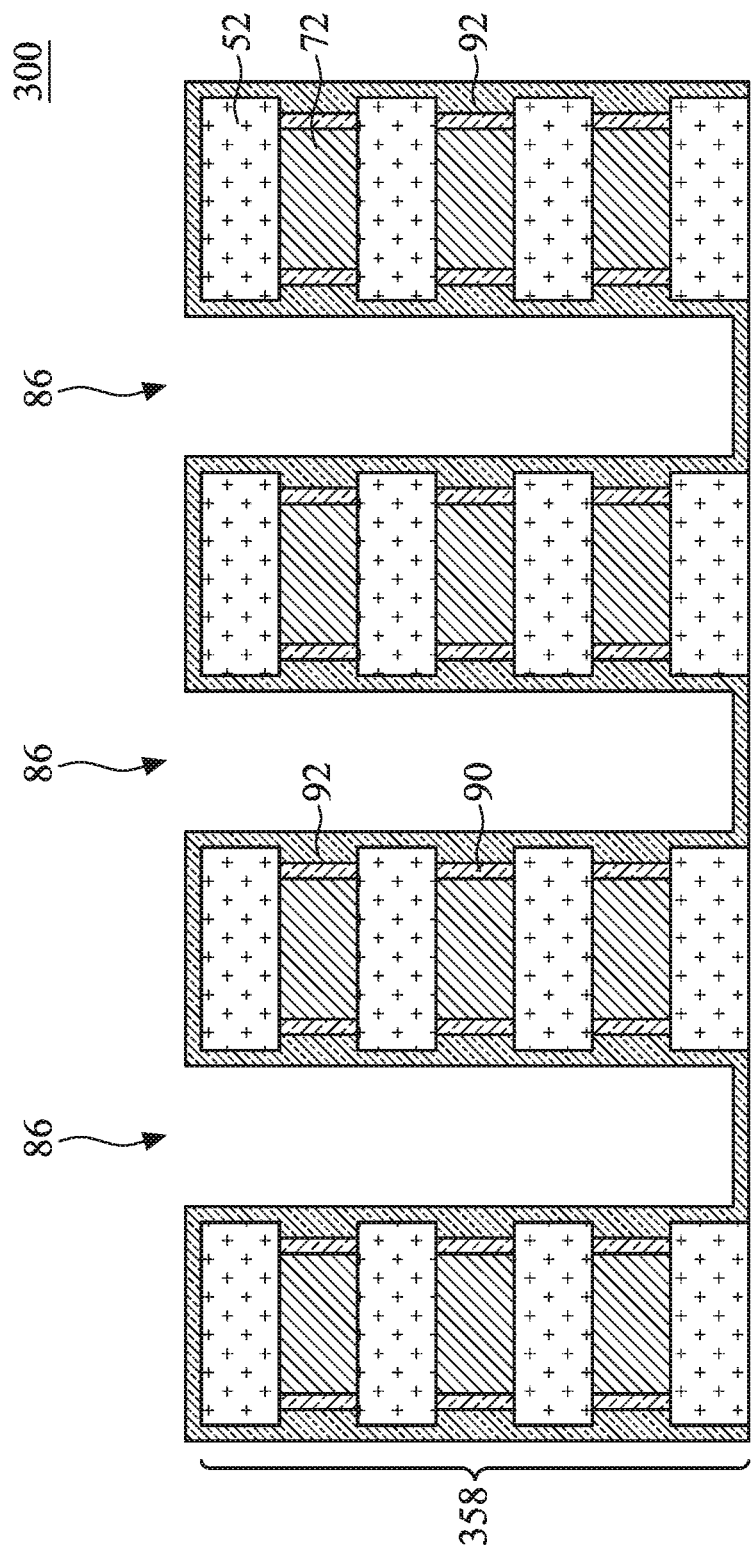
Figure 35:
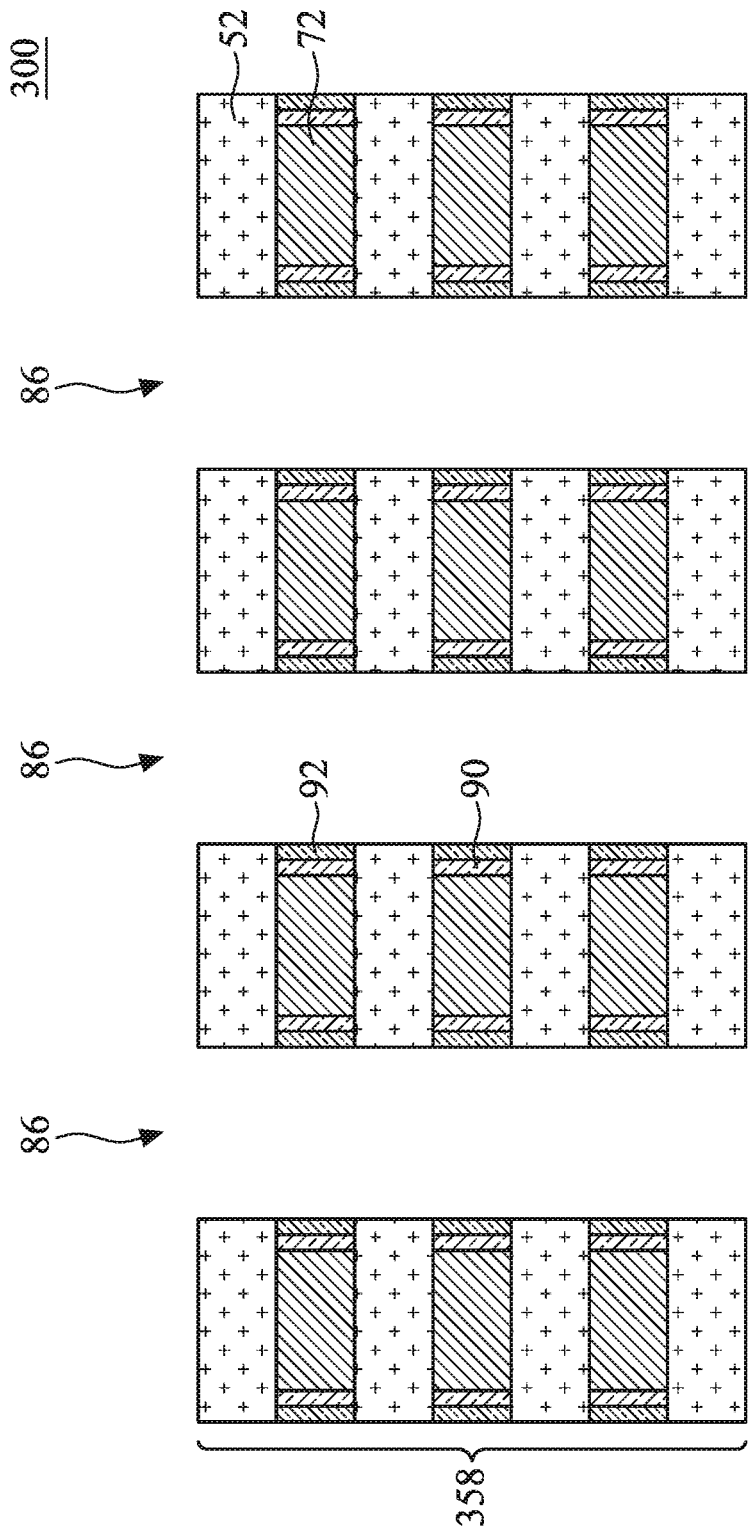
Figure 36A:
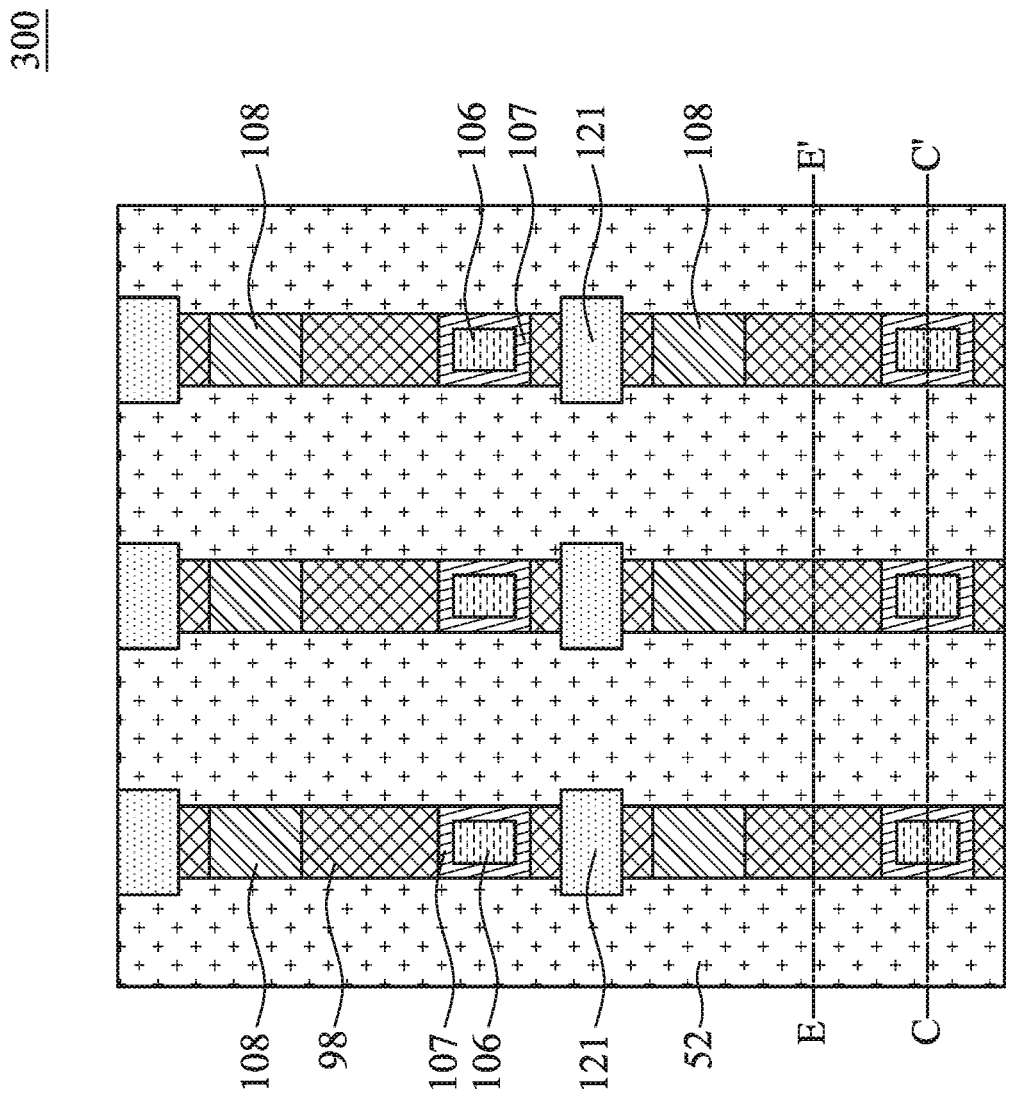
Figure 36B:
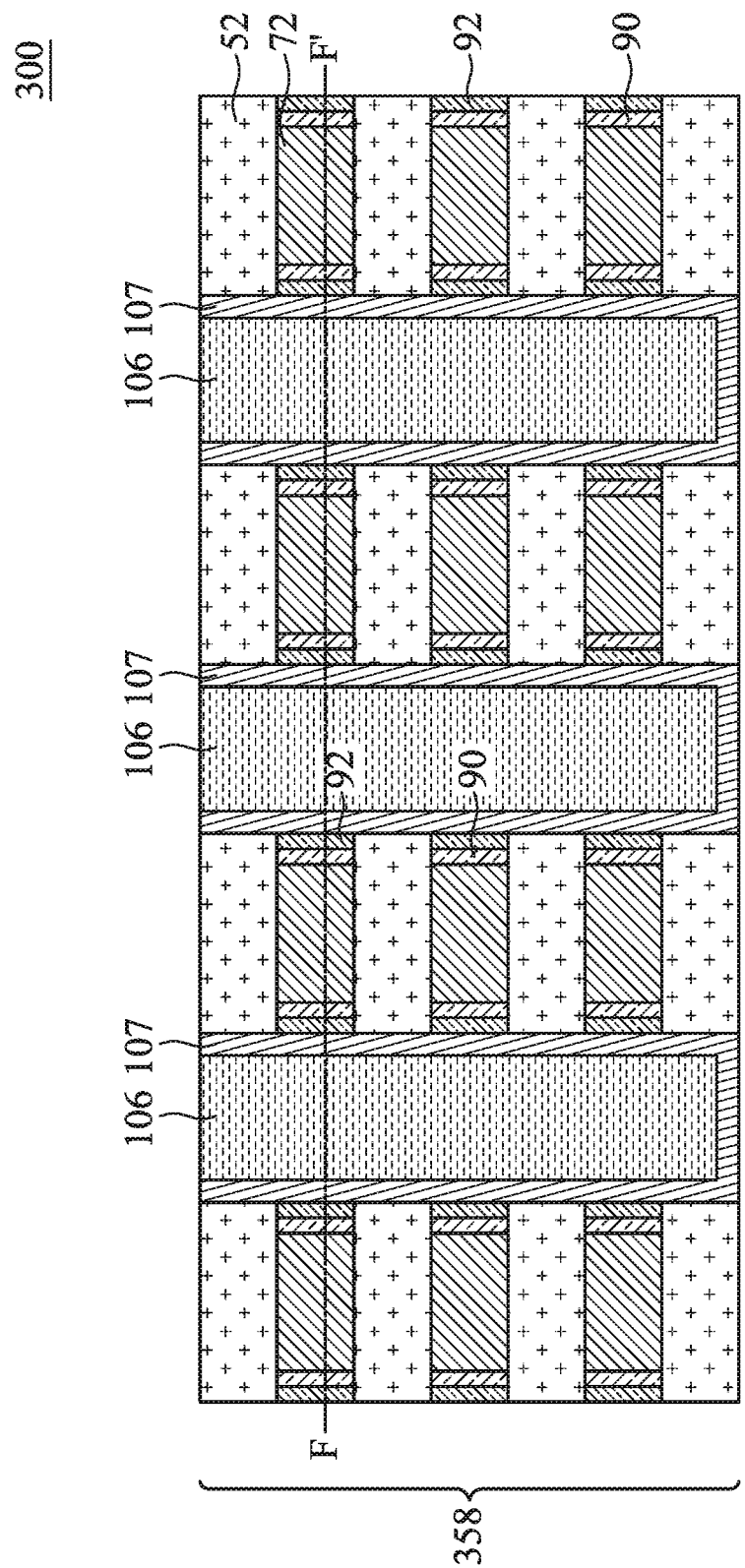
Figure 36C:
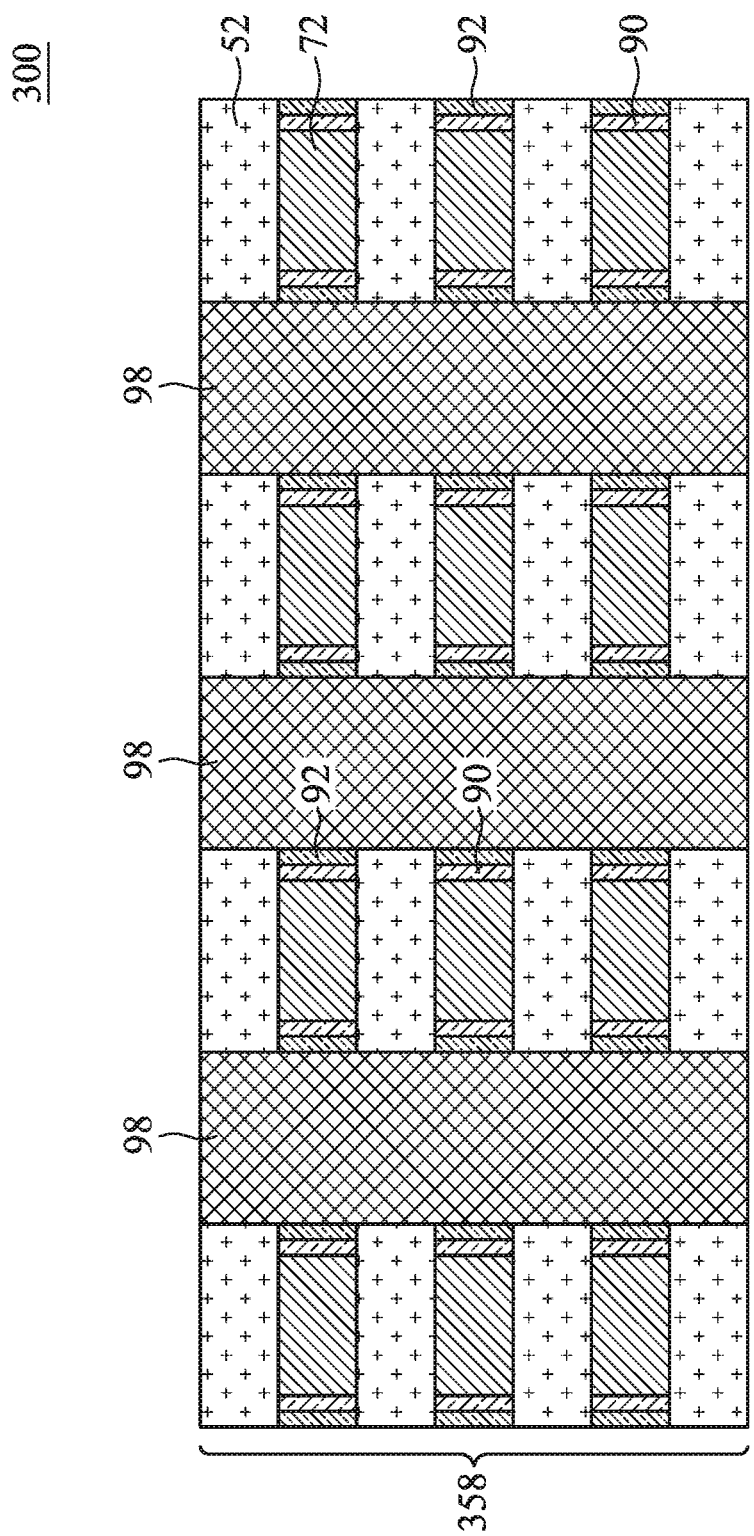
Figure 36D:
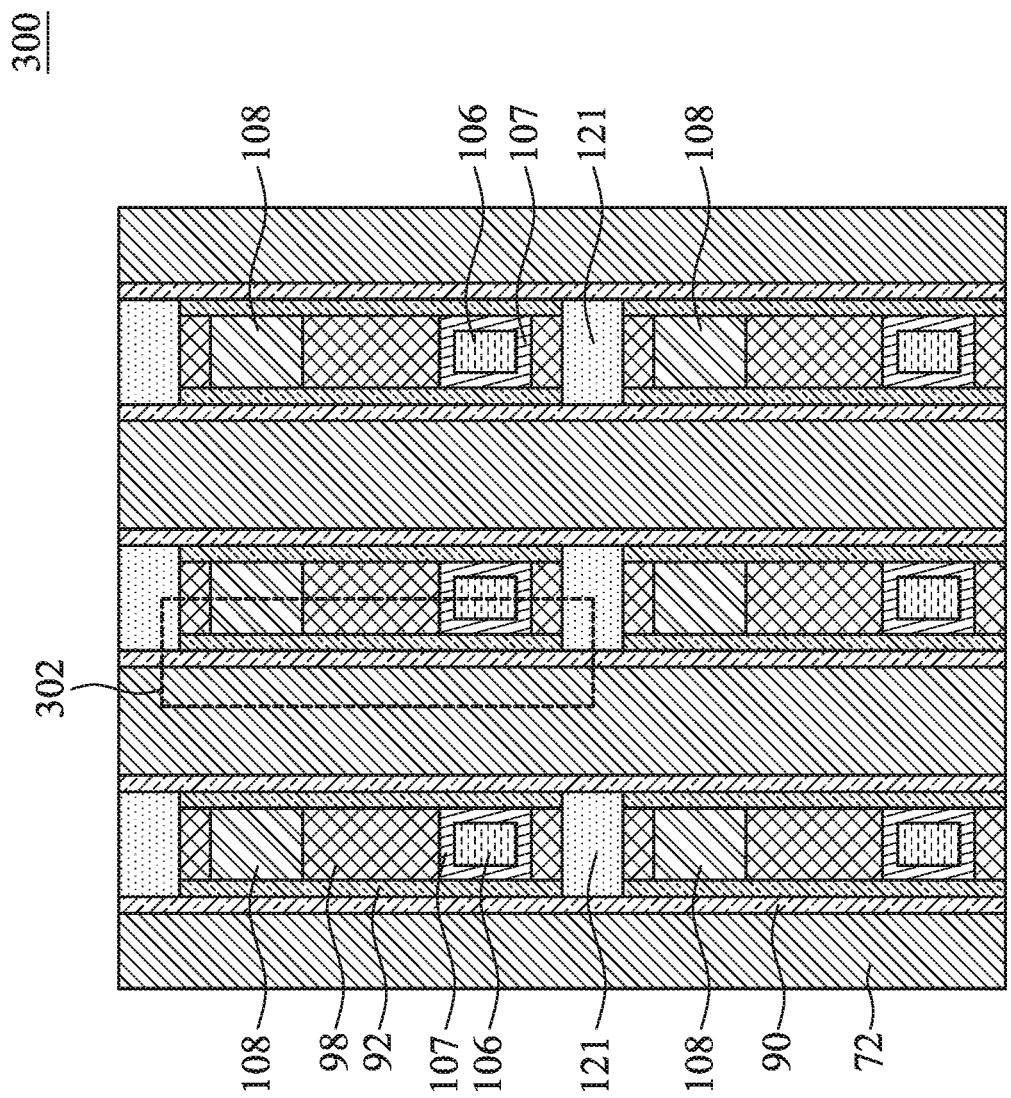

FIGS. 30A through 36D illustrate various views of intermediate steps in the manufacture of a hybrid memory array 300, in accordance with some embodiments. The hybrid memory array 300 is similar to the hybrid memory array 200 shown in FIGS. 28A-C, except that the conductive lines 72 are recessed prior to depositing the memory film 90 and the OS layer 92. For example, the hybrid memory array 300 includes memory cells 302 (see FIG. 36D) that have both a transistor-type memory (e.g., transistor 204) and a resistive-type memory (e.g., resistive memory layer 107). By forming a hybrid memory array 300 in this manner, parasitic coupling between adjacent memory cells 302 can be reduced, and the memory cell density of the hybrid memory array 300 may be increased, in some cases. FIGS. 30A and 31A illustrate a perspective view, and FIGS. 30B, 31B, 32, 33, 34, 35, 36B, and 36C illustrate cross-sectional views. FIGS. 36A and 36D illustrate plan views. In particular, FIG. 36B illustrates a cross-sectional view through the reference cross-section C-C' shown in FIG. 36A. FIG. 36C illustrates a cross-sectional view through the reference cross-section E-E' shown in FIG. 36A, and FIG. 36D illustrates a plan view through the reference cross-section F-F' shown in FIG. 36B.

Figure 30B:
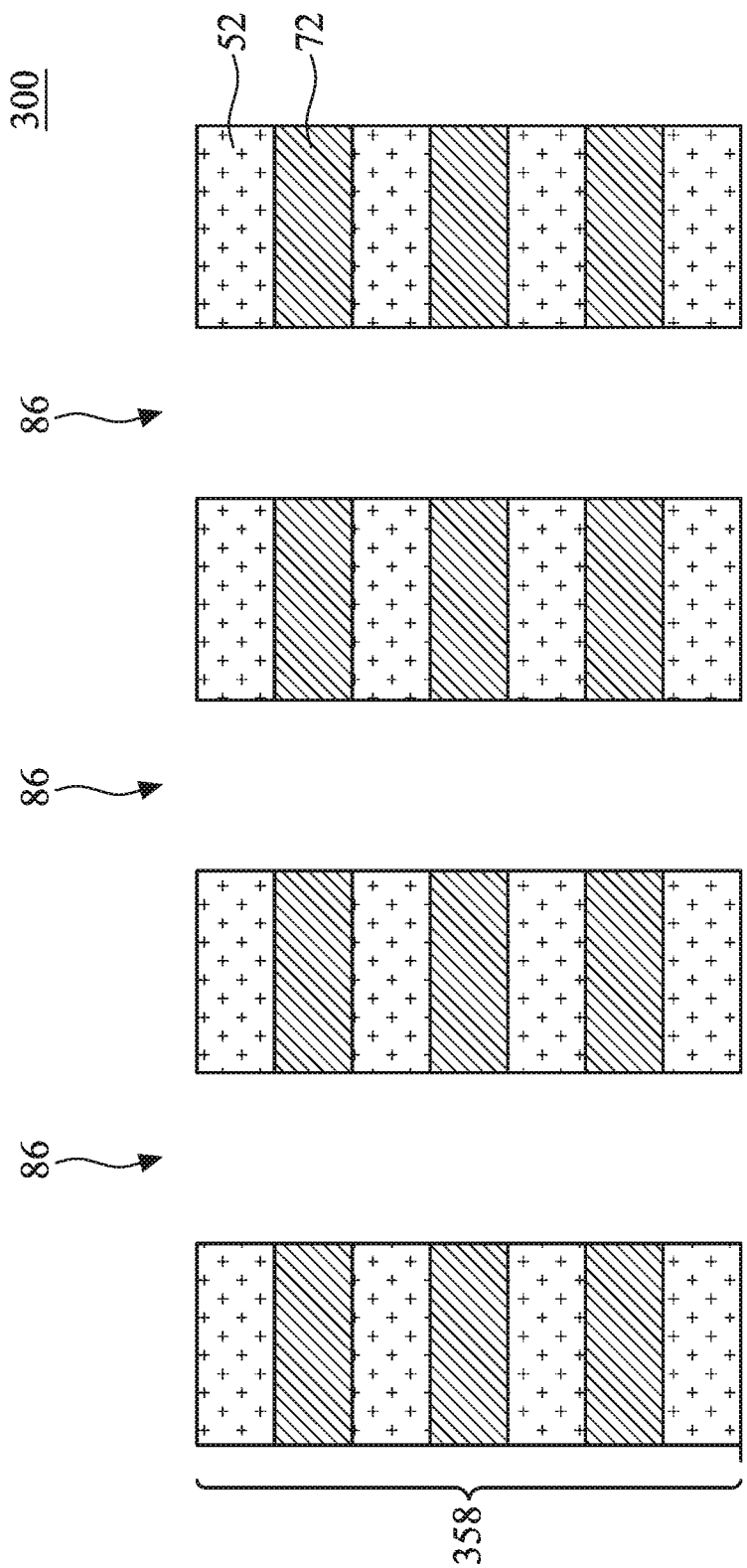

FIGS. 30A and 30B illustrate a multi-layer stack 358, in accordance with some embodiments. The multi-layer stack 358 shown in FIGS. 30A-B is similar to the multi-layer stack 58 shown in FIGS. 17A-B. In some embodiments, the topmost layer of the multi-layer stack 358 may be a dielectric layer 52, as shown in FIGS. 30A-B. The structure shown in FIG. 30A-B may be formed in a similar manner as the structure formed in FIGS. 17A-B. For example, the multi-layer stack 358 may be formed from alternating layers of conductive layers 54 and dielectric layers 52. The multi-layer stack 358 may then be patterned to have a staircase structure, and then trenches 86 may be patterned in the multi-layer stack 358, forming conductive lines 72.

Figure 31A:
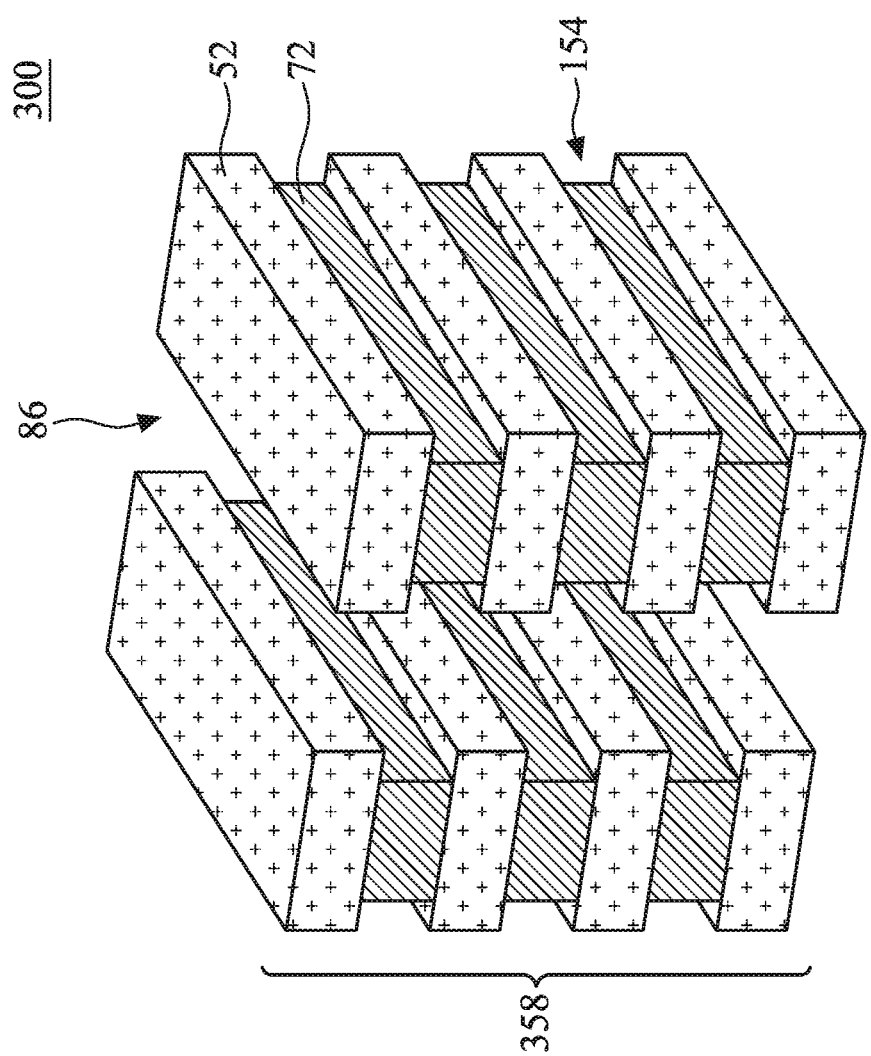
Figure 31B:
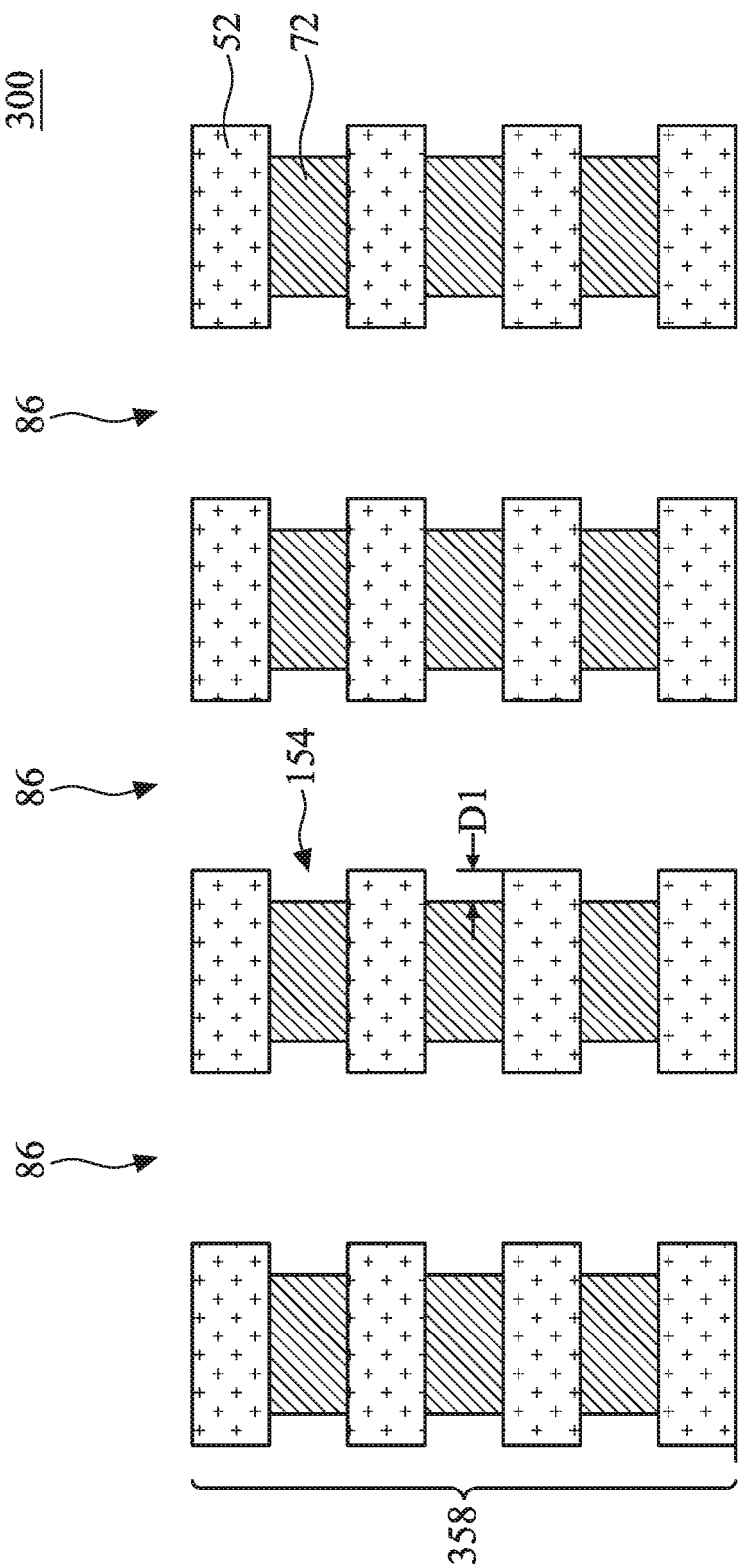

In FIGS. 31A and 31B, sidewalls of the conductive lines 72 are recessed to form lateral recesses 154, in accordance with some embodiments. The recessing may be performed using an acceptable process, such as a wet and/or a dry etch. The recessing of the conductive lines 72 may allow for the subsequent formation of the memory film 90 and OS layer 92 within the recesses 154, which may reduce parasitic coupling between memory cells 302. In some embodiments, the sidewalls of the conductive lines 72 are recessed with a wet etch using KOH, $NH_4OH$, $H_2O_2$, the like, or a combination thereof. In some embodiments, the sidewalls of the conductive lines 72 are recessed with a dry etch using $NH_3$, $NF_3$, HF, the like, or a combination thereof. The lateral recesses 154 may have a distance D1 from the sidewalls of the dielectric layers 52 that is in a range of about 10 nm to about 100 nm. Other distances are possible.

Figure 32:
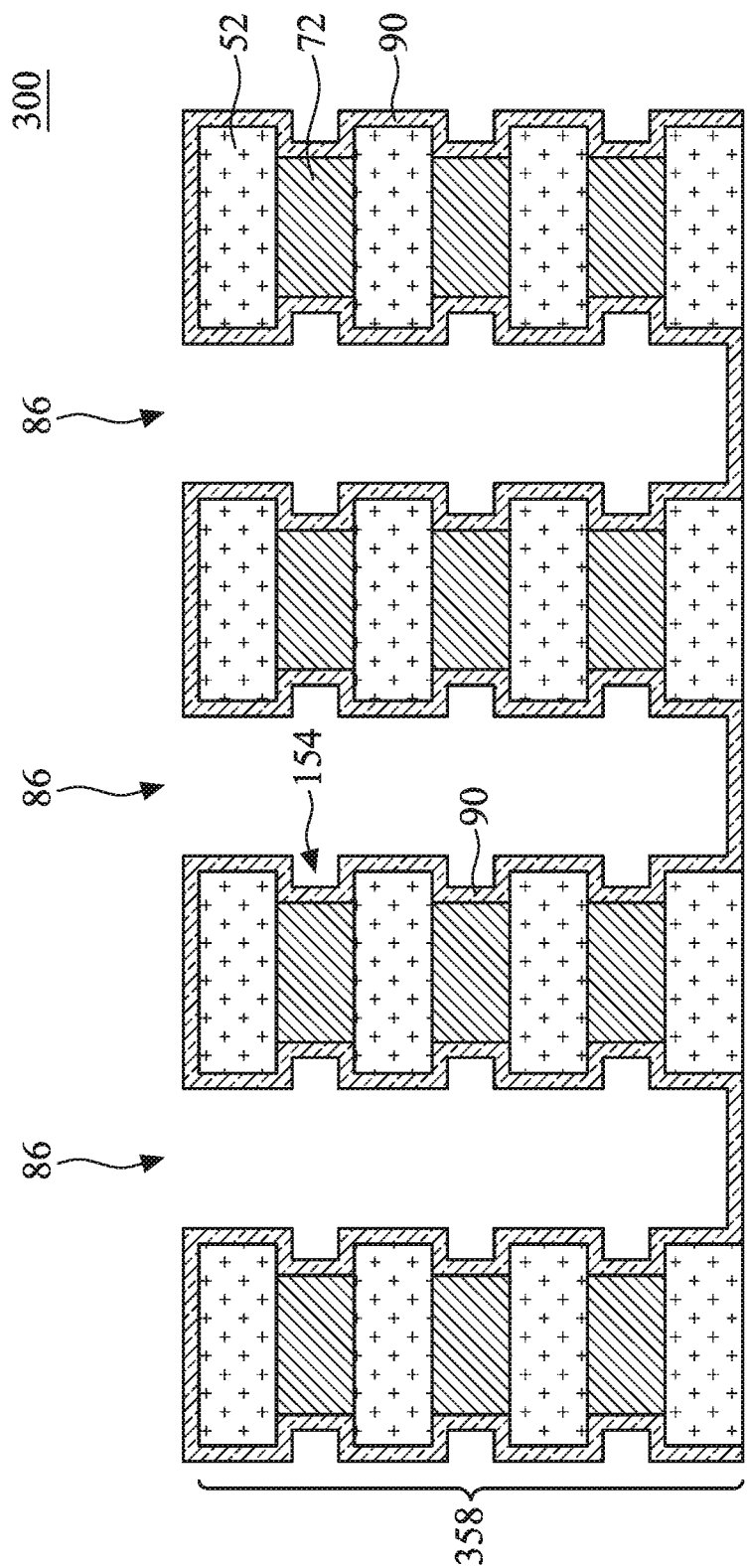

In FIG. 32, a memory film 90 is conformally deposited in the trenches 86 over exposed surfaces of the dielectric layers 52 and the conductive lines 72. The memory film 90 may be similar to the memory film 90 described previously for FIGS. 18A-B, and may be formed in a similar manner. The memory film 90 covers surfaces of the conductive lines 72 within the lateral recesses 154, and may partially or completely fill the lateral recesses 154. In some embodiments, the memory film 90 may be formed having a thickness in a range of about 3 nm to about 20 nm on the sidewalls of the conductive lines 72.

Figure 33:
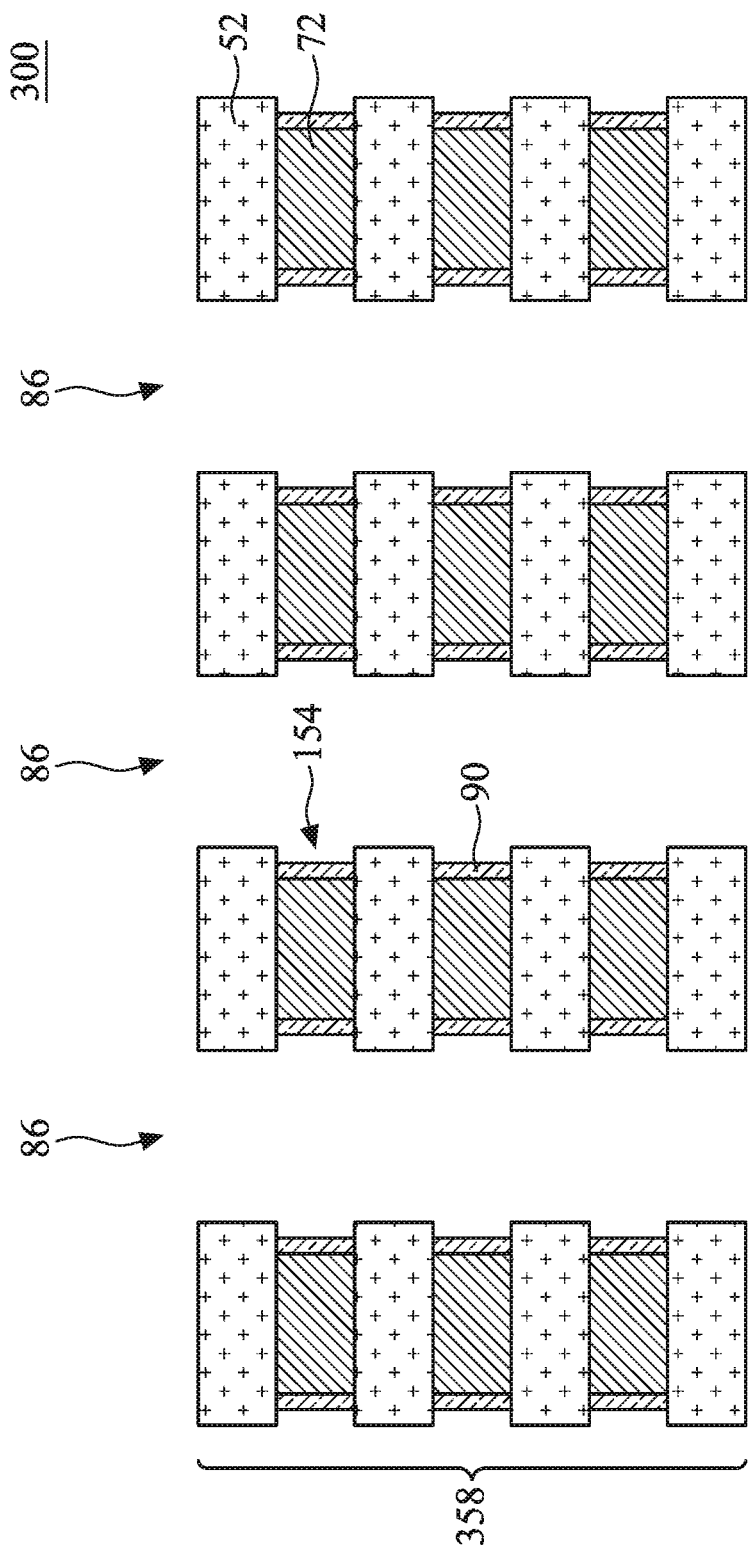

Turning to FIG. 33, portions of the memory film 90 are removed, in accordance with some embodiments. The portions of the memory film 90 along surfaces of the dielectric layers 52 may be removed, for example, using an acceptable etching process. For example, the removal process may include a wet etch etch using KOH, $NH_4OH$, $H_2O_2$, the like, or a combination thereof and/or a dry etch using $Cl_2$, $CF_4$, $CH_3F$, $CH_2F_2$, the like, or a combination thereof. Other wet or dry etches are possible, and the etching may include an isotropic etch, an anisotropic etch, or a combination thereof. In some embodiments, the etch process may remove the portions of the memory film 90 along surfaces of the dielectric layers 52 while portions of the memory film 90 on sidewalls of the conductive lines 72 remain. The remaining portions of the memory film 90 on sidewalls of the conductive lines 72 may have a thickness in a range of about 3 nm to about 15 nm, though other thicknesses are possible. In some embodiments, the removal process thins the memory film 90 but leaves portions of the memory film 90 remaining on surfaces of the dielectric layers 52. The removal of portions of the memory film 90 is optional, and is not performed in other embodiments.

In FIG. 34, an OS layer 92 is conformally deposited in the trenches 86 over exposed surfaces of the dielectric layers 52 and the memory film 90 within the recesses 154. The OS layer 92 may be similar to the OS layer 92 described previously for FIGS. 19A-B, and may be formed in a similar manner. The OS layer 92 covers surfaces of the memory film 90 within the lateral recesses 154, and may partially or completely fill the lateral recesses 154.

In FIG. 35, portions of the OS layer 92 are removed, in accordance with some embodiments. The portions of the OS layer 92 along surfaces of the dielectric layers 52 may be removed, for example, using an acceptable etching process. The etching process may include any acceptable etching process, such as a wet etch, a dry etch, RIE, NBE, the like, or a combination thereof. The etching process may be anisotropic, in some cases. In some embodiments, the etching process may remove the portions of the OS layer 92 along surfaces of the dielectric layers 52 while portions of the OS layer 92 on sidewalls of the memory film 90 remain. The remaining portions of the OS layer 92 may have sidewalls that are recessed from the sidewalls of the dielectric layers 52, approximately flush with the sidewalls of the dielectric layers 52, or protrude from the sidewalls of the dielectric layers 52. In some embodiments, the removal process thins the OS layer 92 but leaves portions of the OS layer 92 remaining on surfaces of the dielectric layers 52. The removal of portions of the OS layer 92 is optional, and is not performed in other embodiments. The removal of portions of the OS layer 92 is optional, and is not performed in other embodiments.

FIGS. 36A, 36B, 36C, and 36D illustrate the hybrid memory array 300 after subsequent processing, in accordance with some embodiments. The structure shown in FIG. 36A-D includes a dielectric material 98, resistive memory layers 107, conductive lines 106, conductive lines 108, and dielectric material 121. The dielectric material 98, resistive memory layers 107, conductive lines 106, conductive lines 108, and dielectric material 121 are similar to those shown, for example, in FIGS. 28A-B, and may be formed in a similar manner. For example, the dielectric material 98 may be deposited in the trenches 86. A first set of trenches may then be formed in the dielectric material 98, and resistive memory layers 107 and conductive lines 106 formed in the trenches. A second set of trenches may be formed in the dielectric material 98 and conductive lines 108 formed in these trenches. A third set of trenches may then be formed and the dielectric material 121 formed in these trenches to form isolation regions. The conductive lines 106, conductive lines 108, conductive lines 72, memory film 90, and OS layer 92 form transistors that are analogous to the transistors 204 described previously. In this manner, a hybrid memory array 300 may be formed comprising memory cells 302, in which each memory cell 302 is a hybrid memory cell that includes both a resistive-type memory (e.g., resistive memory layer 107) and a transistor-type memory in accordance with some embodiments.

The memory array described herein (e.g., hybrid memory array 200, hybrid memory array 300, and other embodiments) may be considered a "hybrid memory array" due to the fact that each memory cell in the memory array is a "hybrid memory cell" that includes both a resistive-type memory and a transistor-type memory. As described previously, the resistive-type memory and the transistor-type memory in each memory cell may be independently read or written. The embodiments described herein may allow for different types of memory within a single memory array to be utilized for different applications.

As an example application, the hybrid memory described herein may allow for faster and more reliable training of a neural network (e.g., a convolutional neural network, a deep neural network, or the like). In some cases, the training process for a neural network (e.g., "weight training") may comprise performing a large number of write operations to a memory array. Thus, a type of memory that allows for relatively fast and robust write operations, such as a transistor-type memory, may be preferred for utilization during the training process. After the training process is complete, the final weights may be stored in a memory array for use during operation of the neural network, which may comprise performing a large number of read operations to the memory array. Thus, a type of memory that allows for relatively stable read operations and reliable data retention, such as a resistive-type memory, may be preferred for utilization after training and during the operation of the neural network. Thus, the embodiments described herein allow for a single hybrid memory array that comprises both transistor-type memory for weight training and a resistive-type memory for weight storage. In this manner, the benefits of both transistor-type memory and resistive-type memory may be utilized, which can improve the training speed and the stability of a neural network or the like. This is an example, and other applications are possible.

Figure 37:
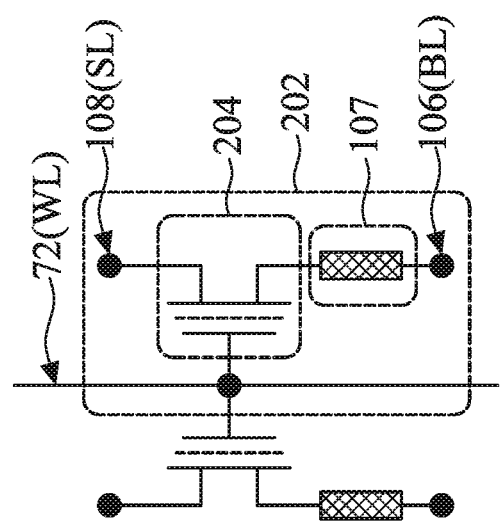
FIG. 37 illustrates a schematic of a hybrid memory cell, in accordance with some embodiments.

Turning to FIGS. 37 through 39C, example read and write operations for a hybrid memory cell 202 are described, in accordance with some embodiments. These are example operations, and different voltages, polarities, currents, or the like may be used in other cases. FIG. 37 illustrates a schematic view of a hybrid memory cell 202, in accordance with some embodiments. The hybrid memory cell 202 may be similar to the hybrid memory cell 202 described previously for FIGS. 1A-C. For example, the hybrid memory cell 202 shown in FIG. 37 includes both a resistor-type memory, indicated by the resistive memory layer 107, and a transistor-type memory, indicated by the transistor 204. The hybrid memory cell 202 is electrically coupled to a word line (WL), indicated by the conductive line 72, a bit line (BL), indicated by the conductive line 106, and a source line (SL), indicated by the conductive line 108. Both the resistive memory layer 107 and the transistor 204 may be programmed or read using the same set of conductive lines 72, 106, and 108.

Figures 38A, 38B, 38C:
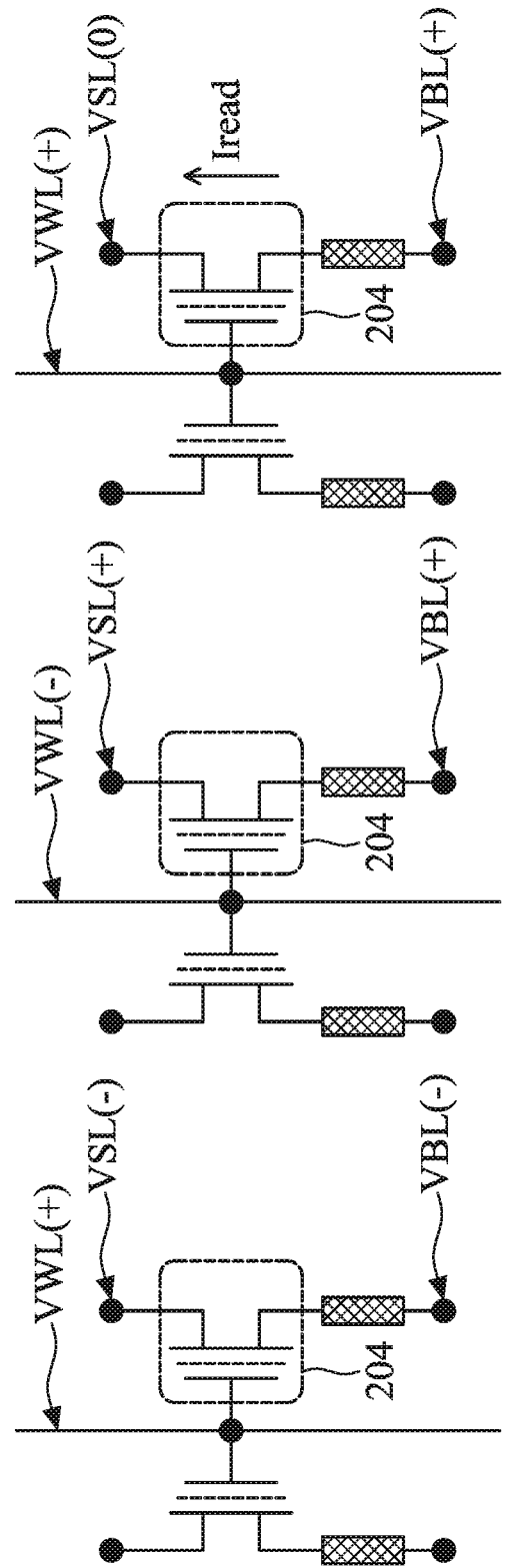
FIGS. 38A, 38B, and 38C illustrate read/write operations for the transistor-type memory of a hybrid memory cell, in accordance with some embodiments.

FIGS. 38A, 38B, and 38C illustrate write operations and read operations for the transistor-type memory (e.g., transistor 204) of a hybrid memory cell 202, in accordance with some embodiments. FIGS. 38A and 38B illustrate example binary writing operations of the transistor-type memory of the hybrid memory cell 202. For example, FIG. 38A may illustrate the writing of a "1" bit to the transistor-type memory, and FIG. 38B may illustrate the writing of a "0" bit to the transistor-type memory. To write to the transistor-type memory, a write voltage is applied across the memory film 90 of the transistor 204 by applying appropriate voltages to the word line, the bit line, and the source line. By applying the write voltage across the memory film 90, a polarization direction of the region of the memory film 90 corresponding to the hybrid memory cell 202 can be changed. As a result, the corresponding threshold voltage of the corresponding transistor 204 can also be switched from a low threshold voltage to a high threshold voltage or vice versa, and thus a binary value can be stored in the hybrid memory cell 202. Because the word lines intersect the bit lines and source lines, individual hybrid memory cells 202 may be selected for write operations.

In FIG. 38A, first writing operation is performed in which a positive voltage (VWL) is applied to the word line, a negative voltage (VBL) is applied to the bit line, and a negative voltage (VSL) is applied to the source line. This creates a first polarization direction within the memory film 90 of the transistor 204 such that the threshold voltage of the transistor 204 is put in a low threshold voltage state. The low threshold state may correspond to a "1" bit, for example. As an example, VWL may be about +2 V, VBL may be about −2 V, and VSL may be about −2 V. Other voltages are possible. In some embodiments, during the first writing operation, the current flowing through the resistive memory layer 107 may be less than about 1 µA, though other currents are possible.

In FIG. 38B, a second writing operation is performed in which a negative voltage (VWL) is applied to the word line, a positive voltage (VBL) is applied to the bit line, and a positive voltage (VSL) is applied to the source line. This creates a second polarization direction within the memory film 90 of the transistor 204 such that the threshold voltage of the transistor 204 is put in a high threshold voltage state. The high threshold state may correspond to a "0" bit, for example. As an example, VWL may be about −2 V, VBL may be about +2 V, and VSL may be about +2 V. Other voltages are possible. In some embodiments, during the second writing operation, the current flowing through the resistive memory layer 107 may be less than about 1 µA, though other currents are possible.

In FIG. 38C, a read operation is performed in which a read voltage is applied to the word line. The read voltage may be, for example, a voltage between the low threshold voltage (e.g., FIG. 38A) and the high threshold voltage (e.g., FIG. 38B). Depending on the polarization direction of the corresponding region of the memory film 90, the transistor 204 of the hybrid memory cell 202 may or may not be turned on. For example, when the transistor 204 is in the low threshold voltage state, the transistor 204 conducts current when the read voltage is applied, and when the transistor 204 is in the high threshold voltage state, the transistor 204 does not conduct current when the read voltage is applied. As a result, a current (Iread) may or may not be flowing through the transistor 204, and the binary value stored in the transistor-like memory of the hybrid memory cell 202 can be determined. Because the word lines intersect the bit lines and source lines, individual hybrid memory cells 202 may be selected for read operations.

In the read operation shown in FIG. 38C, a positive read voltage (VWL) is applied to the word line, a positive voltage (VBL) is applied to the bit line, and the source line is coupled to ground (VSL). The current (Iread) flowing through the transistor 204 may be measured to determine whether or not the transistor 204 is conducting and thus whether or not the transistor 204 is in the low threshold voltage state or the high threshold voltage state. As an example, VWL may be about +1 V, VBL may be about +0.5 V, and VSL may be grounded (about 0 V). Other voltages are possible. In some embodiments, during the read operation, the current flowing through the resistive memory layer 107 when the transistor 204 is conducting may be in a range of about 5 µA to about 10 µA, though other currents are possible.

Figures 39A, 39B, 39C:
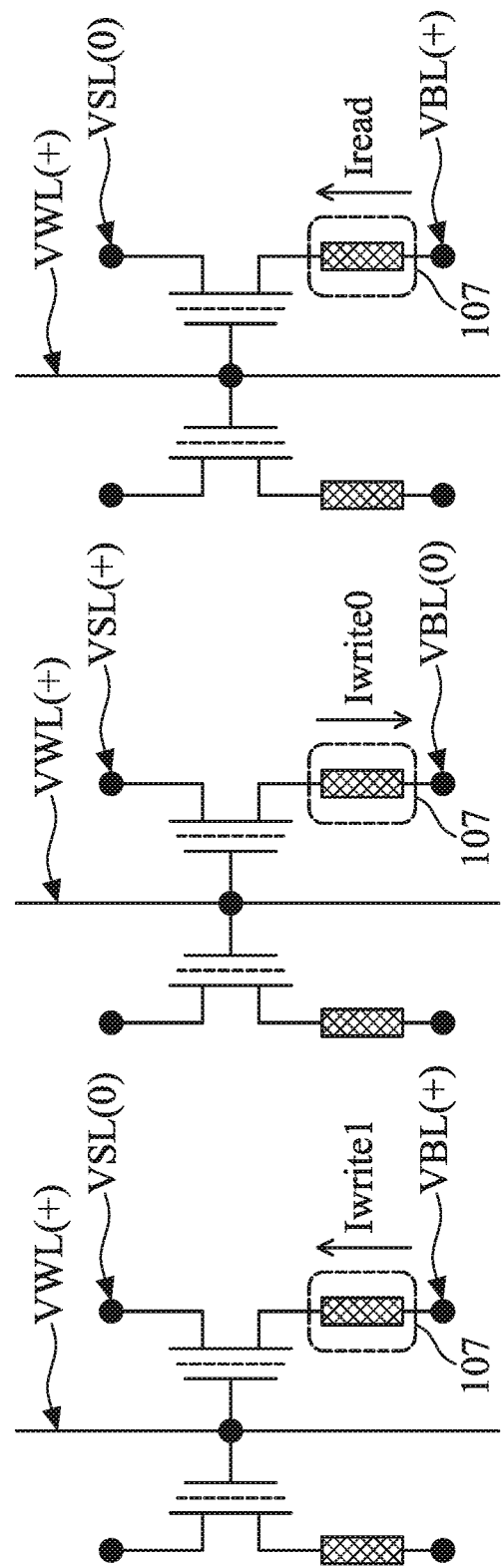
FIGS. 39A, 39B, and 39C illustrate read/write operations for the resistive-type memory of a hybrid memory cell, in accordance with some embodiments.

FIGS. 39A, 39B, and 39C illustrate write operations and read operations for the resistive-type memory (e.g., resistive memory layer 107) of a hybrid memory cell 202, in accordance with some embodiments. FIGS. 39A and 39B illustrate example binary writing operations of the resistive-type memory of the hybrid memory cell 202. For example, FIG. 39A may illustrate the writing of a "1" bit to the resistive-type memory, and FIG. 39B may illustrate the writing of a "0" bit to the resistive-type memory. To write to the resistive-type memory, a write voltage is applied across the resistive memory layer 107 of the transistor 204 by applying appropriate voltages to the word line, the bit line, and the source line. By applying the write voltage across the resistive memory layer 107, the resistance of a region of the resistive memory layer 107 corresponding to the hybrid memory cell 202 can be changed. Accordingly, the resistive memory layer 107 may be put in either a high resistance state or a low resistance state, and thus a binary value can be stored in the hybrid memory cell 202. Various types of resistive-type memories are possible for use in the hybrid memory cell 202, and mechanism of the change in resistance may depend on the type of resistive-type memory used. For example, the change in resistance state may be due to the formation or destruction of conductive paths within the resistive memory layer 107, a phase change of the material within the resistive memory layer 107, or another mechanism. Because the word lines intersect the bit lines and source lines, individual hybrid memory cells 202 may be selected for write operations.

In FIG. 39A, a first writing operation is performed in which a positive voltage (VWL) is applied to the word line, a positive voltage (VBL) is applied to the bit line, and the source line is coupled to ground (VSL). The voltage applied to the word line (VWL) is above the threshold voltage of the transistor 204 such that the transistor 204 conducts, allowing a current (Iwrite1) to flow through the resistive memory layer 107. This puts the region of the resistive memory layer 107 corresponding to the memory cell 202 in a low resistance state. The low resistance state may correspond to a "1" bit, for example. As an example, VWL may be about +2 V, VBL may be a voltage in a range from about 1.5 V to about 2 V, and VSL may be grounded (about 0 V). Other voltages are possible. In some embodiments, during the first writing operation, the current (Iwrite1) flowing through the resistive memory layer 107 may be greater than about 100 µA, though other currents are possible.

In FIG. 39B, a second writing operation is performed in which a positive voltage (VWL) is applied to the word line, a positive voltage (VSL) is applied to the source line, and the bit line is coupled to ground (VBL). The voltage applied to the word line (VWL) is above the threshold voltage of the transistor 204 such that the transistor 204 conducts, allowing a current (Iwrite0) to flow through the resistive memory layer 107. This puts the region of the resistive memory layer 107 corresponding to the memory cell 202 in a high resistance state. The high resistance state may correspond to a "0" bit, for example. As an example, VWL may be about +2 V, VSL may be a voltage in a range from about 1.5 V to about 2 V, and VBL may be grounded (about 0 V). Other voltages are possible. In some embodiments, during the second writing operation, the current (Iwrite0) flowing through the resistive memory layer 107 may be greater than about 100 µA, though other currents are possible.

In FIG. 39C, a read operation is performed in which a read voltage is applied across the resistive memory layer 107 of the transistor 204 by applying appropriate voltages to the word line, the bit line, and the source line. By applying the read voltage across the resistive memory layer 107, a current (Iread) flows through the resistive memory layer 107 that depends on the resistance of the resistive memory layer 107. For example, when the resistive memory layer 107 is in the low resistance state, the current (Iread) is relatively high when the read voltage is applied, and when the resistive memory layer 107 is in the high resistance state, the current (Iread) is relatively low when the read voltage is applied. As a result, the binary value stored in the resistive-like memory of the hybrid memory cell 202 can be determined. Because the word lines intersect the bit lines and source lines, individual hybrid memory cells 202 may be selected for read operations.

In the read operation shown in FIG. 39C, a positive read voltage (VWL) is applied to the word line, a positive voltage (VBL) is applied to the bit line, and the source line is coupled to ground (VSL). The voltage applied to the word line (VWL) is above the threshold voltage of the transistor 204 such that the transistor 204 conducts, allowing a current (Iread) to flow through the resistive memory layer 107. The current (Iread) flowing through the transistor 204 may be measured to determine whether or not the resistive memory layer 107 is in a low resistance state or a high resistance state. As an example, VWL may be about +2 V, VBL may be about +0.2 V, and VSL may be grounded (about 0 V). Other voltages are possible. In some embodiments, during the read operation, the current flowing through the resistive memory layer 107 may be in a range of about 1 µA to about 5 µA, though other currents are possible.

The embodiments described herein allow for a hybrid memory array in which each cell of the hybrid memory array is a hybrid memory cell that includes both a transistor-type memory (e.g., a FeFET or the like) and a resistive-type memory (e.g., a ReRAM or the like). The transistor-type memory and the resistive-type memory of each hybrid memory cell may be programmed independently. Additionally, both types of memory in the hybrid memory array are accessed using the same conductive lines (e.g., bit lines, source lines, and word lines) without additional sets of conductive lines being formed. In some cases, a hybrid memory array with two types of memories may allow for more efficient and robust reading and writing operations. For example, a neural network may use the transistor-type memory for weight training and the resistive-type memory for weight storage. By incorporating two types of memory in the same memory array, improvements to performance, cost, and efficiency may be achieved. Embodiments described herein also allow for a hybrid memory array to be manufactured without significant additional processing steps or cost, and without significant increase to the overall size of a memory array, in some cases. For example, in some cases, the addition of the resistive-type memory uses a single additional mask. The resistive memory layer can also be formed within existing memory array geometries, in some cases. In this manner, the embodiments described herein allow for a cost-effective process integration of a hybrid memory array.

In accordance with an embodiment, a memory array includes hybrid memory cells, wherein each hybrid memory cell includes a transistor-type memory including a memory film extending on a gate electrode; a channel layer extending on the memory film; a first source/drain electrode extending on the channel layer; and a second source/drain electrode extending along the channel layer; and a resistive-type memory including a resistive memory layer, wherein the resistive memory layer extends between the second source/drain electrode and the channel layer. In an embodiment, the memory film is a different material than the resistive memory layer. In an embodiment, the resistive memory layer includes a phase-change memory material. In an embodiment, the resistive memory layer includes a metal oxide. In an embodiment, the memory film includes a ferroelectric material. In an embodiment, the gate electrode is a word line of the memory array, the first source/drain electrode is a source line of the memory array, and the second source/drain electrode is a bit line of the memory array. In an embodiment, a first hybrid memory cell of the hybrid memory cells is over a second hybrid memory cell of the hybrid memory cells, wherein the resistive memory layer of the first hybrid memory cell and the resistive memory layer of the second hybrid memory cell are the same continuous layer. In an embodiment, the resistive-type memory of a third hybrid memory cell of the hybrid memory cells is laterally offset from the resistive-type memory of a fourth hybrid memory cell of the hybrid memory cells. In an embodiment, the resistive memory layer has a thickness in a range from 3 nm to 20 nm. In an embodiment, the resistive memory layer encircles the second source/drain electrode.

In accordance with an embodiment, a device includes a semiconductor substrate; a word line extending over the semiconductor substrate; a ferroelectric layer extending along the word line, wherein the ferroelectric layer contacts the word line; an oxide semiconductor (OS) layer extending along the ferroelectric layer, wherein the ferroelectric layer is between the oxide semiconductor (OS) layer and the word line; source lines extending along the ferroelectric layer, wherein the ferroelectric layer is between the source lines and the word line; bit lines extending along the ferroelectric layer, wherein the ferroelectric layer is between the bit lines and the word line; and resistive memory layers, wherein each resistive memory layer is between a respective bit line and the word line. In an embodiment, the resistive memory layers include a transitional metal oxide. In an embodiment, each resistive memory layer laterally surrounds the respective bit line. In an embodiment, the resistive memory layers physically contact the oxide semiconductor (OS) layer. In an embodiment, the device includes a dielectric material extending along the ferroelectric layer between source lines and adjacent bit lines, wherein the resistive memory layers physically contact the dielectric material.

In accordance with an embodiment, a method includes patterning a first trench extending through a first conductive line; depositing a memory film along sidewalls and a bottom surface of the first trench; depositing an oxide semiconductor (OS) layer over the memory film, wherein the OS layer extends along the sidewalls and the bottom surface of the first trench; depositing a first dielectric material on the OS layer, wherein the first dielectric material fills the remaining portion of the first trench; patterning a second trench in the first dielectric material; depositing a resistive memory material on sidewalls of the second trench; and depositing a first conductive material on the resistive memory material within the second trench, wherein the first conductive material fills the second trench. In an embodiment, the method includes, after patterning the first trench, forming a lateral recess in the first conductive line, wherein the memory film is deposited within the lateral recess. In an embodiment, the method includes performing an etching process to remove portions of the memory film. In an embodiment, the method includes patterning a third trench in the first dielectric material; and depositing a second conductive material within the third trench, wherein the second conductive material fills the third trench. In an embodiment, depositing the resistive memory material includes depositing a metal oxide using atomic layer deposition (ALD).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
a plurality of hybrid memory cells, wherein each hybrid memory cell of the plurality of hybrid memory cells comprises:
a transistor-type memory comprising:
a memory film extending on a gate electrode;
a channel layer extending on the memory film;
a first source/drain electrode extending on the channel layer; and
a second source/drain electrode extending along the channel layer; and
a resistive-type memory comprising:
a resistive memory layer, wherein the resistive memory layer extends between the second source/drain electrode and the channel layer.

2. The device of claim 1, wherein the memory film is a different material than the resistive memory layer.

3. The device of claim 1, wherein the resistive memory layer comprises a phase-change memory material.

4. The device of claim 1, wherein the resistive memory layer comprises a metal oxide.

5. The device of claim 1, wherein the memory film comprises a ferroelectric material.

6. The device of claim 1, wherein the gate electrode is a word line of the memory array, the first source/drain electrode is a source line of the memory array, and the second source/drain electrode is a bit line of the memory array.

7. The device of claim 1, wherein a first hybrid memory cell of the plurality of hybrid memory cells is over a second hybrid memory cell of the plurality of hybrid memory cells, wherein the resistive memory layer of the first hybrid memory cell and the resistive memory layer of the second hybrid memory cell are the same continuous layer.

8. The device of claim 1, wherein the resistive-type memory of a third hybrid memory cell of the plurality of hybrid memory cells is laterally offset from the resistive-type memory of a fourth hybrid memory cell of the plurality of hybrid memory cells.

9. The device of claim 1, wherein the resistive memory layer has a thickness in a range from 3 nm to 20 nm.

10. The device of claim 1, wherein the resistive memory layer encircles the second source/drain electrode.

11. A device comprising:
a semiconductor substrate;
a word line extending over the semiconductor substrate;
a ferroelectric memory layer extending along the word line, wherein the ferroelectric memory layer contacts the word line;
an oxide semiconductor (OS) layer extending along the ferroelectric memory layer, wherein the ferroelectric memory layer is between the oxide semiconductor (OS) layer and the word line;
a plurality of source lines extending along the ferroelectric memory layer, wherein the ferroelectric memory layer is between the plurality of source lines and the word line;
a plurality of bit lines extending along the ferroelectric memory layer, wherein the ferroelectric memory layer is between the plurality of bit lines and the word line; and
a plurality of resistive memory layers, wherein each resistive memory layer of the plurality of resistive memory layers is between a respective bit line of the plurality of bit lines and the word line.

12. The device of claim 11, wherein the plurality of resistive memory layers comprise a transitional metal oxide.

13. The device of claim 11, wherein each resistive memory layer of the plurality of resistive memory layers laterally surrounds the respective bit line of the plurality of bit lines.

14. The device of claim 11, wherein the plurality of resistive memory layers physically contact the oxide semiconductor (OS) layer.

15. The device of claim 11 further comprising a dielectric material extending along the ferroelectric memory layer between source lines of the plurality of source lines and adjacent bit lines of the plurality of bit lines, wherein the plurality of resistive memory layers physically contact the dielectric material.

16. A method comprising:
patterning a first trench extending through a first conductive line;
depositing a memory film capable of memory storage along sidewalls and a bottom surface of the first trench;
depositing an oxide semiconductor (OS) layer over the memory film, wherein the OS layer extends along the sidewalls and the bottom surface of the first trench;
depositing a first dielectric material on the OS layer, wherein the first dielectric material fills the remaining portion of the first trench;
patterning a second trench in the first dielectric material;
depositing a resistive memory material on sidewalls of the second trench; and
depositing a first conductive material on the resistive memory material within the second trench, wherein the first conductive material fills the second trench.

17. The method of claim 16 further comprising, after patterning the first trench, forming a lateral recess in the first conductive line, wherein the memory film is deposited within the lateral recess.

18. The method of claim 17 further comprising performing an etching process to remove portions of the memory film.

19. The method of claim 16 further comprising:
patterning a third trench in the first dielectric material; and
depositing a second conductive material within the third trench, wherein the second conductive material fills the third trench.

20. The method of claim 16, wherein depositing the resistive memory material comprises depositing a metal oxide using atomic layer deposition (ALD).

* * * * *